US012687780B2

(12) United States Patent
Kobayashi

(10) Patent No.: US 12,687,780 B2
(45) Date of Patent: Jul. 21, 2026

(54) CURABLE WATER-BASED COMPOSITION, ACTIVE-ENERGY-RAY-CURABLE WATER-BASED COMPOSITION, ACTIVE-ENERGY-RAY-CURABLE WATER-BASED INK, STORED CONTAINER, TWO-DIMENSIONAL OR THREE-DIMENSIONAL IMAGE FORMING APPARATUS, TWO-DIMENSIONAL OR THREE-DIMENSIONAL IMAGE FORMING METHOD, CURED PRODUCT, AND DECORATED BODY

(71) Applicant: Masahide Kobayashi, Kanagawa (JP)

(72) Inventor: Masahide Kobayashi, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 934 days.

(21) Appl. No.: 17/820,028

(22) Filed: Aug. 16, 2022

(65) Prior Publication Data

US 2023/0135413 A1 May 4, 2023

(30) Foreign Application Priority Data

Aug. 27, 2021 (JP) ................................ 2021-139013

(51) Int. Cl.
*G03F 7/028* (2006.01)
*B33Y 70/00* (2020.01)
(Continued)

(52) U.S. Cl.
CPC ............ *G03F 7/028* (2013.01); *G03F 7/0037* (2013.01); *G03F 7/2004* (2013.01);
(Continued)

(58) Field of Classification Search
None
See application file for complete search history.

(56) References Cited

U.S. PATENT DOCUMENTS

| | | | | |
|---|---|---|---|---|
| 9,453,142 B2 * | 9/2016 | Rolland | ................. | B33Y 30/00 |
| 2005/0232880 A1 * | 10/2005 | Hu | ....................... | A61K 8/8158 424/66 |

(Continued)

FOREIGN PATENT DOCUMENTS

| | | |
|---|---|---|
| JP | 2002-053629 | 2/2002 |
| JP | 2009-519143 | 5/2009 |

(Continued)

OTHER PUBLICATIONS

U.S. Office Action dated Jul. 6, 2023, in U.S. Appl. No. 17/104,622, 22 pages.

(Continued)

*Primary Examiner* — Jonathan Johnson
*Assistant Examiner* — Andrew Preston Traywick
(74) *Attorney, Agent, or Firm* — Grüneberg Global IP, PLLC

(57) ABSTRACT

Provided is a curable water-based composition including water, a polymerizable compound (A), and a polymerization initiator (C). The polymerizable compound (A) contains an acrylamide compound (A1) represented by General formula (A1) below.

General formula (A1)

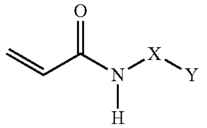

In the General formula (A1), X represents an alkylene group containing from 1 through 6 carbon atoms, and Y represents (Continued)

a group represented by General formula (A1a) below or General formula (A1b) below, General formula (A1a)

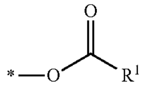

In the General formula (A1a), $R^1$ represents an alkyl group containing from 1 through 10 carbon atoms, and * represents a bonding site with X, General formula (A1b)

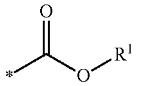

In the General formula (A1b), $R^1$ represents an alkyl group containing from 1 through 10 carbon atoms, and * represents a bonding site with X.

19 Claims, 2 Drawing Sheets

(51) Int. Cl.
*B33Y 80/00* (2015.01)
*G03F 7/00* (2006.01)
*G03F 7/20* (2006.01)

(52) U.S. Cl.
CPC ............ *G03F 7/2018* (2013.01); *B33Y 70/00* (2014.12); *B33Y 80/00* (2014.12)

(56) References Cited

U.S. PATENT DOCUMENTS

| | | | |
|---|---|---|---|
| 2009/0286435 A1 | 11/2009 | Badyal et al. | |
| 2018/0127607 A1* | 5/2018 | Morita | C07C 233/00 |
| 2020/0299425 A1* | 9/2020 | Kobayashi | C08F 222/1006 |
| 2021/0061929 A1 | 3/2021 | Kobayashi et al. | |
| 2021/0079238 A1* | 3/2021 | Patton | C09D 11/037 |
| 2021/0102081 A1 | 4/2021 | Hiraoka | |
| 2021/0122938 A1 | 4/2021 | Kobayashi et al. | |
| 2021/0155814 A1* | 5/2021 | Kobayashi | C08F 220/58 |
| 2021/0189157 A1 | 6/2021 | Yamaguchi et al. | |

FOREIGN PATENT DOCUMENTS

| | | |
|---|---|---|
| JP | 2009-185258 | 8/2009 |
| JP | 2018-109132 | 7/2018 |
| JP | 2020-050696 | 4/2020 |
| WO | WO2006/116180 A2 | 11/2006 |

OTHER PUBLICATIONS

U.S. Appl. No. 17/104,622, filed Nov. 25, 2020, 2021/0155814, Kobayashi et al.

* cited by examiner

CURABLE WATER-BASED COMPOSITION, ACTIVE-ENERGY-RAY-CURABLE WATER-BASED COMPOSITION, ACTIVE-ENERGY-RAY-CURABLE WATER-BASED INK, STORED CONTAINER, TWO-DIMENSIONAL OR THREE-DIMENSIONAL IMAGE FORMING APPARATUS, TWO-DIMENSIONAL OR THREE-DIMENSIONAL IMAGE FORMING METHOD, CURED PRODUCT, AND DECORATED BODY

CROSS-REFERENCE TO RELATED APPLICATIONS

This patent application is based on and claims priority pursuant to 35 U.S.C. § 119(a) to Japanese Patent Application No. 2021-139013, filed on Aug. 27, 2021, in the Japan Patent Office, the entire disclosure of which is hereby incorporated by reference herein.

BACKGROUND

Technical Field

The present disclosure relates to a curable water-based composition, an active-energy-ray-curable water-based composition, an active-energy-ray-curable water-based ink, a stored container, a two-dimensional or three-dimensional image forming apparatus, a two-dimensional or three-dimensional image forming method, a cured product, and a decorated body.

Description of the Related Art

In recent years, inkjet photolithography methods of inkjet-forming an image at a needed portion of an object using a liquid-state photo-curable resin, and laminating layers of such images to form a three-dimensional object have been being attempted.

For example, a method proposed as an additive manufacturing method produces a three-dimensional stereoscopic object by irradiating a liquid-state photo-curable resin with laser light, particularly, ultraviolet rays layer by layer.

Hydrogels containing water in three-dimensional network structures are being actively developed. Because hydrogels have relatively favorable mechanical properties, methods for applying hydrogels to soft materials and three-dimensional objects have been proposed.

Hydrogels have flexibility because of a high solvent content ratio, and application of hydrogels to medical treatment and various other fields is expected.

For example, in application of hydrogels to previous simulations for medical operations of living bodies and to substitutes for living bodies (for example, cartilages and vitreous bodies of eyeballs), it is demanded that hydrogels have complicated and precise structures and hardness of hydrogels in the objects can be controlled freely.

As a composition having an ensured safety, a composition containing an acrylamide monomer has been proposed.

SUMMARY

According to an embodiment of the present disclosure, a curable water-based composition contains water, a polymerizable compound (A), and a polymerization initiator (C). The polymerizable compound (A) contains an acrylamide compound (A1) represented by General formula (A1) below.

General formula (A1)

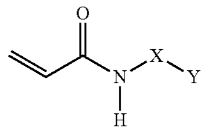

In General formula (A1), X represents an alkylene group containing from 1 through 6 carbon atoms, and Y represents a group represented by General formula (A1a) below or General formula (A1b) below.

General formula (A1a)

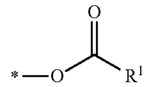

In General formula (A1a), $R^1$ represents an alkyl group containing from 1 through 10 carbon atoms, and * represents a bonding site with X.

General formula (A1b)

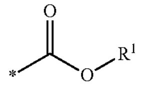

In General formula (A1b), $R^1$ represents an alkyl group containing from 1 through 10 carbon atoms, and * represents a bonding site with X.

BRIEF DESCRIPTION OF THE SEVERAL VIEWS OF THE DRAWINGS

A more complete appreciation of the disclosure and many of the attendant advantages and features thereof can be readily obtained and understood from the following detailed description with reference to the accompanying drawings, wherein.

Figure 1:
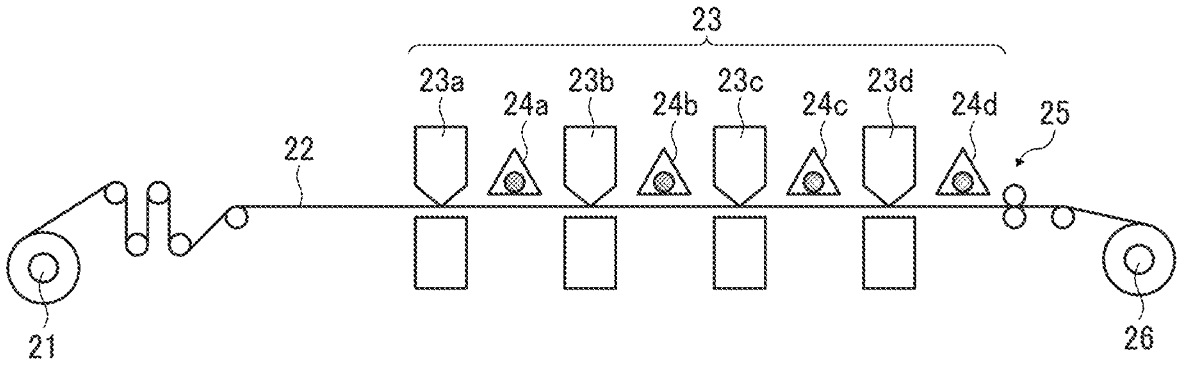
FIG. 1 is a schematic view of a three-dimensional object producing apparatus of the present disclosure.

The accompanying drawings are intended to depict embodiments of the present invention and should not be interpreted to limit the scope thereof. The accompanying drawings are not to be considered as drawn to scale unless explicitly noted.

DETAILED DESCRIPTION

The terminology used herein is for the purpose of describing particular embodiments only and is not intended to be limiting of the present invention. As used herein, the singular forms "a", "an" and "the" are intended to include the plural forms as well, unless the context clearly indicates otherwise.

In describing embodiments illustrated in the drawings, specific terminology is employed for the sake of clarity. However, the disclosure of this specification is not intended to be limited to the specific terminology so selected and it is to be understood that each specific element includes all technical equivalents that have a similar function, operate in a similar manner, and achieve a similar result.

The present disclosure can provide a curable water-based composition that can be cured sufficiently even when a curing energy during curing is low, can produce a three-dimensional object having a high compressive stress and a high swelling degree, has high safety properties represented by skin sensitivity, and has a low viscosity.

(Curable Water-Based Composition)

A curable water-based composition of the present disclosure is a curable water-based composition containing water, a polymerizable compound (A), and a polymerization initiator (C).

The polymerizable compound (A) contains at least one acrylamide compound (A1) selected from acrylamide compounds represented by General formula (A1) below.

General formula (A1)

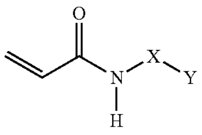

In General formula (A1). X represents an alkylene group containing from 1 through 6 carbon atoms, and Y represents a group represented by General formula (A1a) below or General formula (A1b) below.

General formula (A1a)

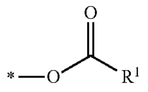

In General formula (A1a), $R^1$ represents an alkyl group containing from 1 through 10 carbon atoms, and * represents a bonding site with X.

General formula (A1b)

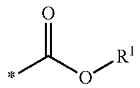

In General formula (A1b), $R^1$ represents an alkyl group containing from 1 through 10 carbon atoms, and * represents a bonding site with X.

The curable water-based composition of the present disclosure is based on the following findings.

Existing techniques are said to be able to produce three-dimensional objects (hydrogels) having a high water content ratio, but have not been able to obtain hydrogels having a high elasticity. Hydrogels that do not have a high elasticity have limitations in application to various fields.

In order to be applied to an inkjet method, inks need to have a low viscosity and need to contain a polymerizable compound having a low molecular weight. Existing techniques have a problem that it is difficult to satisfy both of using a low-viscosity ink and ensuring safety properties such as skin sensitivity.

Moreover, as a composition having an ensured safety, a composition containing an acrylamide monomer has been proposed. However, such a composition does not have a sufficient water solubility, and application of such a composition as a hydrogel is difficult.

The curable water-based composition of the present disclosure is a curable water-based composition containing water, a polymerizable compound (A), and a polymerization initiator (C).

The polymerizable compound (A) contains at least one acrylamide compound (A1) selected from acrylamide compounds represented by General formula (A1) above. This makes it possible to cure the composition sufficiently even when a curing energy during curing is low and to obtain a three-dimensional object that is suitable as an organ model, a cell culture medium, and a medical member and has a high breaking strength and a high swelling degree.

Examples of the curable water-based composition of the present disclosure include, but are not limited to, thermosetting liquid compositions and active-energy-ray-curable liquid compositions. Active-energy-ray-curable liquid compositions are more preferable.

In the present disclosure, (meth)acrylic acid esters represent acrylic acid esters or methacrylic acid esters. (Meth) acrylates represent acrylates or methacrylates.

<Polymerizable Compound (A)>

The polymerizable compound (A) contains an acrylamide compound (A1) represented by General formula (A1), and further contains an acrylamide compound (B) and an acrylamide compound (A2) other than the acrylamide compound (A1) represented by General formula (A1) and any other polymerizable compound (A3).

<Acrylamide Compound (A1)>

The acrylamide compound (A1) is a secondary acrylamide compound represented by General formula (A1).

X in General formula (A1) represents an alkylene group that may be straight-chained or branched and contains from 1 through 6 carbon atoms.

Examples of the alkylene group containing from 1 through 6 carbon atoms include, but are not limited to, a methylene group, an ethylene group, a propylene group, and a butylene group.

Y in General formula (A1) represents either General formula (A1a) or General formula (A1b).

$R^1$ in General formulae (A1a) and (A1b) represents an alkyl group that may be straight-chained or branched and contains from 1 through 10 carbon atoms.

Examples of the alkyl group containing from 1 through 10 carbon atoms include, but are not limited to, a methyl group, an ethyl group, a propyl group, an isopropyl group, a n-butyl group, a s-butyl group, an isobutyl group, a t-butyl group, a pentyl group, a neopentyl group, a hexyl group, a heptyl group, an octyl group, a nonyl group, and a decyl group.

* in General formulae (A1a) and (A1b) represents a bonding site with X.

For the acrylamide compound, it is preferable that Y in General formula (A1) be represented by General formula (A1b).

It is preferable that $R^1$ in General formula (A1b) represent an alkyl group containing from 1 through 2 carbon atoms.

The secondary acrylamide compound represented by General formula (A1) has an ester structure at an end of monofunctional secondary acrylamide free of a ring structure.

Secondary acrylamide compounds having a low molecular weight generally have volatility and strongly smell of a monomer-specific odor. Discomfort may be felt when liquid compositions containing such compounds are handled.

It is possible to suppress the volatility of such secondary acrylamide compounds having a low molecular weight and reduce the odor by introducing a functional group having a strong polarity or increasing the molecular weight. However, this is accompanied by viscosity increase and a major constraint in use of liquid compositions, above all, inkjet inks.

The secondary acrylamide compound represented by General formula (A1) has an ester structure at an end. The ester structure can reduce volatility and suppress odor. It is also considered that the ester structure can improve curability through intermolecular interaction. As a result, the secondary acrylamide compound represented by General formula (A1) can be suitably used as a liquid composition, above all, an inkjet ink.

Acrylamide compounds generally have a high acute oral toxicity, and liquid compositions containing acrylamide compounds have a safety risk and care is needed to handle such liquid compositions.

As compared, the acrylamide compound of the present disclosure represented by General formula (A1) and having an ester structure can easily decompose through a hydrolysis by, for example, water contained in living bodies, and tends to have a low acute oral toxicity. Above all, when Yin General formula (A1) is General formula (A1b), the acrylamide compound tends to have a very low acute oral toxicity. Hence, a liquid composition containing the acrylamide compound of the present disclosure is expected to have a low acute oral toxicity and to be able to increase safety.

The secondary acrylamide compound represented by General formula (A1) is not particularly limited and may be appropriately selected depending on the intended purpose. A compound represented by General formula (A1-1) below is preferable.

General formula (A1-1)

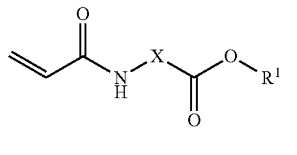

In General formula (A1-1), $R^1$ represents an alkyl group containing from 1 through 10 carbon atoms, and X represents an alkylene group containing from 1 through 3 carbon atoms.

The alkyl group containing from 1 through 10 carbon atoms, represented by $R^1$, may have a straight-chain structure or a branched structure. Examples of the alkyl group containing from 1 through 10 carbon atoms include, but are not limited to, a methyl group, an ethyl group, a propyl group, an isopropyl group, a n-butyl group, a s-butyl group, an isobutyl group, a t-butyl group, a pentyl group, a neopentyl group, a hexyl group, a heptyl group, an octyl group, a nonyl group, and a decyl group. Among these groups, a methyl group, an ethyl group, a propyl group, an isopropyl group, a n-butyl group, and an isobutyl group are preferable, and it is more preferable that $R^1$ represent an alkyl group containing from 1 through 3 carbon atoms.

The alkylene group containing from 1 through 3 carbon atoms, represented by X, may have a straight-chain structure or a branched structure. Examples of the alkylene group containing from 1 through 3 carbon atoms include, but are not limited to, a methylene group, an ethylene group, a propylene group, a methyl methylene group, and a dimethyl methylene group. Among these groups, a methylene group, a methyl methylene group, and a dimethyl methylene group are preferable, and a methylene group and a methyl methylene group are more preferable.

As specific examples of the acrylamide compound represented by General formula (A1), a group of example compounds α to a group of example compounds θ will be presented below. The acrylamide compound should not be construed as being limited to these compounds.

Examples of compounds in the group of example compounds α include, but are not limited to, the compounds α1 to α6 presented below One of these compounds may be used alone or two or more of these compounds may be used in combination.

<<Group of Example Compounds α>>

α1

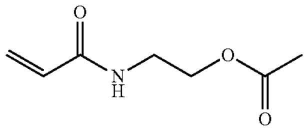

α2

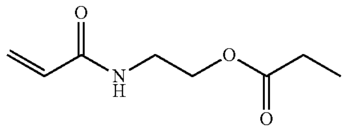

α3

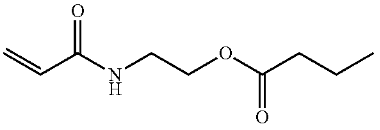

α4

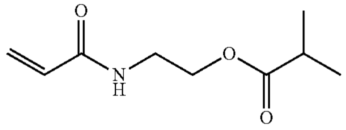

α5

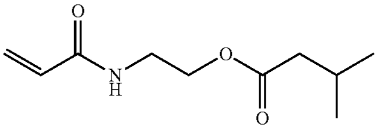

α6

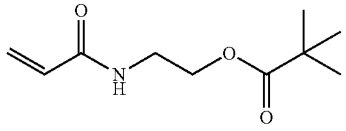

Examples of compounds in the group of example compounds β include, but are not limited to, the compounds β1 to β6 presented below. One of these compounds may be used alone or two or more of these compounds may be used in combination.

<<Group of Example Compounds β>>

β1

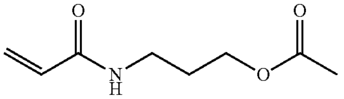

β2

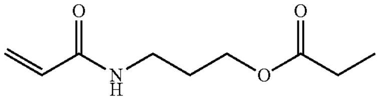

β3

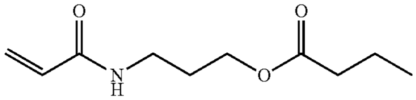

β4

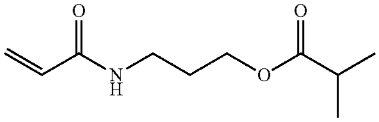

β5

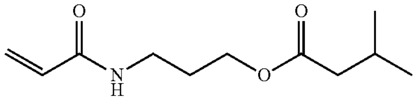

β6

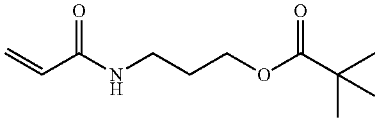

Examples of compounds in the group of example compounds γ include, but are not limited to, the compounds γ1 to γ6 presented below. One of these compounds may be used alone or two or more of these compounds may be used in combination.

<<Group of Example Compounds γ>>

γ1

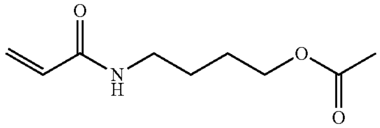

γ2

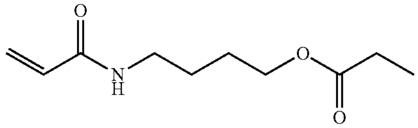

γ3

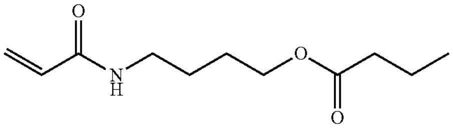

γ4

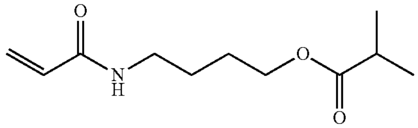

-continued

γ5

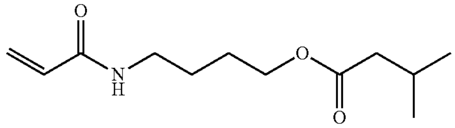

γ6

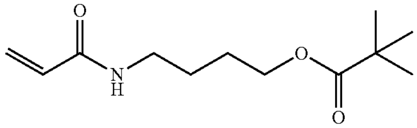

Examples of compounds in the group of example compounds δ include, but are not limited to, the compounds δ1 to δ8 presented below. One of these compounds may be used alone or two or more of these compounds may be used in combination.

<<Group of Example Compounds δ>>

δ1

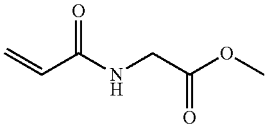

δ2

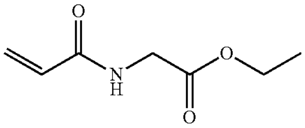

δ3

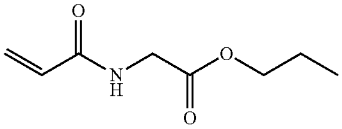

δ4

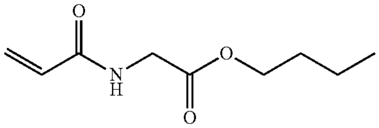

δ5

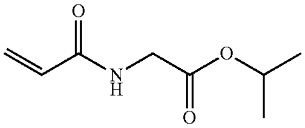

δ6

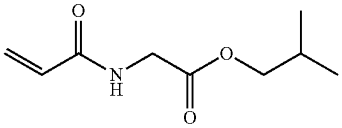

δ7

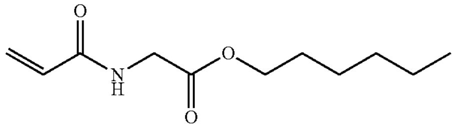

-continued

δ8

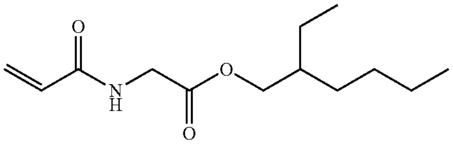

Examples of compounds in the group of example compounds ε include, but are not limited to, the compounds ε1 to ε8 presented below. One of these compounds may be used alone or two or more of these compounds may be used in combination.

<<Group of Example Compounds ε>>

ε1

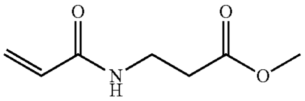

ε2

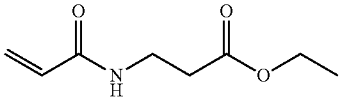

ε3

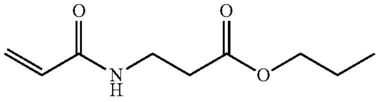

ε4

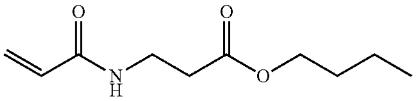

ε5

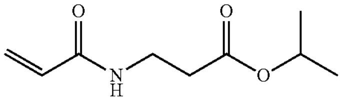

ε6

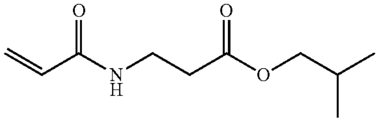

ε7

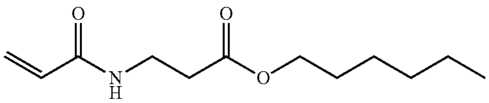

ε8

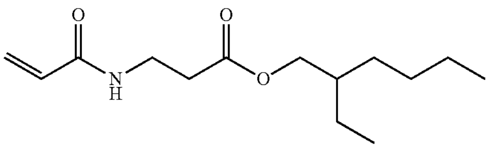

Examples of compounds in the group of example compounds ζ include, but are not limited to, the compounds ζ1 to ζ8 presented below. One of these compounds may be used alone or two or more of these compounds may be used in combination.

<<Group of Example Compounds ζ>>

ζ1

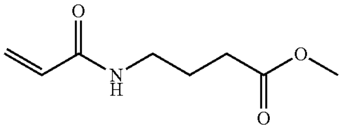

ζ2

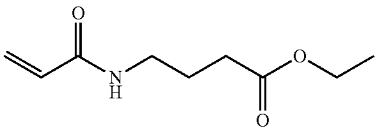

ζ3

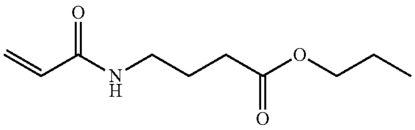

ζ4

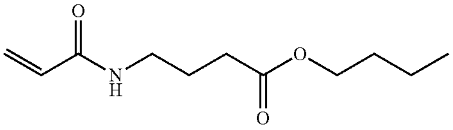

ζ5

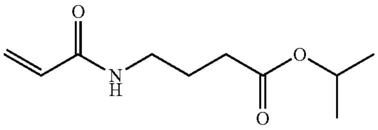

ζ6

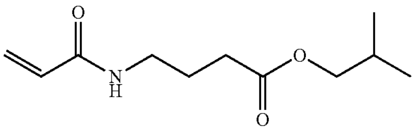

ζ7

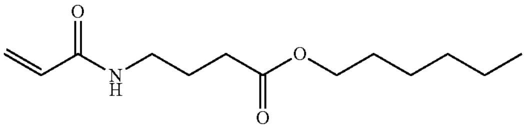

ζ8

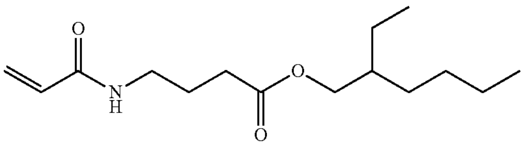

Examples of compounds in the group of example compounds η include, but are not limited to, the compounds η1 to η8 presented below. One of these compounds may be used alone or two or more of these compounds may be used in combination.

<<Group of Example Compounds η>>

η1

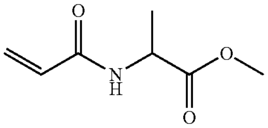

-continued

η2

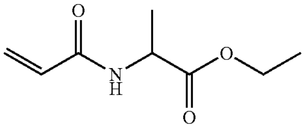

η3

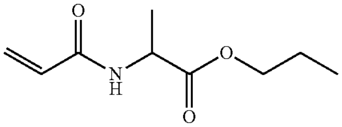

η4

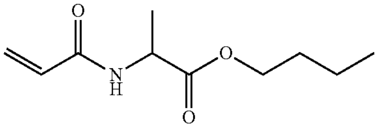

η5

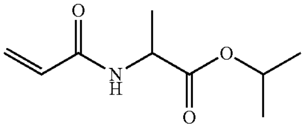

η6

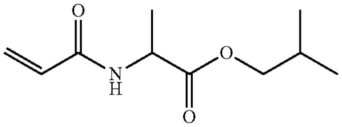

η7

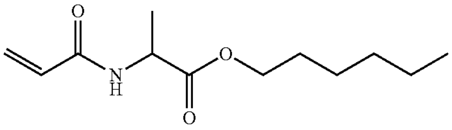

η8

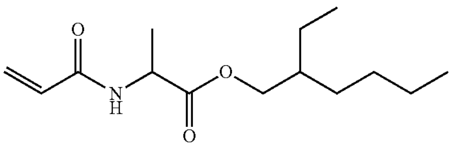

Examples of compounds in the group of example compounds θ include, but are not limited to, the compounds θ1 to θ8 presented below. One of these compounds may be used alone or two or more of these compounds may be used in combination.

<<Group of Example Compounds θ>>

θ1

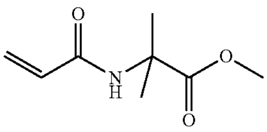

θ2

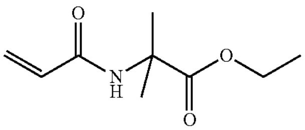

-continued

θ3

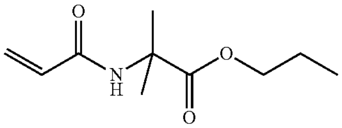

θ4

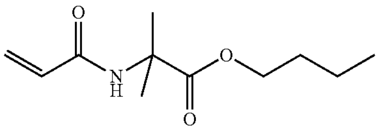

θ5

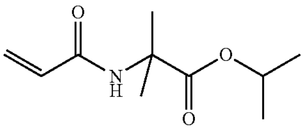

θ6

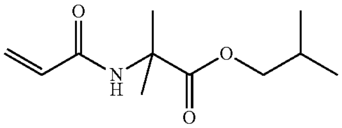

θ7

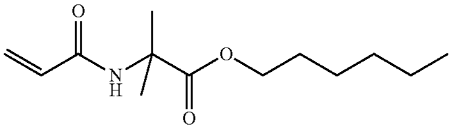

θ8

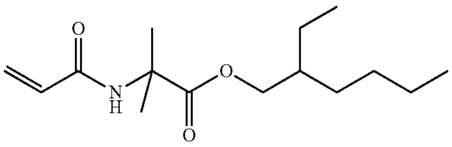

Among the compounds in the group of example compounds α to the group of example compounds θ, the example compound α1, the example compound α4, the example compound α6, the example compound δ1, the example compound δ2, the example compound δ4, the example compound δ5, the example compound ε1, the example compound ζ1, the example compound η1, the example compound η2, and the example compound η5 are preferable, and the example compound δ1, the example compound δ2, the example compound η1, the example compound η2, and the example compound η5 are more preferable.

As the acrylamide compound represented by General formula (A1), two or more kinds of different compounds may be used as a mixture. Examples of such different compounds include, but are not limited to, a structural isomer. The mix proportion is not particularly limited.

The content of the acrylamide compound represented by General formula (A1) is preferably 10% by mass or greater but 50% by mass or less and more preferably 20% by mass or greater but 30% by mass or less relative to the total amount of the curable water-based composition.

It is possible to structurally analyze the acrylamide compound represented by General formula (A1) using a $^{1}$H-NMR spectrum and an IR spectrum.

Next, specific examples of a multifunctional acrylamide compound of the present disclosure will be presented below. The multifunctional acrylamide compound should not be construed as being limited to these examples.

<Acrylamide Compound (B)>

Examples of the acrylamide compound (B) include, but are not limited to, bifunctional or higher acrylamide compounds (B1) represented by General formula (B1) below and multifunctional acrylamide compounds (B2) other than the acrylamide compounds (B1).

General formula (B1)

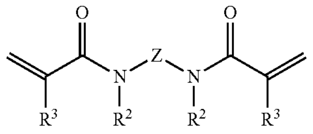

In General formula (B1), $R^2$ represents a hydrogen atom or an alkyl group containing from 1 through 4 carbon atoms and may have a branched structure, $R^3$ represents a hydrogen atom or a methyl group, Z represents an alkylene group containing from 1 through 30 carbon atoms or a group obtained by substituting oxygen, nitrogen, and sulfur atoms for some of the carbon atoms of the alkylene group containing from 1 through 30 carbon atoms, and may contain a polar functional group, a (meth)acrylate group, or a (meth) acrylamide group as the substituents.

$R^2$ in General formula (B1) represents an alkyl group that may be straight-chained or branched and contains from 1 through 4 carbon atoms.

$R^3$ in General formula (B1) represents a hydrogen atom or methyl.

Z in General formula (B1) represents an alkylene group containing from 1 through 30 carbon atoms or a group obtained by substituting oxygen, nitrogen, and sulfur atoms for some of the carbon atoms of the alkylene group containing from 1 through 30 carbon atoms, and may contain a polar functional group, a (meth)acrylate group, or a (meth) acrylamide group as the substituents.

Examples of the polar functional group include, but are not limited to, halogen, an alkoxy group, an ester group, and a halogen-substituted phenyl group.

Examples of the multifunctional acrylamide compound (B) include, but are not limited to, compounds a-1 to f-8 presented below.

These multifunctional acrylamide compounds are characterized by containing two or more acrylamides on the mother nucleus structure of an alkylene group. Disclosed use of these compounds include constituent components of resins for dental restoration and dental adhesives. Cured products of these multifunctional acrylamide compounds have a high strength because of a crosslinked structure of the cured products. Moreover, these multifunctional acrylamide compounds have almost no uncomfortable odor specific to (meth)acrylate compounds, and are hence suitable for active-energy-ray-curable inks, particularly, active-energy-ray-curable inkjet inks that are to be discharged in the form of minute liquid droplets.

The number of carbon atoms in the mother nucleus structure Z of the compound represented by General formula (B1) is preferably 3 or greater. This is considered due to a tendency that the compound has a lower viscosity as the number of carbon atoms in Z is greater, and as a result, tertiary acrylamide moieties on both ends have a higher degree of freedom and can facilitate a polymerization reaction. On the other hand, there is a tendency that a cured product has a lower strength as the number of carbon atoms in Z is greater. This means that viscosity, photopolymerization reactivity, and cured product strength have a good balance when the number of carbon atoms in Z is 3 or greater.

a-1

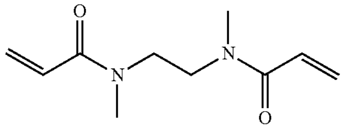

a-2

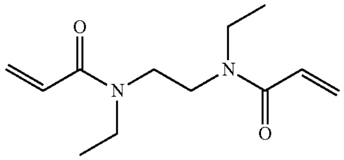

a-3

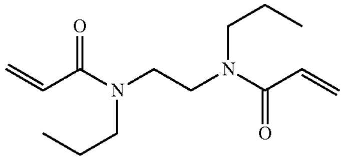

a-4

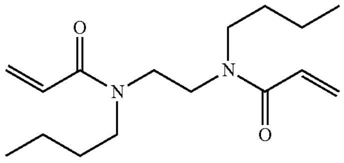

a-5

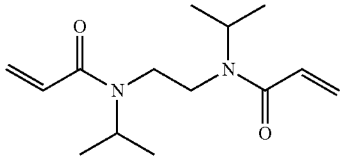

a-6

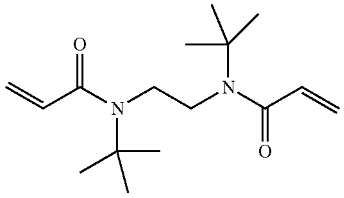

b-1

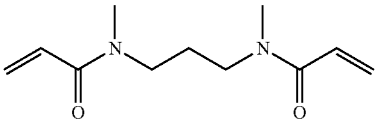

b-2

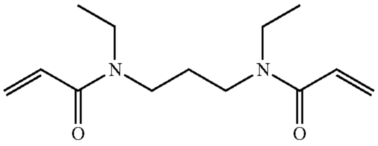

b-3

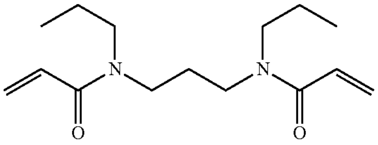

-continued
b-4
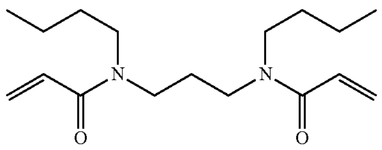
b-5
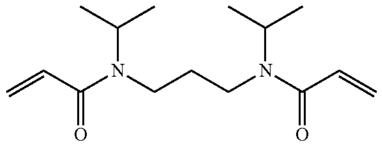
b-6
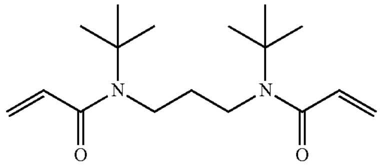
c-1
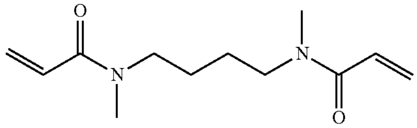
c-2
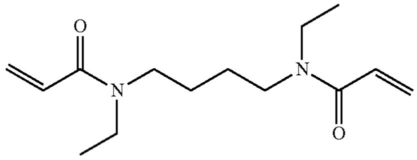
c-3
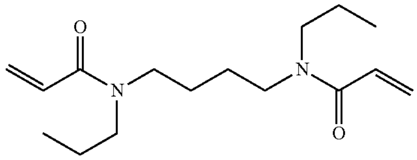
c-4
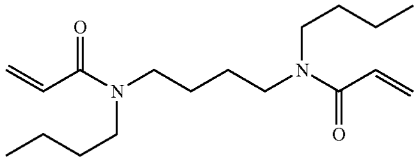
c-5
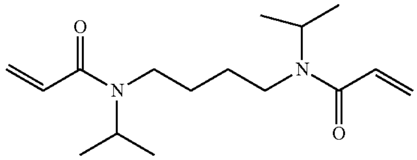
c-6
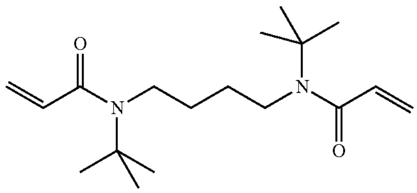
-continued
d-1
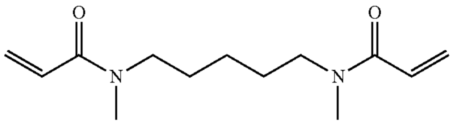
d-2
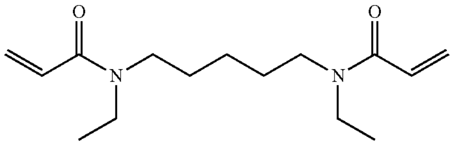
d-3
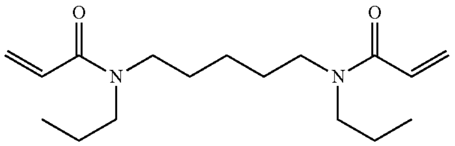
d-4
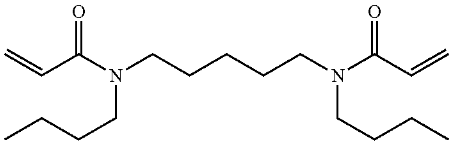
d-5
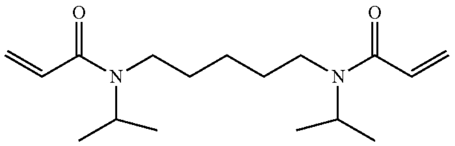
d-6
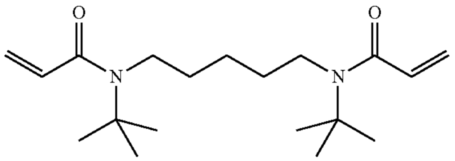
e-1
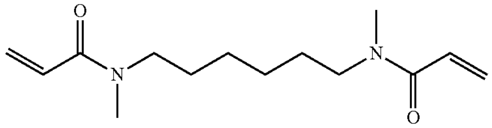
e-2
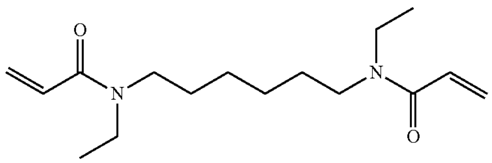
e-3
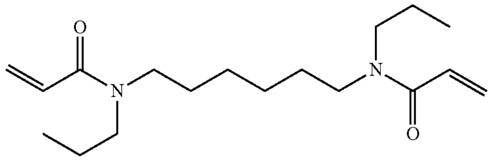
e-4
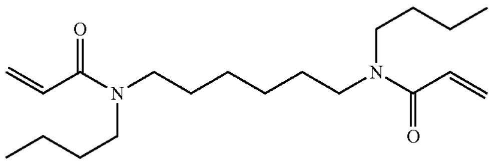

-continued e-5

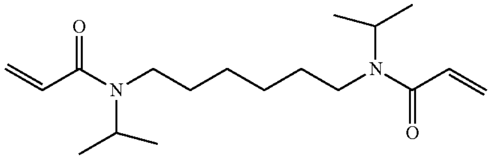

e-6

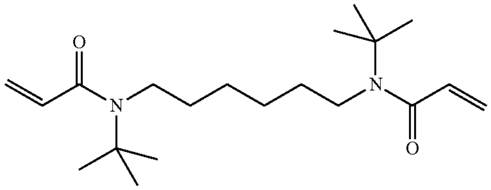

f-1

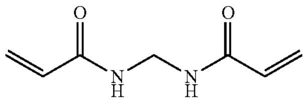

f-2

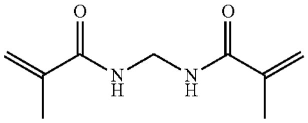

f-3

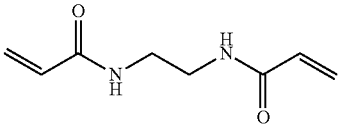

f-4

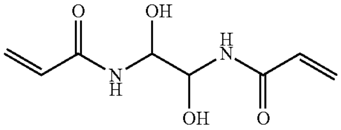

f-5

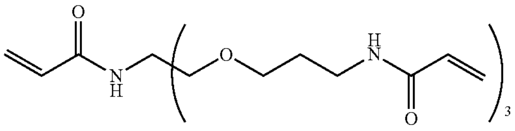

f-6

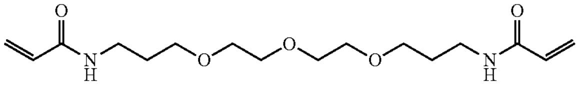

f-7

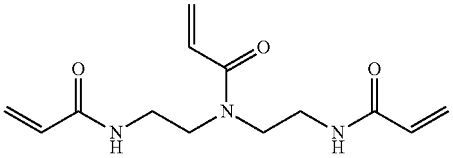

f-8

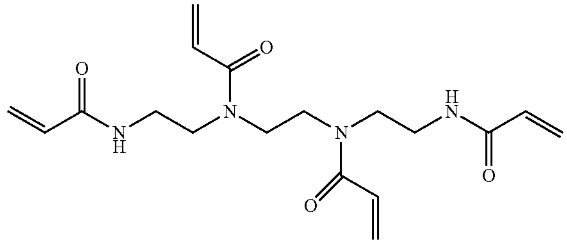

As the multifunctional acrylamide compound (B) of the present disclosure, two or more kinds of different compounds may be used as a mixture. Examples of such different compounds include, but are not limited to, a structural isomer. The mix proportion is not particularly limited. The content of the multifunctional acrylamide compound (B) in the curable water-based composition is typically 0.1% by mass or greater but 50% by mass or less, preferably 20% by mass or less, and more preferably 10% by mass or less.

The curable water-based composition may contain the acrylamide compound (A1) represented by General formula (A1), the multifunctional acrylamide compound (B), and a polymerizable compound other than these compounds.

The total amount of the acrylamide compound (A1) and the acrylamide compound (B) is preferably 30% by mass or greater relative to the total amount of the composition.

The acrylamide compound (B2) is not particularly limited and may be appropriately selected depending on the intended purpose. Examples of the acrylamide compound (B2) include, but are not limited to, APG-700 (available from Shin-Nakamura Chemical Co., Ltd., with an SI value of 1.15), HX-620 (available from Nippon Kayaku Co., Ltd., with an SI value of 0.92), and DPCA-60 (available from Nippon Kayaku Co., Ltd., with an SI value of 1.40).

<Acrylamide Compound (A2)>

The acrylamide compound (A2) is a tertiary acrylamide compound represented by General formula (A2-1) below or General formula (A2-2) below.

General formula (A2-1)

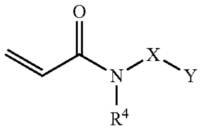

In General formula (A2-1), $R^4$ represents an alkyl group containing from 1 through 6 carbon atoms, X represents an alkylene group containing from 1 through 6 carbon atoms, and Y represents a group represented by General formula (A2a-1) below or General formula (A2b-1) below.

General formula (A2a-1)

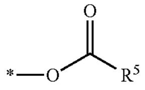

In General formula (A2a-1), $R^5$ represents an alkyl group containing from 1 through 10 carbon atoms, and * represents a bonding site with X.

General formula (A2b-1)

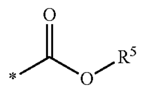

In General formula (A2b-1), $R^5$ represents an alkyl group containing from 1 through 10 carbon atoms, and * represents a bonding site with X.

General formula (A2-2)

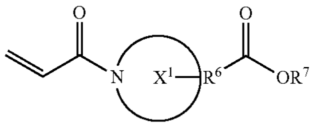

In General formula (A2-2), a ring $X^1$ represents a nitrogen atom-containing ring structure containing from 2 through 5 carbon atoms, $R^6$ represents a single bond or an alkylene group containing from 1 through 3 carbon atoms, and $R^7$ represents a straight-chained or branched alkyl group containing from 1 through 10 carbon atoms.

$R^4$ in General formula (A2-1) represents an alkyl group that may be straight-chained or branched and contains from 1 through 6 carbon atoms.

Examples of the alkyl group containing from 1 through 6 carbon atoms include, but are not limited to, a methyl group, an ethyl group, a propyl group, an isopropyl group, a n-butyl group, a s-butyl group, an isobutyl group, a t-butyl group, a pentyl group, a neopentyl group, and a hexyl group.

X in General formula (A2-1) represents an alkylene group that may be straight-chained or branched and contains from 1 through 6 carbon atoms.

Examples of the alkylene group containing from 1 through 6 carbon atoms include, but are not limited to, a methylene group, an ethylene group, a propylene group, and a butylene group.

Y in General formula (A2-1) represents either General formula (A2a-1) above or General formula (A2b-1) above.

$R^5$ in General formula (A2a-1) represents an alkyl group that may be straight-chained or branched and contains from 1 through 10 carbon atoms.

Examples of the alkyl group containing from 1 through 10 carbon atoms include, but are not limited to, a methyl group, an ethyl group, a propyl group, an isopropyl group, a n-butyl group, a s-butyl group, an isobutyl group, a t-butyl group, a pentyl group, a neopentyl group, a hexyl group, a heptyl group, an octyl group, a nonyl group, and a decyl group.

* in General formula (A2a-1) represents a bonding site with X.

$R^5$ in General formula (A2b-1) represents an alkyl group that may be straight-chained or branched and contains from 1 through 10 carbon atoms.

Examples of the alkyl group containing from 1 through 10 carbon atoms include, but are not limited to, a methyl group, an ethyl group, a propyl group, an isopropyl group, a n-butyl group, a s-butyl group, an isobutyl group, a t-butyl group, a pentyl group, a neopentyl group, a hexyl group, a heptyl group, an octyl group, a nonyl group, and a decyl group.

* in General formula (A2b-1) represents a bonding site with X.

For the acrylamide compound having an ester structure, it is preferable that Y in General formula (A2-1) be represented by General formula (A2b-1).

It is preferable that $R^5$ in General formula (A2b-1) represent an alkyl group containing from 1 through 2 carbon atoms.

The ring $X^1$ in General formula (A2-2) represents a nitrogen atom-containing ring structure containing from 2 through 5 carbon atoms.

$R^6$ in General formula (A2-2) represents a single bond or a straight-chained or branched alkylene group containing from 1 through 3 carbon atoms. Examples of the alkylene group containing from 1 through 3 carbon atoms include, but are not limited to, a methylene group, an ethylene group, and a propylene group.

$R^7$ in General formula (A2-2) represents a straight-chained or branched alkyl group containing from 1 through 10 carbon atoms. Examples of the alkyl group containing from 1 through 10 carbon atoms include, but are not limited to, a methyl group, an ethyl group, a propyl group, an isopropyl group, a n-butyl group, a s-butyl group, an isobutyl group, a t-butyl group, a pentyl group, a neopentyl group, a hexyl group, a heptyl group, an octyl group, a nonyl group, and a decyl group.

The acrylamide compound represented by General formula (A2-1) or General formula (A2-2) has an ester structure at an end of monofunctional tertiary acrylamide.

Tertiary acrylamide compounds having a low molecular weight generally have volatility and strongly smell of a monomer-specific odor. Discomfort may be felt when liquid compositions containing such compounds are handled.

It is possible to suppress the volatility of such tertiary acrylamide compounds having a low molecular weight and reduce the odor by introducing a functional group having a strong polarity or increasing the molecular weight. However, this is accompanied by viscosity increase and a major constraint in use of liquid compositions, above all, inkjet inks.

The tertiary acrylamide compound represented by General formula (A2-1) or General formula (A2-2) has an ester structure at an end. The ester structure can reduce volatility and suppress odor.

It is also considered that the ester structure can improve curability through intermolecular interaction.

Moreover, it is considered that the tertiary acrylamide compound having an ester structure does not undergo a major viscosity increase and can maintain a low viscosity because the tertiary acrylamide compound does not form a strong hydrogen bond.

As a result, the acrylamide compound represented by General formula (A2-1) or General formula (A2-2) can be suitably used as a liquid composition, above all, an inkjet ink.

Acrylamide compounds generally have a high acute oral toxicity, and liquid compositions containing acrylamide compounds have a safety risk and care is needed to handle such liquid compositions.

As compared, the acrylamide compound of the present disclosure represented by General formula (A2-1) or General formula (A2-2) and having an ester structure tends to have a low acute oral toxicity.

Above all, when Y in General formula (A2-1) is General formula (A2b-1), the acrylamide compound tends to have a very low acute oral toxicity.

Hence, a liquid composition containing the acrylamide compound of the present disclosure is expected to have a low acute oral toxicity and to be able to increase safety.

The acrylamide compound represented by General formula (A2-1) is not particularly limited and may be appropriately selected depending on the intended purpose. A compound represented by General formula (A2-1-1) is preferable.

General formula (A2-1-1)

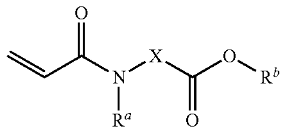

In General formula (A2-1-1), $R^a$ represents an alkyl group containing from 1 through 6 carbon atoms, X represents an alkylene group containing from 1 through 3 carbon atoms, and $R^b$ represents an alkyl group containing from 1 through 4 carbon atoms.

The alkyl group containing from 1 through 6 carbon atoms, represented by R, is the same as $R^4$ in General formula (A2-1).

The alkylene group containing from 1 through 3 carbon atom, represented by X, may have a straight-chain structure or a branched structure. Examples of the alkylene group containing from 1 through 3 carbon atoms include, but are not limited to, a methylene group, an ethylene group, a propylene group, a methyl methylene group, and a dimethyl methylene group. Among these groups, a methylene group, a methyl methylene group, and a dimethyl methylene group are preferable, and a methylene group and a methyl methylene group are more preferable.

The alkyl group containing from 1 through 4 carbon atoms, represented by $R^b$, may have a straight-chain structure or a branched structure. Examples of the alkyl group containing from 1 through 4 carbon atoms include, but are not limited to, a methyl group, an ethyl group, a propyl group, an isopropyl group, a n-butyl group, a s-butyl group, an isobutyl group, and a t-butyl group. Among these groups, a methyl group, an ethyl group, a propyl group, an isopropyl group, a n-butyl group, and an isobutyl group are preferable. $R^b$ is more preferably an alkyl group containing from 1 through 3 carbon atoms.

As specific examples of the acrylamide compound represented by General formula (A2-1) and General formula (A2-1-1), a group of example compounds a to a group of example compounds i will be presented below. The acrylamide compound should not be construed as being limited to these compounds.

Examples of compounds in the group of example compounds a include, but are not limited to, the compounds a1 to a6 presented below. One of these compounds may be used alone or two or more of these compounds may be used in combination.

<<Group of Example Compounds a1>> a1-1

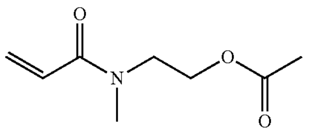

a1-2

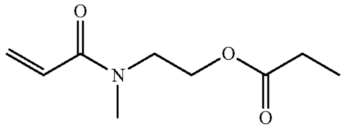

-continued a1-3

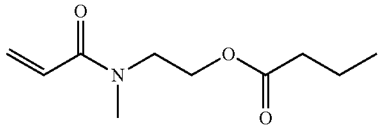

a1-4

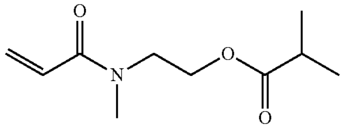

a1-5

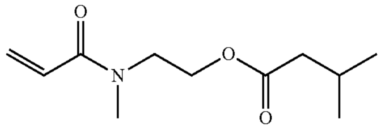

a1-6

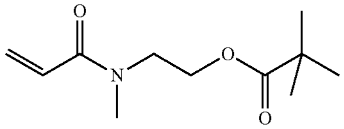

<<Group of Example Compounds a2>> a2-1

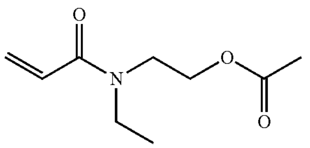

a2-2

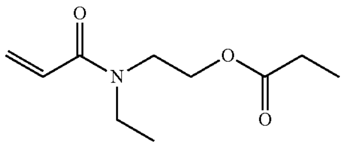

a2-3

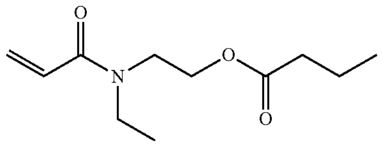

a2-4

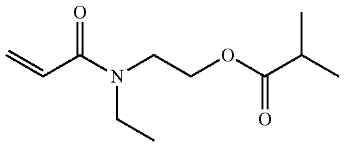

a2-5

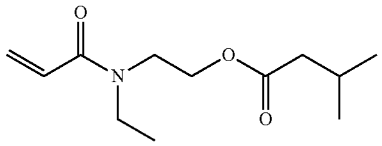

a2-6

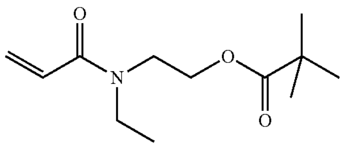

<<Group of Example Compounds a3>>
a3-1
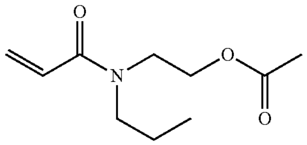
a3-2
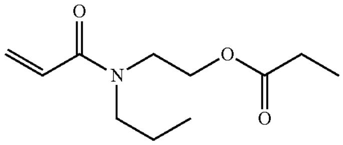
a3-3
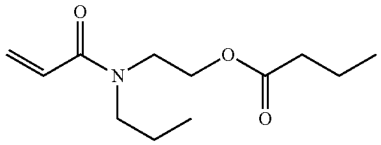
a3-4
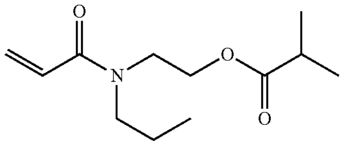
a3-5
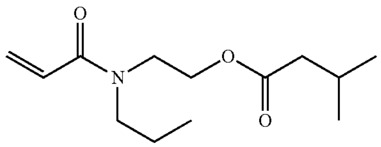
a3-6
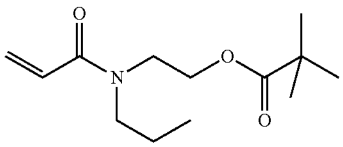
<<Group of Example Compounds a4>>
a4-1
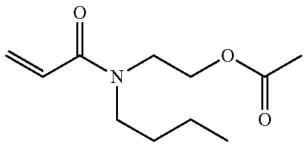
a4-2
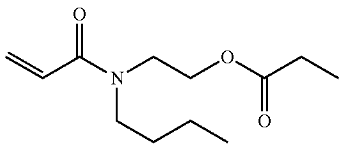
a4-3
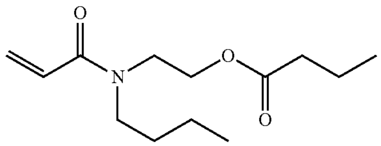
-continued
a4-4
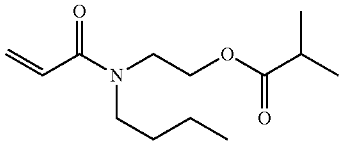
a4-5
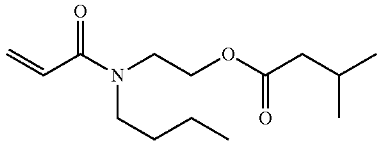
a4-6
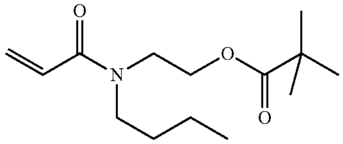
<<Group of Example Compounds a5>>
a5-1
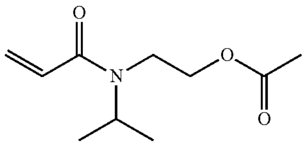
a5-2
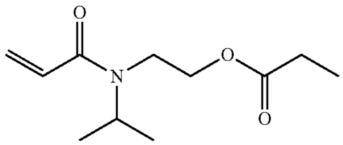
a5-3
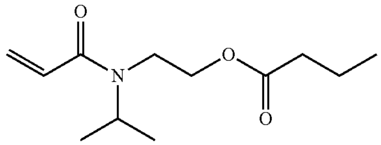
a5-4
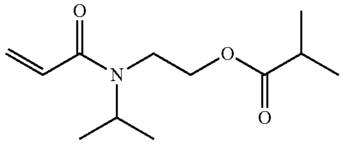
a5-5
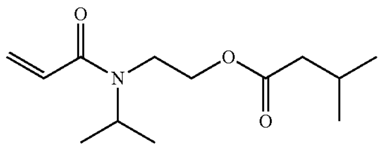
a5-6
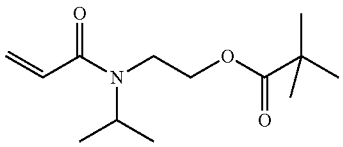

<<Group of Example Compounds a6>>
a6-1
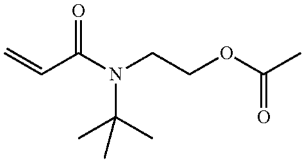
a6-2
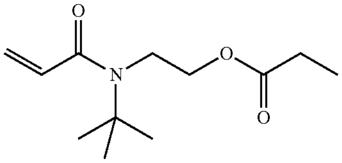
a6-3
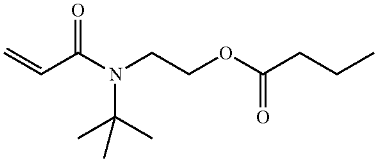
a6-4
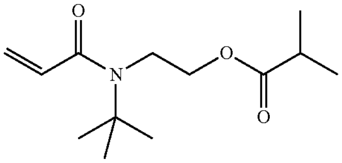
a6-5
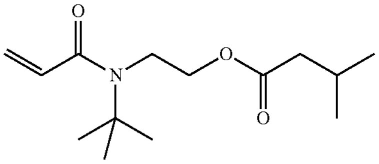
a6-6
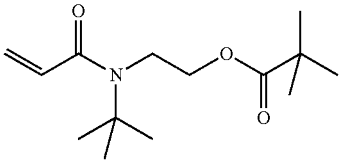
Examples of compounds in the group of example compounds b include, but are not limited to, the compounds b1 to b6 presented below. One of these compounds may be used alone or two or more of these compounds may be used in combination.
<<Group of Example Compounds b1>>
b1-1
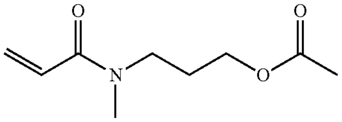
b1-2
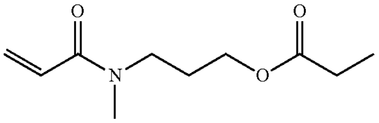
-continued
b1-3
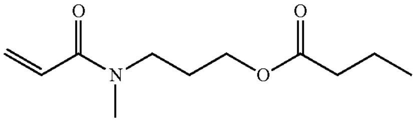
b1-4
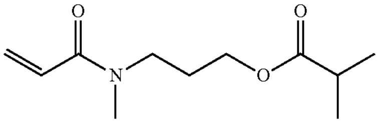
b1-5
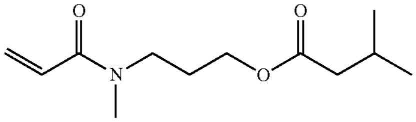
b1-6
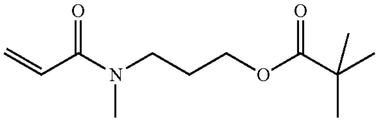
<<Group of Example Compounds b2>>
b2-1
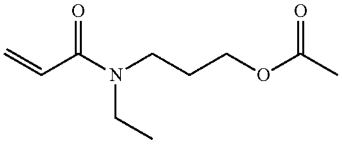
b2-2
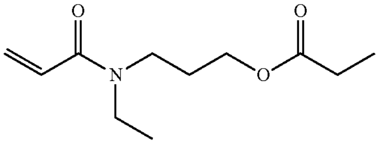
b2-3
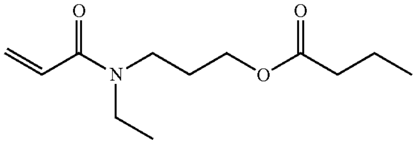
b2-4
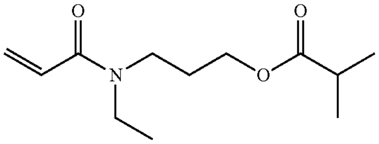
b2-5
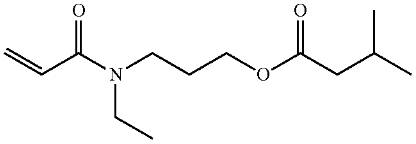
b2-6
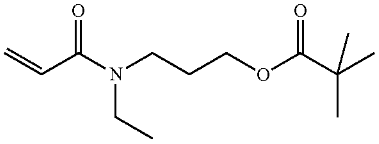

<<Group of Example Compounds b3>>
b3-1
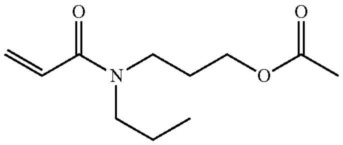
b3-2
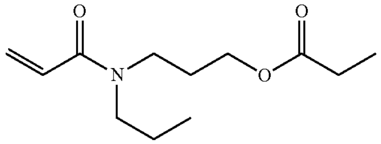
b3-3
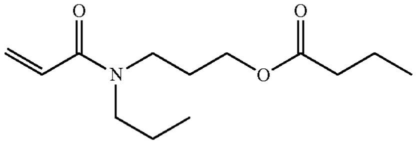
b3-4
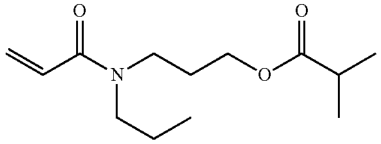
b3-5
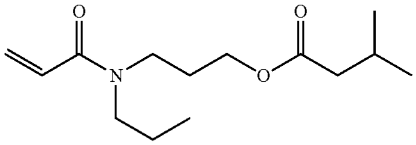
b3-6
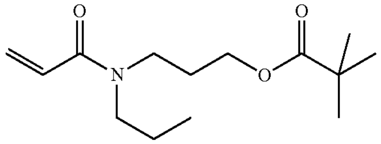
<<Group of Example Compounds b4>>
b4-1
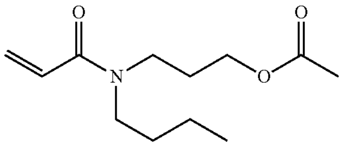
b4-2
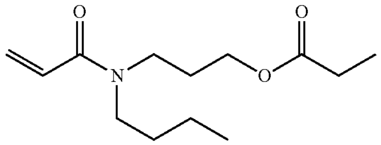
b4-3
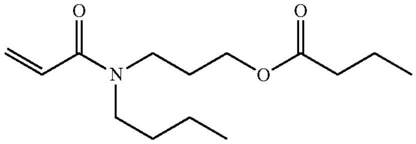
-continued
b4-4
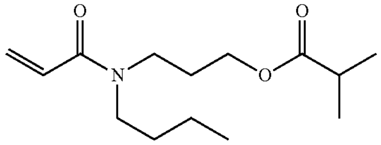
b4-5
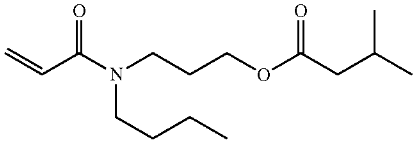
b4-6
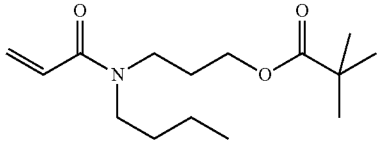
<<Group of Example Compounds b5>>
b5-1
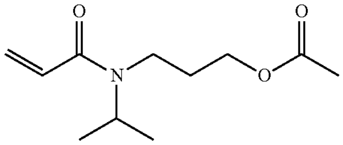
b5-2
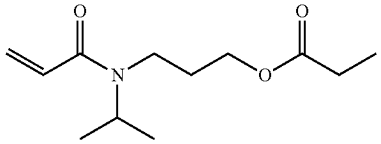
b5-3
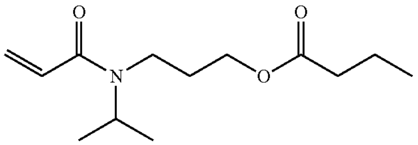
b5-4
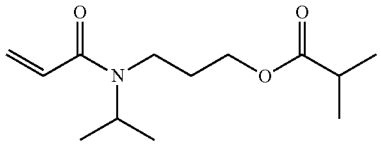
b5-5
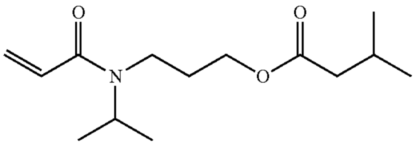
b5-6
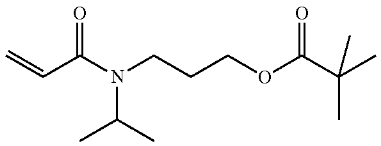

<<Group of Example Compounds b6>>
b6-1
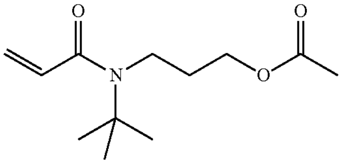
b6-2
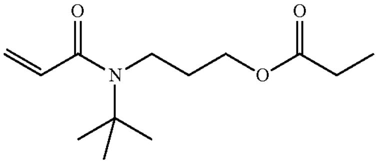
b6-3
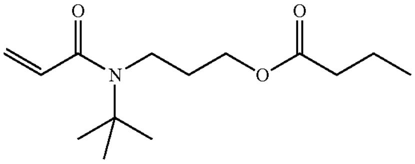
b6-4
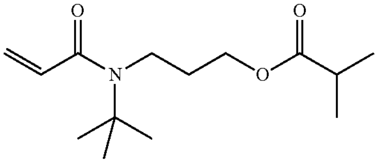
b6-5
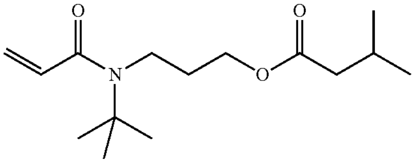
b6-6
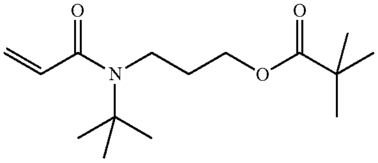
Examples of compounds in the group of example compounds c include, but are not limited to, the compounds c1 to c6 presented below. One of these compounds may be used alone or two or more of these compounds may be used in combination.
<<Group of Example Compounds c1>>
c1-1
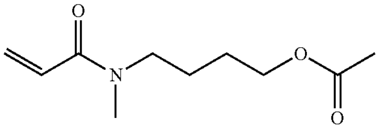
c1-2
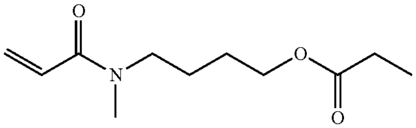
-continued
c1-3
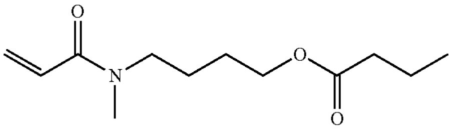
c1-4
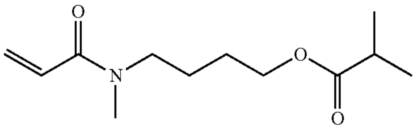
c1-5
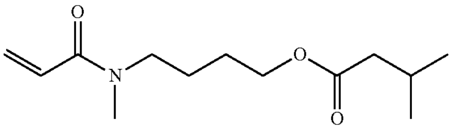
c1-6
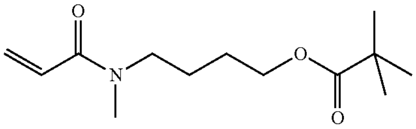
<<Group of Example Compounds c2>>
c2-1
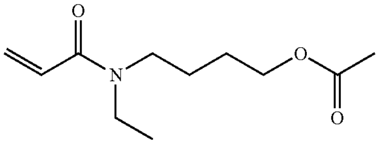
c2-2
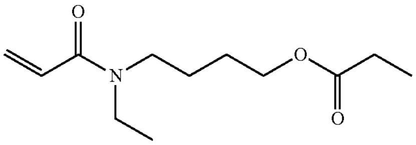
c2-3
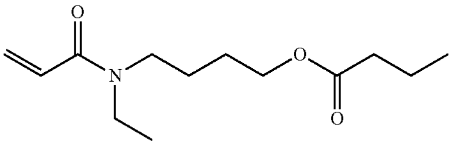
c2-4
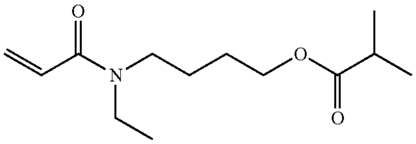
c2-5
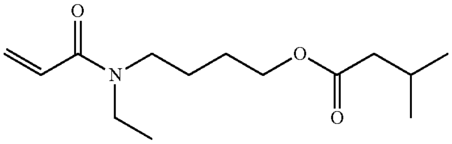

-continued
c2-6
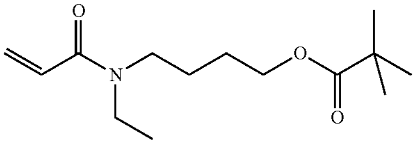
<<Group of Example Compounds c3>>
c3-1
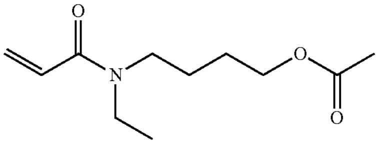
c3-2
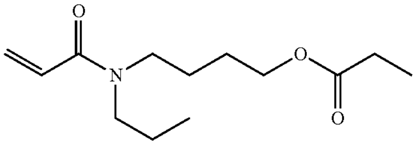
c3-3
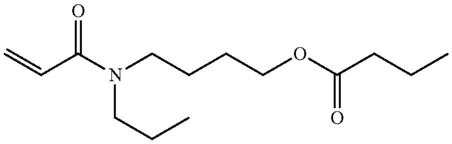
c3-4
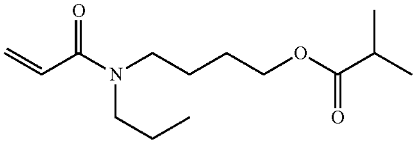
c3-5
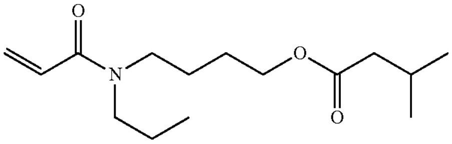
c3-6
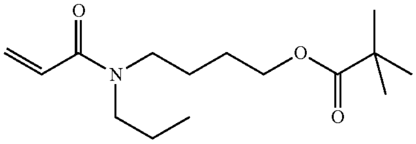
<<Group of Example Compounds c4>>
c4-1
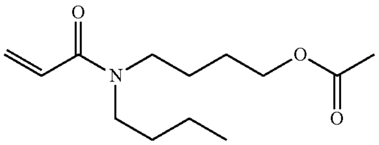
c4-2
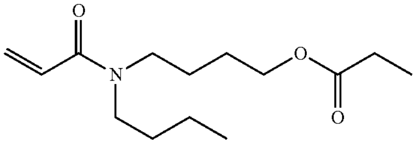
-continued
c4-3
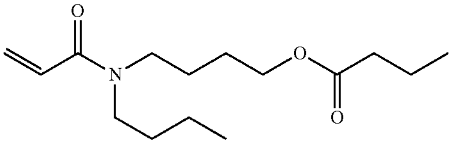
c4-4
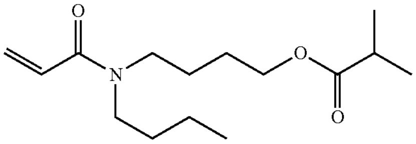
c4-5
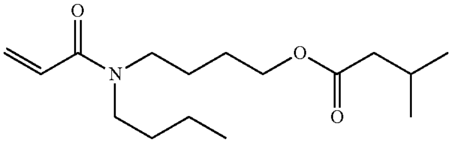
c4-6
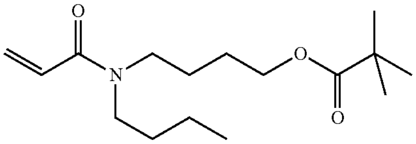
<<Group of Example Compounds c5>>
c5-1
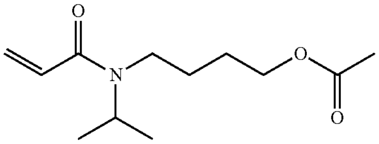
c5-2
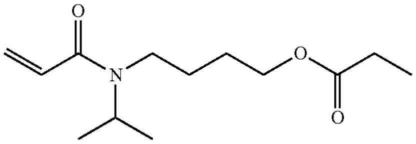
c5-3
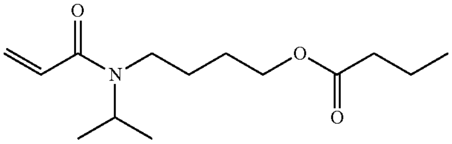
c5-4
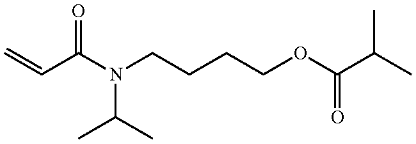
c5-5
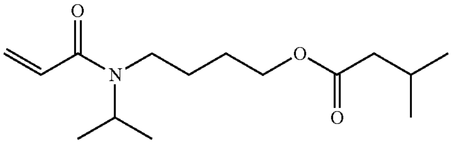

-continued
c5-6
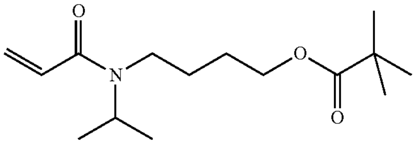
<<Group of Example Compounds c6>>
c6-1
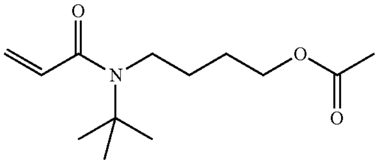
c6-2
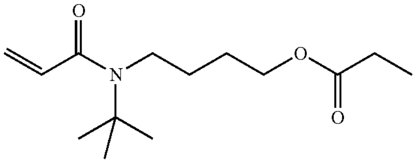
c6-3
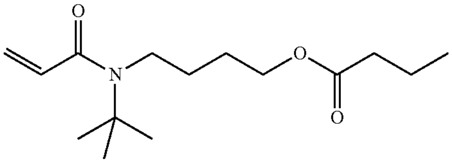
c6-4
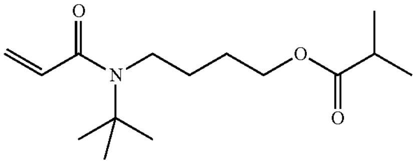
c6-5
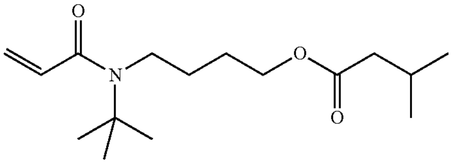
c6-6
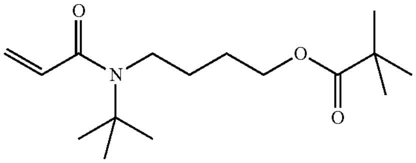
Examples of compounds in the group of example compounds d include, but are not limited to, the compounds d1 to d6 presented below. One of these compounds may be used alone or two or more of these compounds may be used in combination.
<<Group of Example Compounds d1>>
d1-1
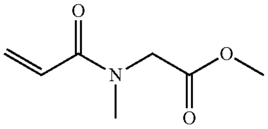
d1-2
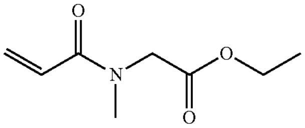
d1-3
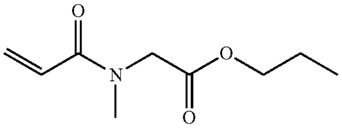
d1-4
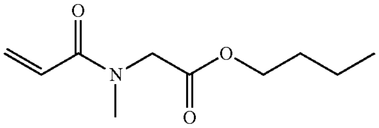
d1-5
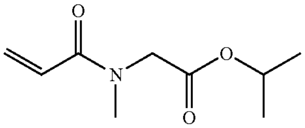
d1-6
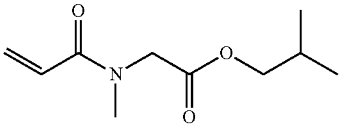
d1-7
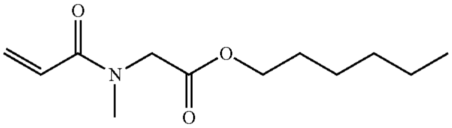
d1-8
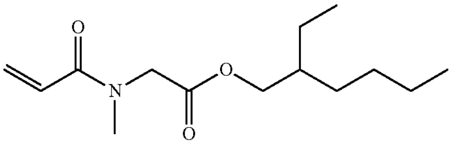
<<Group of Example Compounds d2>>
d2-1
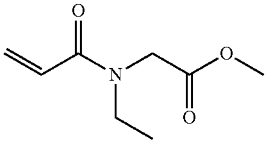
d2-2
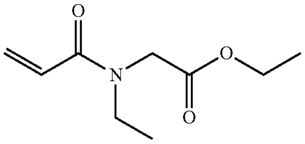

-continued
d2-3
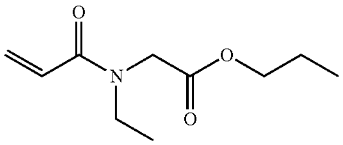
d2-4
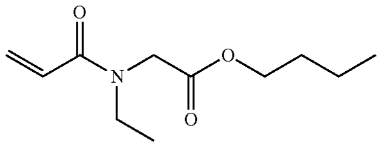
d2-5
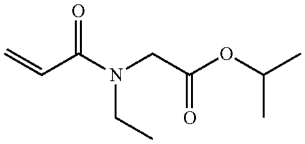
d2-6
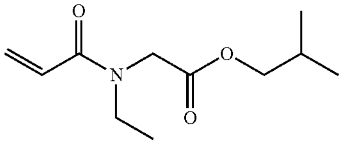
d2-7
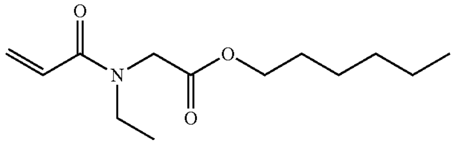
d2-8
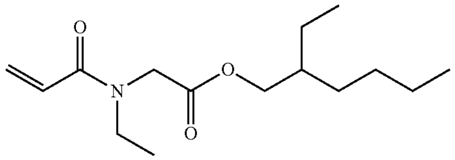
<<Group of Example Compounds d3>>
d3-1
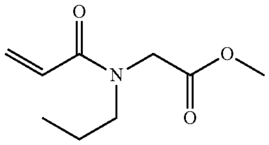
d3-2
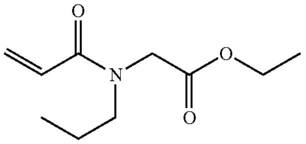
d3-3
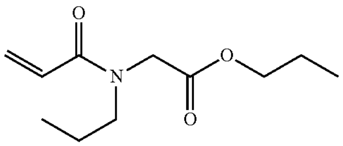
-continued
d3-4
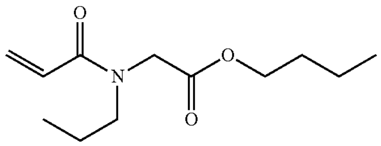
d3-5
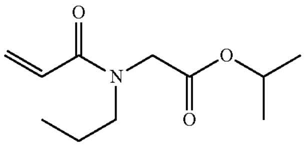
d3-6
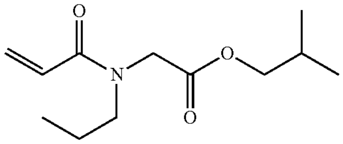
d3-7
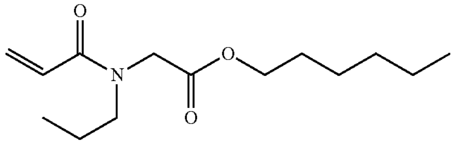
d3-8
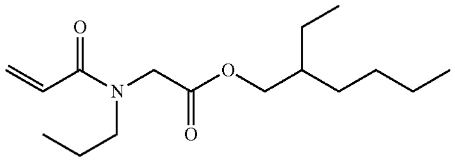
<<Group of Example Compounds d4>>
d4-1
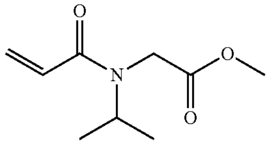
d4-2
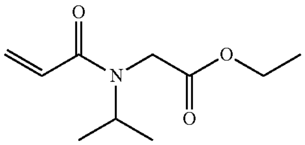
d4-3
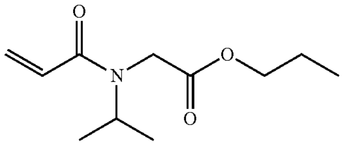
d4-4
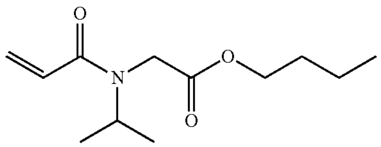

-continued
d4-5
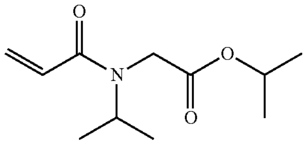
d4-6
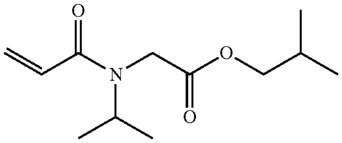
d4-7
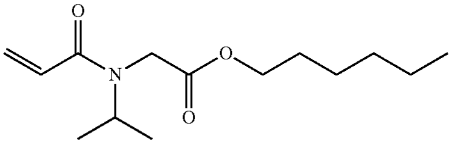
d4-8
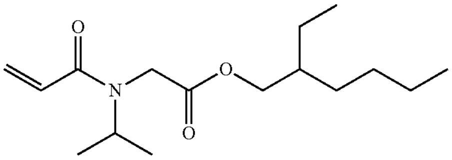
<<Group of Example Compounds d5>>
d5-1
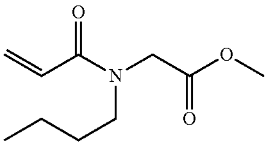
d5-2
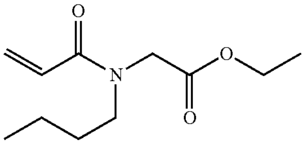
d5-3
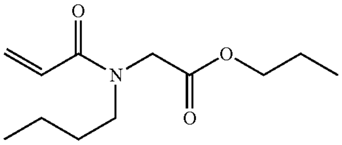
d5-4
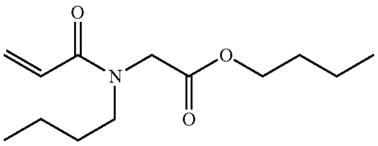
d5-5
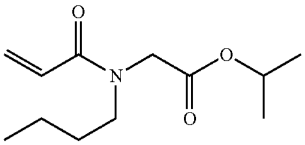
-continued
d5-6
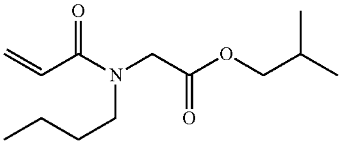
d5-7
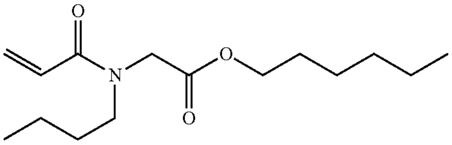
d5-8
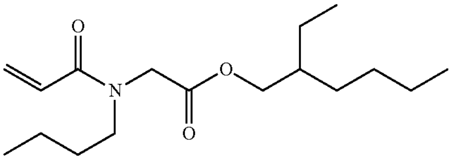
<<Group of Example Compounds d6>>
d6-1
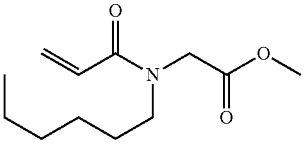
d6-2
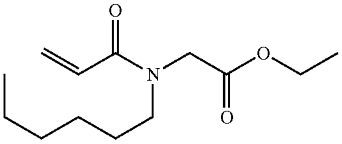
d6-3
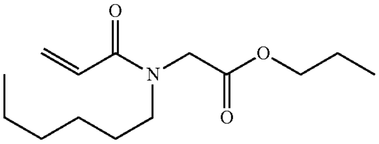
d6-4
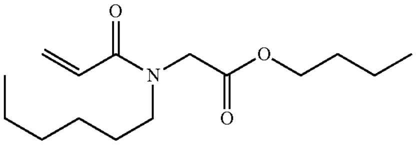
d6-5
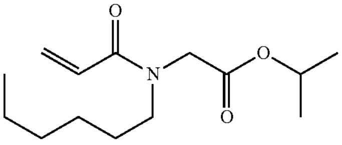
d6-6
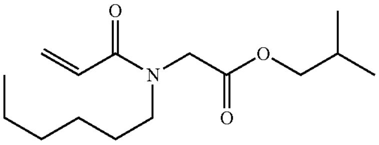

-continued
d6-7
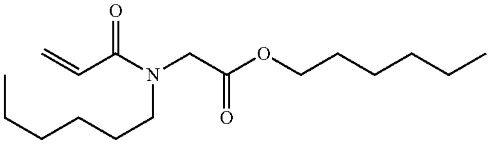
d6-8
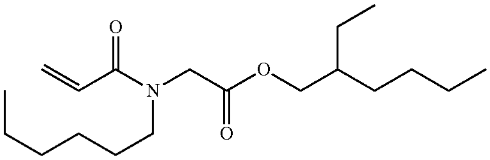
Examples of compounds in the group of example compounds e include, but are not limited to, the compounds e1 to e6 presented below. One of these compounds may be used alone or two or more of these compounds may be used in combination.
<<Group of Example Compounds e1>>
e1-1
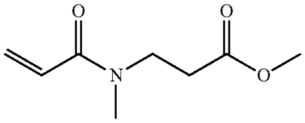
e1-2
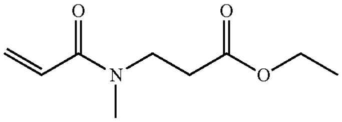
e1-3
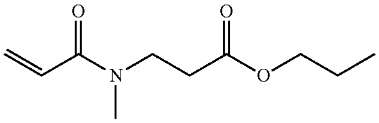
e1-4
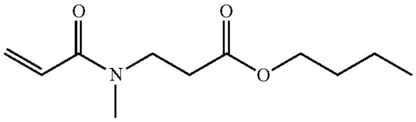
e1-5
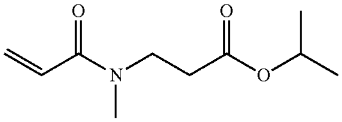
e1-6
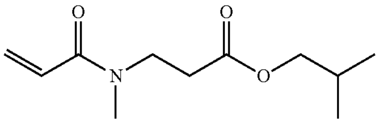
e1-7
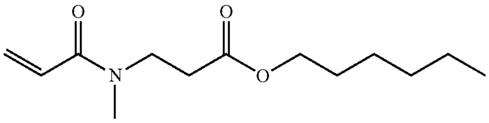
-continued
e1-8
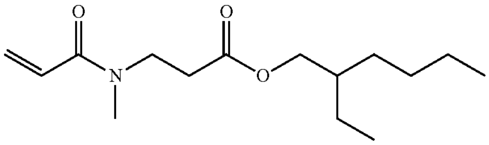
<<Group of Example Compounds e2>>
e2-1
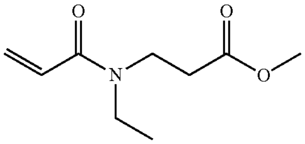
e2-2
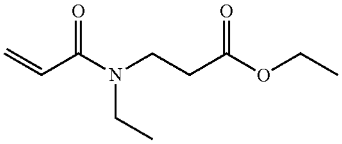
e2-3
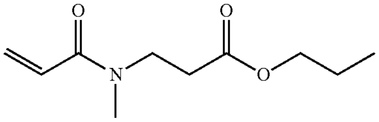
e2-4
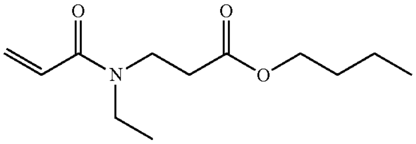
e2-5
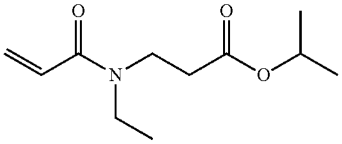
e2-6
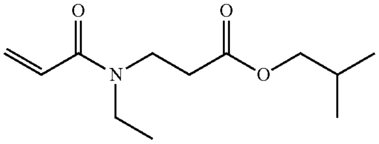
e2-7
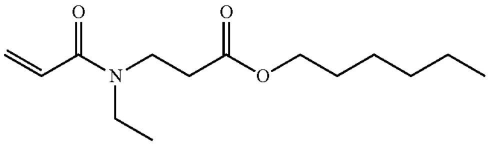
e2-8
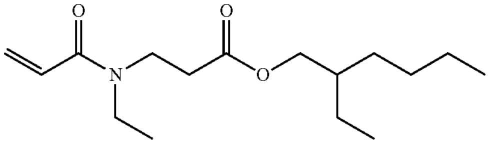

<<Group of Example Compounds e3>>
e3-1
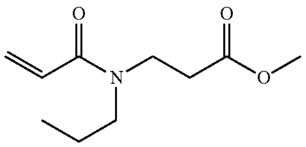
e3-2
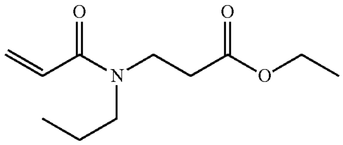
e3-3
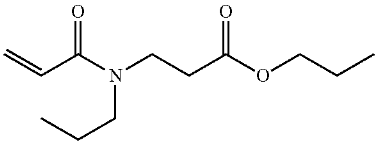
e3-4
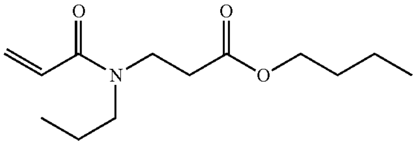
e3-5
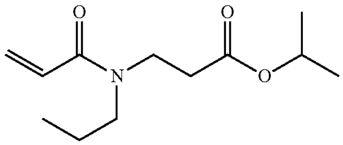
e3-6
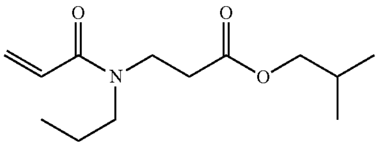
e3-7
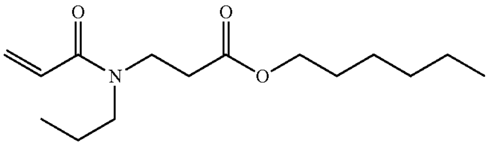
e3-8
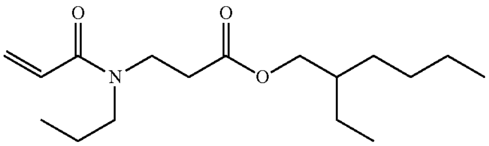
<<Group of example compounds e4>>
e4-1
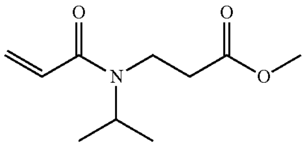
-continued
e4-2
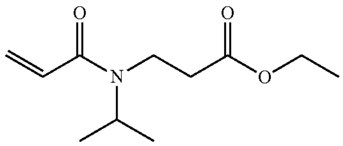
e4-3
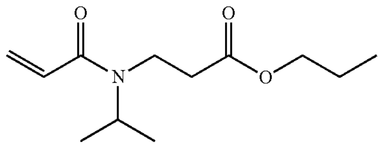
e4-4
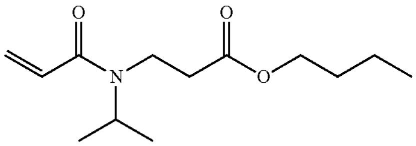
e4-5
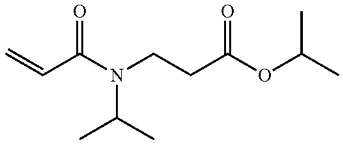
e4-6
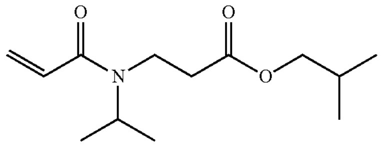
e4-7
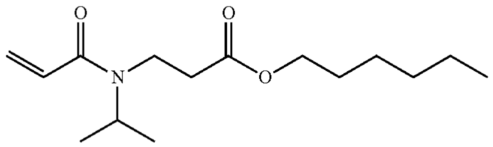
e4-8
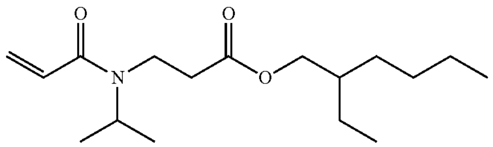
<<Group of Example Compounds e5>>
e5-1
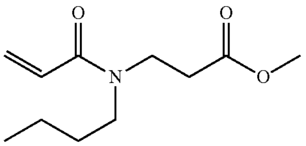
e5-2
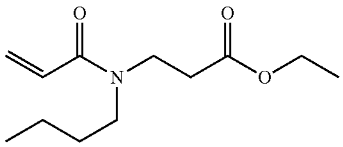

-continued
e5-3
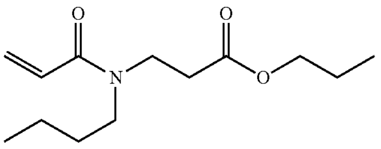
e5-4
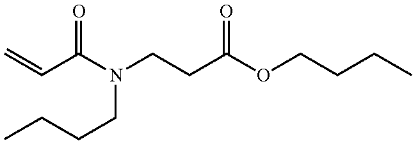
e5-5
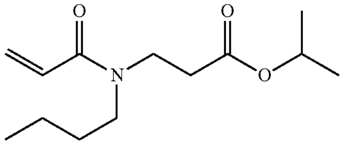
e5-6
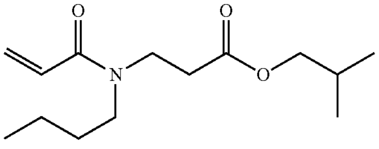
e5-7
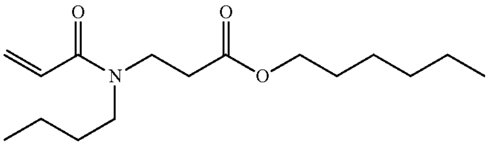
e5-8
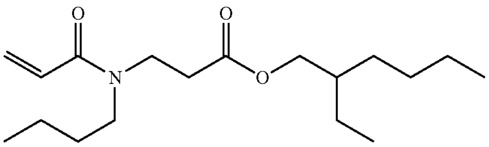
<<Group of Example Compounds e6>>
e6-1
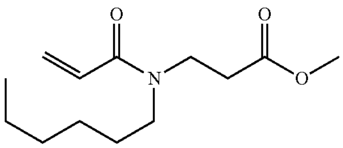
e6-2
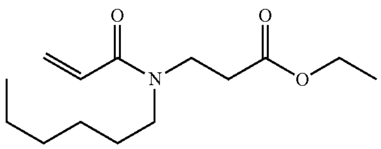
e6-3
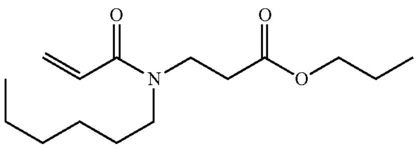
-continued
e6-4
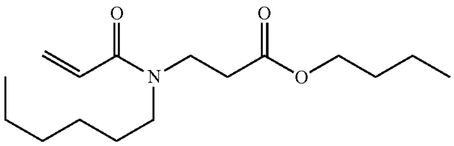
e6-5
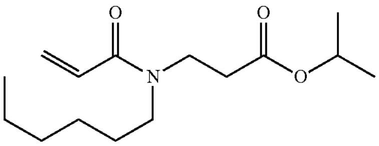
e6-6
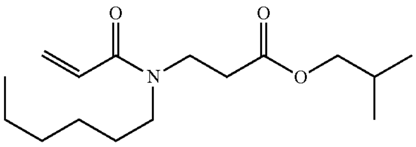
e6-7
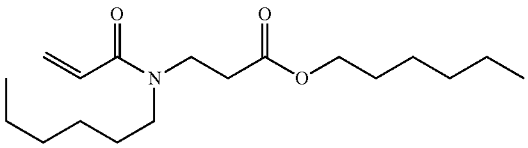
e6-8
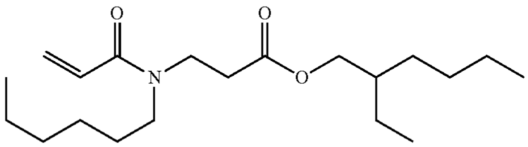
Examples of compounds in the group of example compounds f include, but are not limited to, the compounds f1. One of these compounds may be used alone or two or more of these compounds may be used in combination.
<<Group of Example Compounds f1>>
f1-1
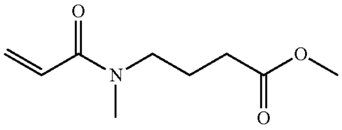
f1-2
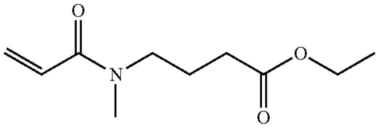
f1-3
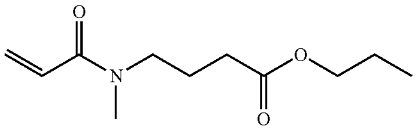
f1-4
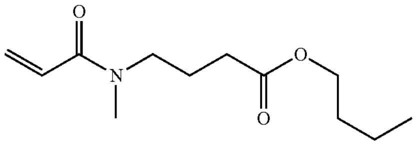

-continued
f1-5
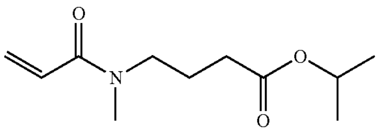
f1-6
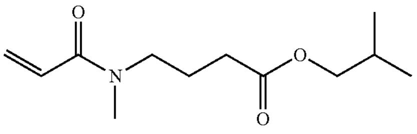
f1-7
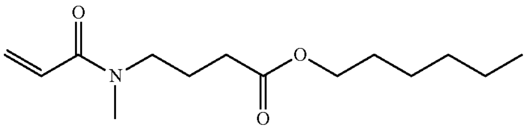
f1-8
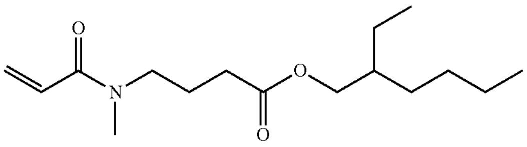
Examples of compounds in the group of example compounds g include, but are not limited to, the compounds g1 to g6 presented below. One of these compounds may be used alone or two or more of these compounds may be used in combination.
<<Group of Example Compounds g1>>
g1-1
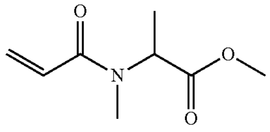
g1-2
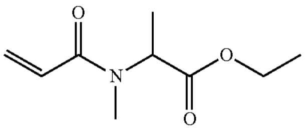
g1-3
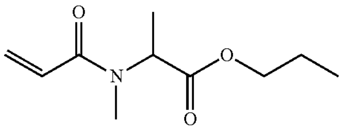
g1-4
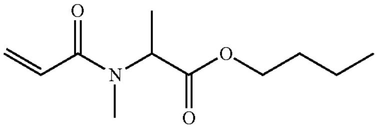
g1-5
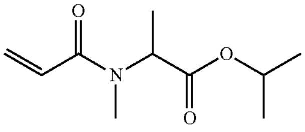
-continued
g1-6
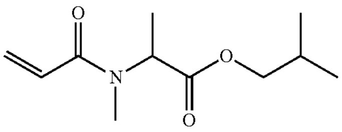
g1-7
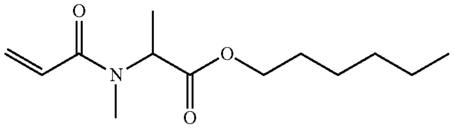
g1-8
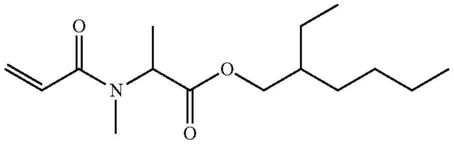
<<Group of Example Compounds g2>>
g2-1
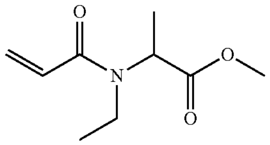
g2-2
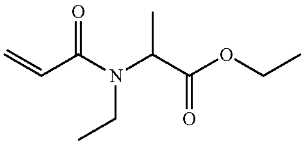
g2-3
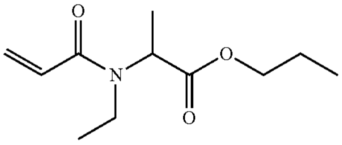
g2-4
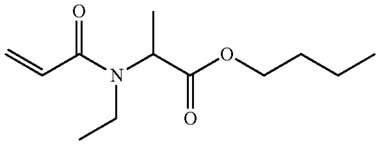
g2-5
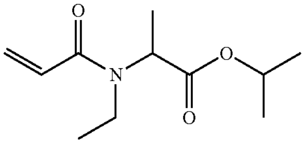
g2-6
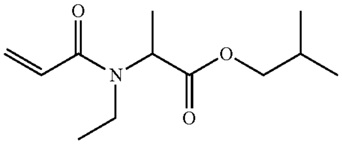

-continued
g2-7
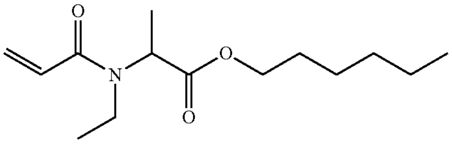
g2-8
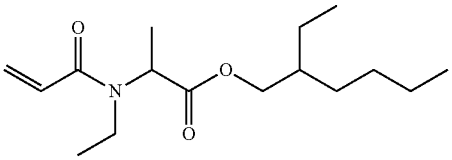
<<Group of Example Compounds g3>>
g3-1
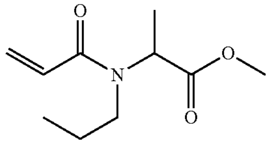
g3-2
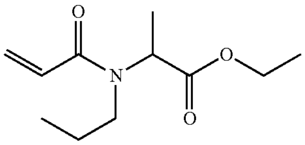
g3-3
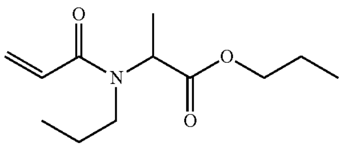
g3-4
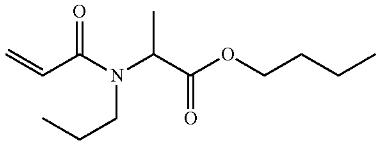
g3-5
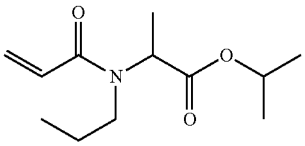
g3-6
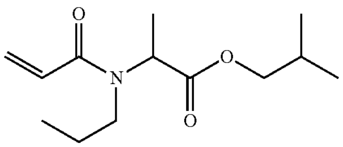
g3-7
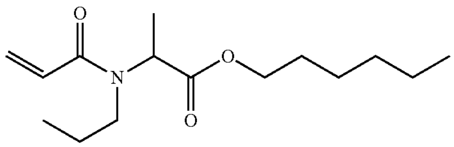
-continued
g3-8
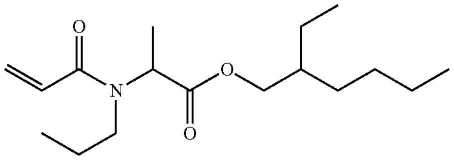
<<Group of Example Compounds g4>>
g4-1
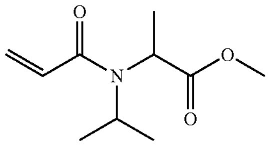
g4-2
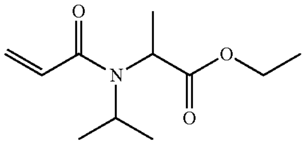
g4-3
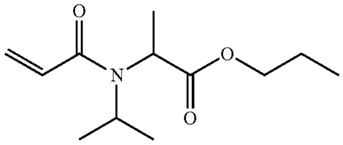
g4-4
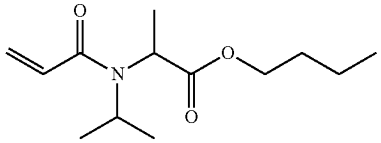
g4-5
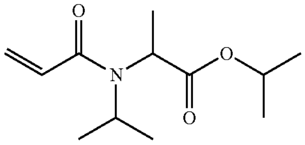
g4-6
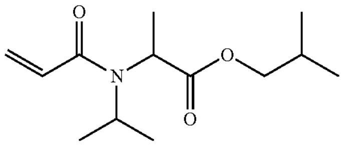
g4-7
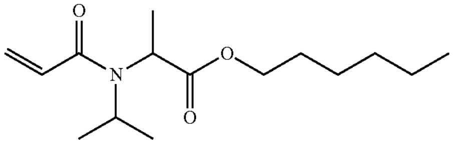
g4-8
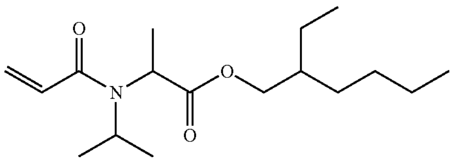

<<Group of Example Compounds g5>>
g5-1
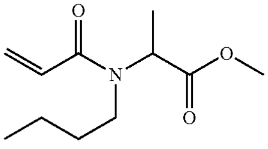
g5-2
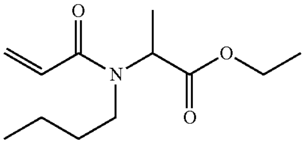
g5-3
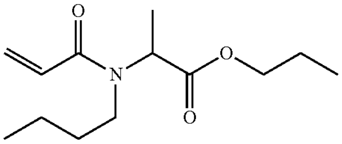
g5-4
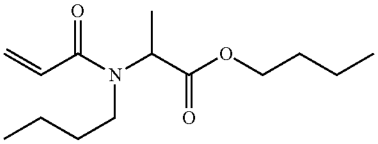
g5-5
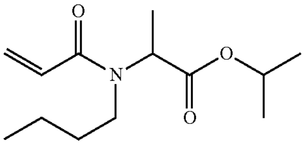
g5-6
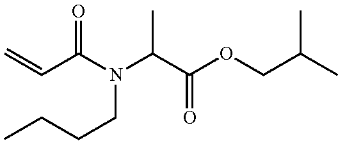
g5-7
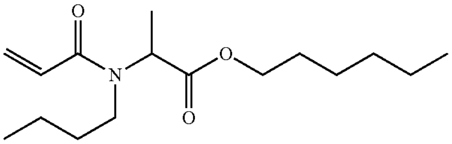
g5-8
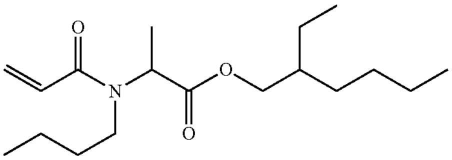
<<Group of Example Compounds g6>>
g6-1
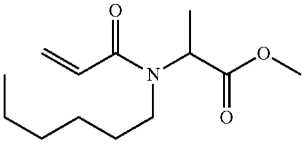
-continued
g6-2
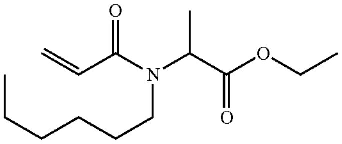
g6-3
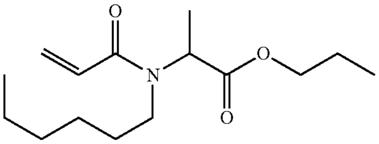
g6-4
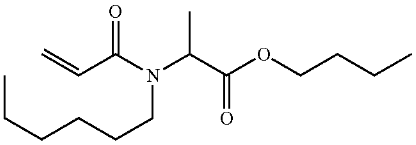
g6-5
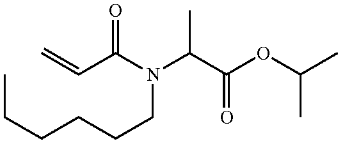
g6-6
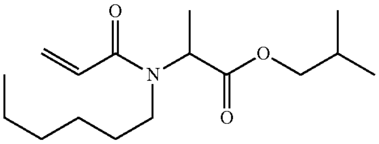
g6-7
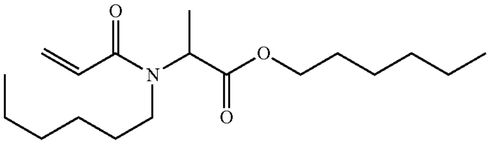
g6-8
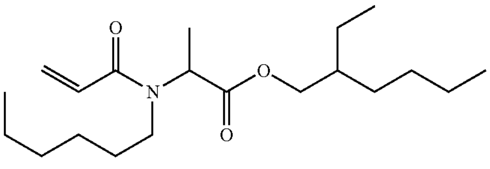
Examples of compounds in the group of example compounds h include, but are not limited to, the compounds h1 presented below. One of these compounds may be used alone or two or more of these compounds may be used in combination.
<<Group of Example Compounds h1>>
h1-1
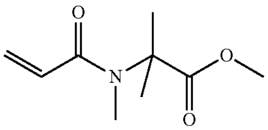
h1-2
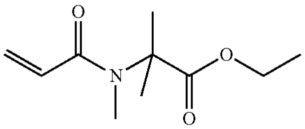

-continued
h1-3
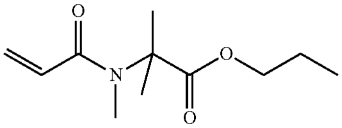
h1-4
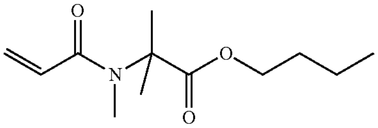
h1-5
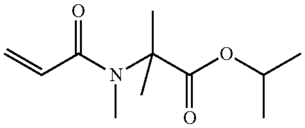
h1-6
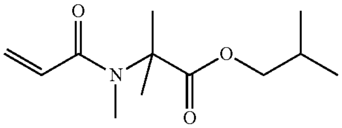
h1-7
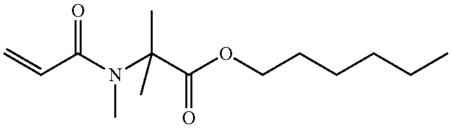
h1-8
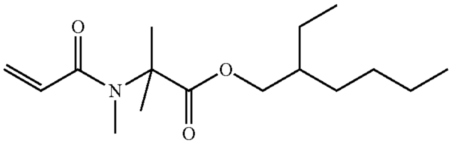
Examples of compounds in the group of example compounds i include, but are not limited to, the compounds i1 to i2 presented below. One of these compounds may be used alone or two or more of these compounds may be used in combination.
<<Group of Example Compounds i1>>
i1-1
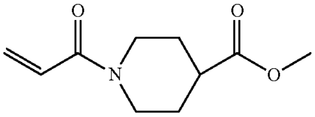
i1-2
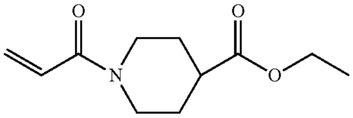
i1-3
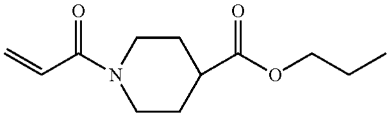
i1-4
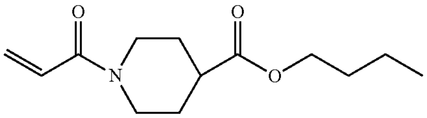
-continued
i1-5
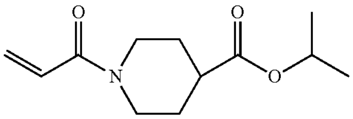
i1-6
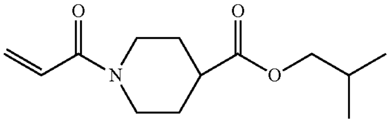
i1-7
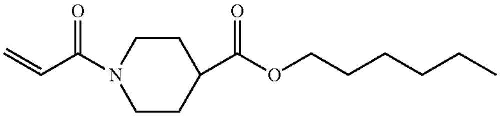
i1-8
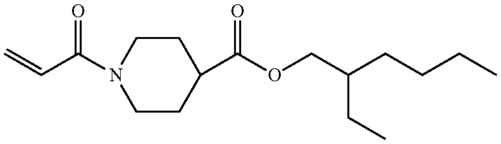
<<Group of Example Compounds i2>>
i2-1
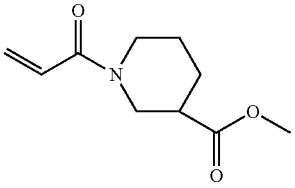
i2-2
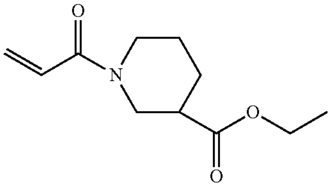
i2-3
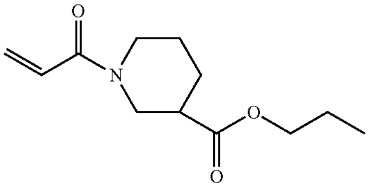
i2-4
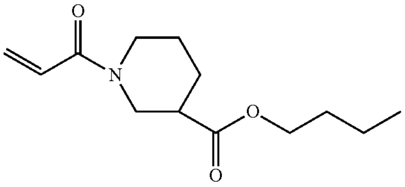

-continued
i2-5
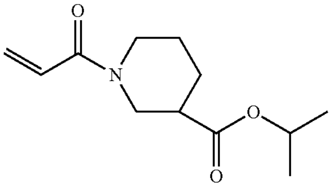
i2-6
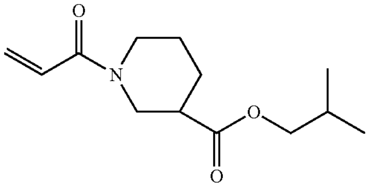
i2-7
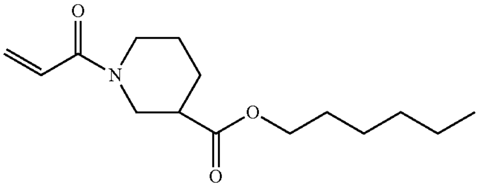
i2-8
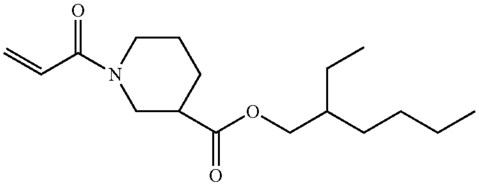
<<Group of Example Compounds i3>>
i3-1
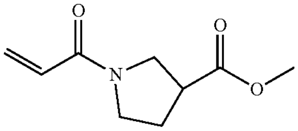
i3-2
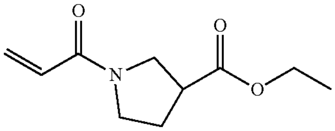
i3-3
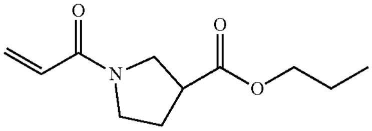
i3-4
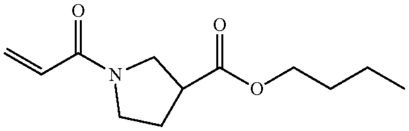
i3-5
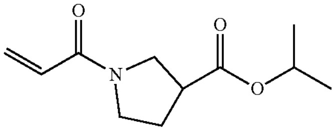
-continued
i3-6
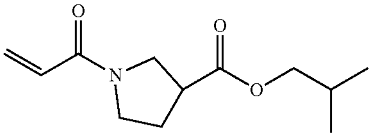
i3-7
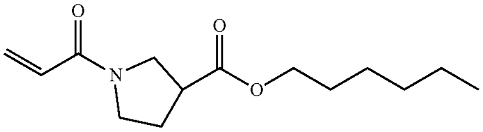
i3-8
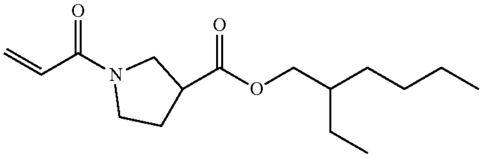
i3-9
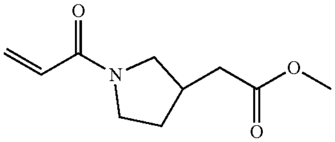
i3-10
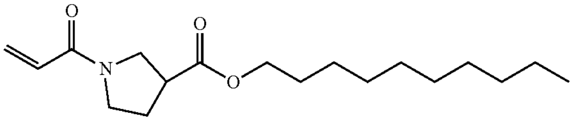
<<Group of Example Compounds i4>>
i4-1
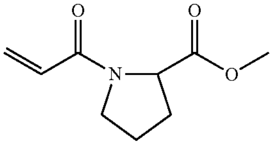
i4-2
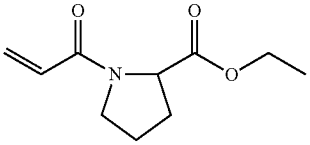
i4-3
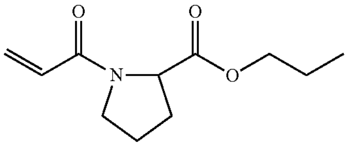
i4-4
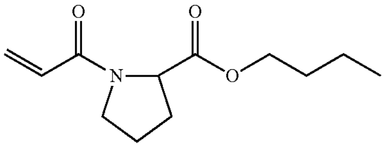

-continued
i4-5
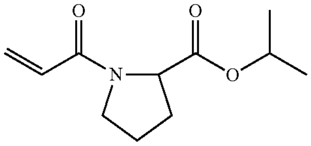
i4-6
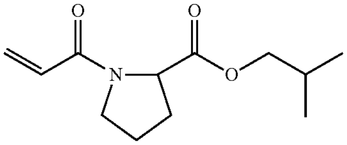
i4-7
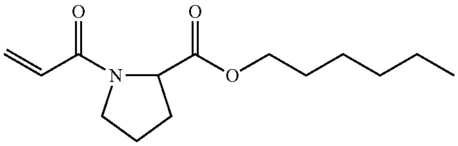
i4-8
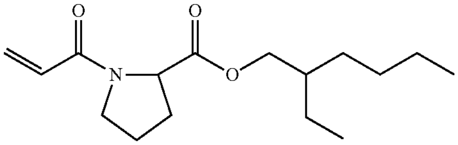
i4-9
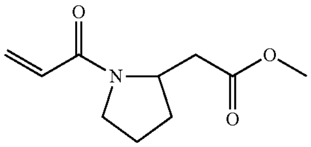
i4-10
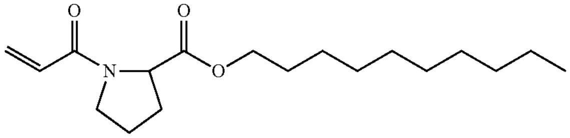
<<Group of Example Compounds i5>>
i5-1
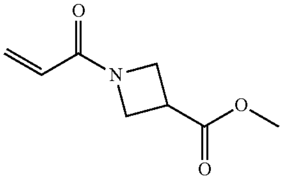
i5-2
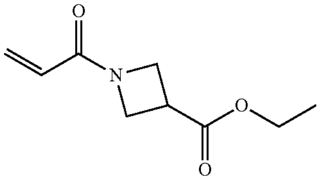
-continued
i5-3
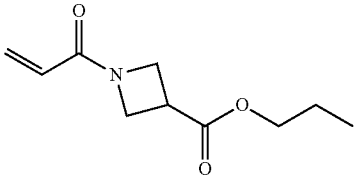
i5-4
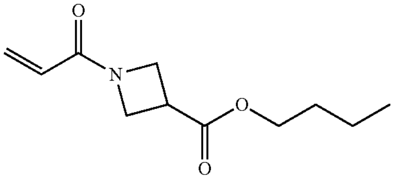
i5-5
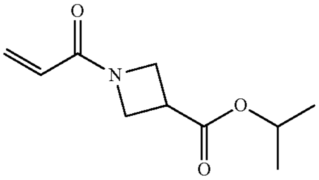
i5-6
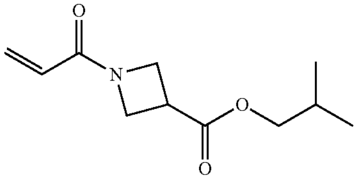
i5-7
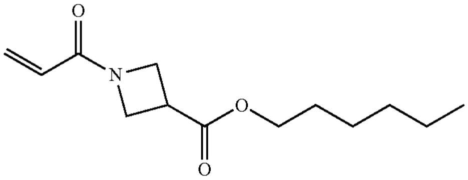
i5-8
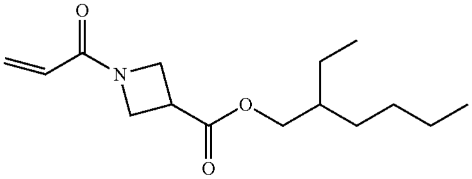
i5-9
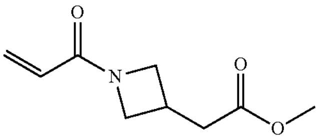
i5-10
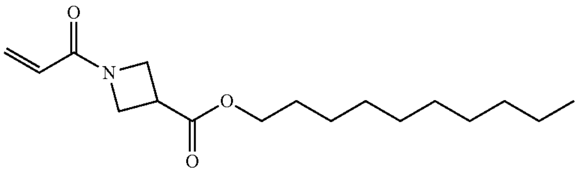

<<Group of Example Compounds i6>> i6-1

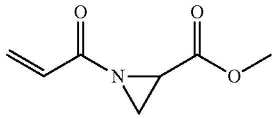

i6-2

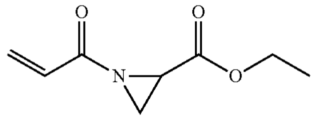

i6-3

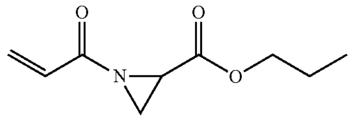

i6-4

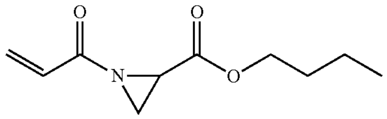

i6-5

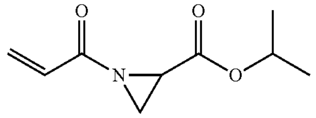

i6-6

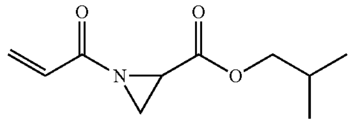

i6-7

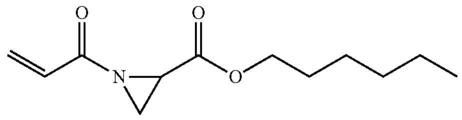

i6-8

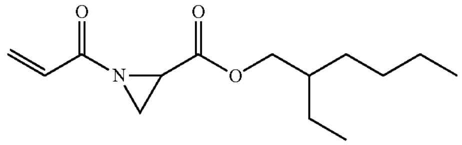

i6-9

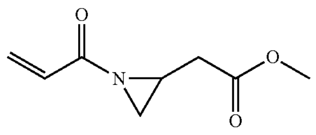

i6-10

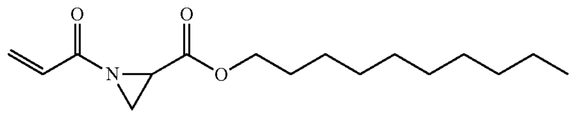

Among the compounds in the group of example compounds a to the group of example compounds i, the example compound a1-1, the example compound a1-4, the example compound a6-1, the example compound d1-1, the example compound d1-2, the example compound d1-4, the example compound d1-5, the example compound d3-2, the example compound d4-1, the example compound d4-5, the example compound d6-1, the example compound d6-4, the example compound g1-1, the example compound g1-2, and the example compound g1-5 are preferable, and the example compound d1-1, the example compound d1-2, the example compound g1-1, the example compound g1-2, the example compound g1-5, the example compound i1-2, the example compound i2-2, the example compound i3-1, and the example compound i3-2 are more preferable in terms of curability.

As the acrylamide compound represented by General formula (A2-1) or General formula (A2-2), two or more kinds of different compounds may be used as a mixture. Examples of such different compounds include, but are not limited to, a structural isomer. The mix proportion is not particularly limited.

The content of the acrylamide compound represented by General formula (A2-1) or General formula (A2-2) is preferably 20% by mass or greater but 98% by mass or less, more preferably 30% by mass or greater but 90% by mass or less, yet more preferably 30% by mass or greater but 80% by mass or less, and particularly preferably 30% by mass or greater but 60% by mass or less relative to the total amount of the curable water-based composition.

<Any Other Polymerizable Compound (A3)>

The curable water-based composition of the present disclosure may contain any other polymerizable compound (A3) in addition to the acrylamide compound (A1), the acrylamide compound (A2), and the acrylamide compound (B1).

The polymerizable compound (A3) is not particularly limited and may be appropriately selected depending on the intended purpose. Examples of the polymerizable compound (A3) include, but are not limited to, radical polymerizable compounds, cationic polymerizable compounds, and anionic polymerizable compounds. One of these polymerizable compounds may be used alone or two or more of these polymerizable compounds may be used in combination.

The radical polymerizable compound is not particularly limited and may be appropriately selected depending on the intended purpose so long as the radical polymerizable compound is a compound containing one or more radical polymerizable ethylenyl unsaturated groups. Examples of the radical polymerizable compound include, but are not limited to, compounds containing, for example, monomers, oligomers, and polymers. Among these radical polymerizable compounds, unsaturated carboxylic acids such as acrylic acid, methacrylic acid, itaconic acid, crotonic acid, isocrotonic acid, and maleic acid, salts of these unsaturated carboxylic acids or compounds derived from these unsaturated carboxylic acids, ethylenyl unsaturated group-containing anhydrides, acrylonitrile, styrene, unsaturated polyester, unsaturated polyether, unsaturated polyamide, and unsaturated urethane are preferable.

Examples of the radical polymerizable compounds include, but are not limited to, acrylic acid derivatives such as 2-hydroxyethyl acrylate, butoxyethyl acrylate, carbitol acrylate, cyclohexyl acrylate, tetrahydrofurfuryl acrylate, benzyl acrylate, bis(4-acryloxypolyethoxyphenyl)propane, neopentyl glycol diacrylate, ethoxylated neopentyl glycol diacrylate, propoxylated neopentyl glycol diacrylate, 1,6-hexanediol diacrylate, ethylene glycol diacrylate, diethylene glycol diacrylate, triethylene glycol diacrylate, tetraethylene glycol diacrylate, polyethylene glycol diacrylate, propylene glycol diacrylate, dipropylene glycol diacrylate, tripropylene glycol diacrylate, tetrapropylene glycol diacrylate, polypropylene glycol diacrylate, pentaerythritol triacrylate, pentaerythritol tetraacrylate, dipentaerythritol tetraacrylate, trimethylolpropane triacrylate, tetramethylolmethane tetraacrylate, oligoester acrylate, and epoxy acrylate; methacrylic acid derivatives such as methyl methacrylate, n-butyl methacrylate, allyl methacrylate, glycidyl methacrylate, benzyl methacrylate, dimethylaminomethyl methacrylate, 1,6-hexanediol dimethacrylate, ethylene glycol dimethacrylate, triethylene glycol dimethacrylate, polyethylene glycol dimethacrylate, polypropylene glycol dimethacrylate, trimethylolethane trimethacrylate, trimethylolpropane trimethacrylate, and 2,2-bis(4-methacryloxypolyethoxyphenyl)propane; acrylamide derivatives such as N-methylol acrylamide, diacetone acrylamide, 2-hydroxyethyl acrylamide, and acryloylmorpholine; allyl compound derivatives such as allyl glycidyl ether, diallyl phthalate, and triallyl trimellitate; monovinyl ether compounds, divinyl ether compounds, or trivinyl ether compounds such as ethylene glycol divinyl ether, ethylene glycol monovinyl ether, diethylene glycol divinyl ether, triethylene glycol monovinyl ether, triethylene glycol divinyl ether, propylene glycol divinyl ether, dipropylene glycol divinyl ether, butanediol divinyl ether, hexanediol divinyl ether, cyclohexane dimethanol divinyl ether, hydroxyethyl monovinyl ether, hydroxynonyl monovinyl ether, and trimethylolpropane trivinyl ether; monovinyl ether compounds such as ethyl vinyl ether, n-butyl vinyl ether, isobutyl vinyl ether, octadecyl vinyl ether, cyclohexyl vinyl ether, hydroxybutyl vinyl ether, 2-ethylhexyl vinyl ether, cyclohexane dimethanol monovinyl ether, n-propyl vinyl ether, isopropyl vinyl ether, isopropenyl ether-o-propylene carbonate, dodecyl vinyl ether, diethylene glycol monovinyl ether, and octadecyl vinyl ether; and 2-ethylhexyl diglycol acrylate, 2-hydroxy-3-phenoxypropyl acrylate, 2-hydroxybutyl acrylate, hydroxypivalic acid neopentyl glycol diacrylate, 2-acryloyloxyethyl phthalic acid, methoxypolyethylene glycol acrylate, tetramethylolmethane triacrylate, 2-acryloyloxyethyl-2-hydroxyethyl phthalic acid, dimethylol tricyclodecane diacrylate, ethoxylated phenyl acrylate, 2-acryloyloxyethyl succinic acid, nonyl phenol ethylene oxide adduct acrylate, modified glycerin triacrylate, bisphenol A diglycidyl ether acrylic acid adduct, modified bisphenol A diacrylate, phenoxypolyethylene glycol acrylate, 2-acryloyloxyethyl hexahydrophthalic acid, bisphenol A propylene oxide adduct diacrylate, bisphenol A ethylene oxide adduct diacrylate, dipentaerythritol hexaacrylate, tolylene diisocyanate urethane prepolymer, lactone-modified flexible acrylate, butoxyethyl acrylate, propylene glycol diglycidyl ether acrylic acid adduct, hexamethylene diisocyanate urethane prepolymer, methoxydipropylene glycol acrylate, ditrimethylolpropane tetraacrylate, stearyl acrylate, isoamyl acrylate, isomyristyl acrylate, isostearyl acrylate, and lactone-modified acrylate. One of these radical polymerizable compounds may be used alone or two or more of these radical polymerizable compounds may be used in combination.

Examples of the cationic polymerizable compound include, but are not limited to, epoxy compounds, vinyl ether compounds, and oxetane compounds. One of these cationic polymerizable compounds may be used alone or two or more of these cationic polymerizable compounds may be used in combination.

Examples of the anionic polymerizable compound include, but are not limited to, lactone compounds, acrylic compounds, and methacrylic compounds. One of these anionic polymerizable compounds may be used alone or two or more of these anionic polymerizable compounds may be used in combination. Among these anionic polymerizable compounds, acrylic acid derivatives and methacrylic acid derivatives are preferable.

The content of the any other polymerizable compound is 0.01 parts by mass or greater but 100 parts by mass or less and more preferably 0.1 parts by mass or greater but 50 parts by mass or less relative to 100 parts by mass of the acrylamide compound represented by General formula (A1).

<Polymerization Initiator (C)>

Examples of the polymerization initiator (C) include, but are not limited to, a thermal polymerization initiator and a photopolymerization initiator. Of these polymerization initiators, a photopolymerization initiator is preferable in terms of storage stability.

Examples of the photopolymerization initiator include, but are not limited to, a radical polymerization initiator, a cationic polymerization initiator, and an anionic polymerization initiator that produce radicals in response to irradiation with light (particularly, ultraviolet rays having a wavelength of from 220 nm through 400 nm). Among these photopolymerization initiators, a radical polymerization initiator is preferable.

Examples of the radical polymerization initiator include, but are not limited to, acetophenone, 2,2-diethoxyacetophenone, p-dimethylamino acetophenone, benzophenone, 2-chlorobenzophenone, p,p'-dichlorobenzophenone, p,p-bisdiethylamino benzophenone, Michler ketone, benzyl, benzoin, benzoin methyl ether, benzoin ethyl ether, benzoin isopropyl ether, benzoin-n-propyl ether, benzoin isobutyl ether, benzoin-n-butyl ether, benzyl methyl ketal, thioxanthone, 2-chlorothioxanthone, 2-hydroxy-2-methyl-1-phenyl-1-one, 1-(4-isopropylphenyl)2-hydroxy-2-methylpropan-1-one, methyl benzoyl formate, 1-hydroxycylohexyl phenyl ketone, azobis isobutyronitrile, benzoyl peroxide, and di-tert-butyl peroxide. One of these radical polymerization initiators may be used alone or two or more of these radical polymerization initiators may be used in combination.

A water-soluble polymerization initiator is particularly preferable. A photopolymerization initiator containing a hydroxyl group in a molecule is preferable. As the skeleton of the photopolymerization initiator, alkylphenone-based and monoacylphosphine oxide-based polymerization initiators are preferable. For example, lithium phenyl(2,4,6-trimethylbenzoyl)phosphinate, 2-hydroxy-4'-(2-hydroxyethoxy)-2-methyl propiophenone (product name: IRGACURE 2959), thioxanthone ammonium salt (product name: QUANTACURE QTX), and benzophenone ammonium salt (product name: QUANTACURE ABQ) are preferable.

In the present disclosure, a polymerization initiator is “water-soluble” when it dissolves in water by 1% by mass or greater.

Examples of the cationic polymerization initiator include, but are not limited to, $B(C_6F_5)_4^-$, $PF_6^-$, $AsF_6^-$, $SbF_6^-$, and $CF_3SO_3^-$ salts of aromatic onium compounds such as diazonium, ammonium, iodonium, sulfonium, and phosphonium, sulfonates that can generate sulfonic acid, halides that can generate hydrogen halide, and iron allene complexes.

Examples of the anionic polymerization initiators include, but are not limited to, o-nitrobenzyl carbamate derivatives, o-acyloxyl derivatives, and o-carbamoyl oxime amidine derivatives.

The thermal polymerization initiator is not particularly limited and may be appropriately selected depending on the intended purpose. Examples of the thermal polymerization initiator include, but are not limited to, azo-based initiators, peroxide initiators, persulfate initiators, and redox (oxidoreduction) initiators.

Examples of the azo-based initiator include, but are not limited to, VA-044, VA-46B, V-50, VA-057, VA-061, VA-067, VA-086, 2,2'-azobis(4-methoxy-2,4-dimethylvaleronitrile) (VAZO 33), 2,2'-azobis(2-amidinopropane) dihydrochloride (VAZO 50), 2,2'-azobis(2,4-dimethylvaleronitrile) (VAZO 52), 2,2'-azobis(isobutyronitrile) (VAZO 64), 2,2'-azobis-2-methyl butyronitrile (VAZO 67), 1,1-azobis(1-cyclohexanecarbonitrile) (VAZO 88) (all available from DuPont Chemical Company), and 2,2'-azobis(2-cyclopropylpropionitrile) and 2,2'-azobis(methyl isobutyrate) (V-601) (both available from Wako Pure Chemical Industries, Ltd.).

Examples of the peroxide initiator include, but are not limited to, benzoyl peroxide, acetyl peroxide, lauroyl peroxide, decanoyl peroxide, dicetyl peroxydicarbonate, di(4-t-butylcyclohexyl)peroxydicarbonate (PERKADOX 16S, available from Akzo Nobel N.V.), di(2-ethylhexyl)peroxydicarbonate, t-butyl peroxypivalate (LUPERSOL 11, available from Elf Atochem), t-butyl peroxy-2-ethyl hexanoate (TRIGONOX 21-C50, available from Akzo Nobel N.V.), and dicumyl peroxide.

Examples of the persulfate initiator include, but are not limited to, potassium persulfate, sodium persulfate, and ammonium persulfate.

Examples of the redox (oxidoreduction) initiator include, but are not limited to, combinations of persulfate initiators with reductants such as sodium hydrogen metabisulfite and sodium hydrogen sulfite, systems based on organic peroxides and tertiary amines (e.g., a system based on benzoyl peroxide and dimethyl aniline), and systems based on organic hydroperoxides and transition metals (e.g., a system based on cumene hydroperoxide and cobalt naphthate).

A hydrogen donor (D) may be used in combination with the polymerization initiator. The hydrogen donor is not particularly limited. For example, amine compounds such as trimethylamine, methyl dimethanolamine, triethanolamine, p-dimethylamino acetophenone, ethyl p-dimethylamino benzoate, p-dimethylaminobenzoic acid-2-ethylhexyl, N,N-dimethylbenzylamine, 4,4'-bis(diethylamino)benzophenone, and tetramethyl ethylene diamine are preferable. The content of the hydrogen donor may be appropriately set depending on the polymerization initiator used and the amount of the polymerization initiator.

The content of the polymerization initiator is preferably 0.1% by mass or greater but 20% by mass or less, more preferably 0.1% by mass or greater but 10% by mass or less, and yet more preferably 0.1% by mass or greater but 5% by mass or less relative to the total amount of the curable water-based composition in terms of obtaining a sufficient curing speed.

<Water>

As the water, for example, pure water such as ion-exchanged water, ultrafiltrated water, reverse osmotic water, and distilled water, or ultrapure water can be used.

For example, in order to provide a moisture retaining property, an antibacterial property, and conductivity or adjust hardness, any other component such as an organic solvent may be dissolved or dispersed in the water.

It is possible to expel dissolved oxygen in the water to outside the system by degassing the water or making the water suction an inert gas such as nitrogen or argon. As a result, it is possible to reduce oxygen-induced termination reactions during a polymerization reaction. Hence, a favorable object having a higher degree of polymerization can be obtained.

The content of the water is not particularly limited, may be appropriately selected depending on the intended purpose, and is preferably 1% by mass or greater but 90% by mass or less, 1% by mass or greater but 60% by mass or less, and more preferably 10% by mass or greater but 50% by mass or less.

<Other Components>

The other components are not particularly limited and may be appropriately selected depending on the intended purpose. Examples of the other components include, but are not limited to, a colorant, a surfactant, a polymerization inhibitor, a leveling agent, a defoaming agent, a fluorescent brightener, a permeation enhancer, a fixing agent, a viscosity stabilizer, a fragrance, a fungicide, a preservative, an antioxidant, an ultraviolet absorbent, a chelate agent, a pH regulator, and a thickener.

<<Colorant>>

As the colorant, various pigments and dyes may be used that impart black, white, magenta, cyan, yellow, green, orange, and gloss colors such as gold and silver, depending on the intended purpose of the curable water-based composition and requisite properties thereof.

A content of the colorant in the composition is not particularly limited, and may be appropriately determined considering, for example, a desired color density and dispersibility of the colorant in the curable water-based composition. However, it is preferably from 0.1% by mass to 20% by mass relative to the total mass of the curable water-based composition. Incidentally, the curable water-based composition of the present disclosure does not necessarily contain a colorant but can be clear and colorless. In such a case, for example, such a clear and colorless composition is good for an overcoating layer to protect an object.

The pigment can be either inorganic or organic, and two or more of the pigments can be used in combination.

Specific examples of the inorganic pigments include, but are not limited to, carbon blacks (C.I. Pigment Black 7) such as furnace black, lamp black, acetylene black, and channel black, iron oxides, and titanium oxides.

Specific examples of the organic pigments include, but are not limited to, azo pigments such as insoluble azo pigments, condensed azo pigments, azo lakes, and chelate azo pigments, polycyclic pigments such as phthalocyanine pigments, perylene pigments, perinone pigments, anthraquinone pigments, quinacridone pigments, dioxazine pigments, thioindigo pigments, isoindolinone pigments, and quinofuranone pigments, dye chelates (e.g., basic dye chelates, acid dye chelates), dye lakes (e.g., basic dye lakes, acid dye lakes), nitro pigments, nitroso pigments, aniline black, and daylight fluorescent pigments.

In addition, a dispersant is optionally added to enhance the dispersibility of pigment. The dispersant has no particular limit and can be, for example, polymer dispersants conventionally used to prepare pigment dispersion (material).

The dyes include, but are not limited to, for example, acidic dyes, direct dyes, reactive dyes, basic dyes, and combinations thereof.

<<Water-Soluble Organic Solvent>>

Examples of the water-soluble organic solvent include, but are not limited to, alkyl alcohols containing from 1 through 4 carbon atoms, such as methyl alcohol, ethyl alcohol, n-propyl alcohol, isopropyl alcohol, n-butyl alcohol, sec-butyl alcohol, and tert-butyl alcohol; amides such as dimethyl formamide and dimethyl acetamide: ketones or ketone alcohols such as acetone, methyl ethyl ketone, and diacetone alcohol; ethers such as tetrahydrofuran and dioxane; polyvalent alcohols such as ethylene glycol, propylene glycol, 1,2-propanediol, 1,2-butanediol, 1,3-butanediol, 1,4-butanediol, diethylene glycol, triethylene glycol, 1,2,6-hexanetriol, thioglycol, hexylene glycol, and glycerin; polyalkylene glycols such as polyethylene glycol and polypropylene glycol; lower alcohol ethers of polyvalent alcohols, such as ethylene glycol monomethyl (or ethyl) ether, diethylene glycol methyl (or ethyl) ether, and triethylene glycol monomethyl (or ethyl) ether: alkanol amines such as monoethanol amine, diethanol amine, and triethanol amine: and N-methyl-2-pyrrolidone, 2-pyrrolidone, and 1,3-dimethyl-2-imidazolidinone. One of these water-soluble organic solvents may be used alone or two or more of these water-soluble organic solvents may be used in combination.

Among these water-soluble organic solvents, polyvalent alcohols are preferable and glycerin is more preferable in terms of a moisture retaining property.

The content of the water-soluble organic solvent is preferably 1% by mass or greater but 90% by mass or less, more preferably 5% by mass or greater but 90% by mass or less, yet more preferably 10% by mass or greater but 80% by mass or less, and particularly preferably 15% by mass or greater but 30% by mass or less relative to the total amount of the curable water-based composition.

[Preparation of Curable Water-Based Composition]

The curable water-based composition of the present disclosure can be prepared by using the components described above. The preparation devices and conditions are not particularly limited. For example, the curable water-based composition can be prepared by subjecting the acrylamide compound represented by General formula (A1), water, etc., to a dispersion treatment using a dispersing machine such as a ball mill, a kitty mill, a disk mill, a pin mill, and a DYNO-MILL to prepare a liquid dispersion, and further mixing the liquid dispersion with a polymerization initiator, a polymerization inhibitor, and a surfactant.

[Viscosity]

The viscosity of the curable water-based composition of the present disclosure has no particular limit because it can be adjusted depending on the purpose and application devices.

For example, if an ejecting device that ejects the curable water-based composition from nozzles is employed, the viscosity thereof is preferably in the range of 60 mPa·s or lower, preferably 3 mPa·s to 40 mPa·s, more preferably 5 mPa·s to 30 mPa·s, and yet more preferably 5 mPa·s to 15 mPa·s, and particularly preferably 6 mPa·s to 12 mPa·s in the temperature range of 20 degrees C. to 65 degrees C., preferably at 25 degrees C.

In addition, it is particularly preferable to satisfy this viscosity range by the composition free of the organic solvent described above. Incidentally, the viscosity can be measured by a cone plate rotary viscometer (VISCOMETER TVE-22L, manufactured by TOKI SANGYO CO., LTD.) using a cone rotor (1°34'×R24) at a number of rotation of 50 rpm with a setting of the temperature of hemathermal circulating water in the range of 20 degrees C. to 65 degrees C. VISCOMATE VM-150III can be used for the temperature adjustment of the circulating water.

[Curing Method]

Examples of the curing method for curing the curable water-based composition of the present disclosure include, but are not limited to, curing by heating and curing by active energy rays. Of these methods, curing by active energy rays is preferable.

Active energy rays used for curing the curable water-based composition of the present disclosure are not particularly limited, so long as they are able to give necessary energy for allowing polymerization reaction of polymerizable components in the curable water-based composition to proceed. Examples of the active energy rays include, but are not limited to, electron beams, α-rays, β-rays, γ-rays, and X-rays, in addition to ultraviolet rays. When a light source having a particularly high energy is used, polymerization reaction can be allowed to proceed without a polymerization initiator. In addition, in the case of irradiation with ultraviolet ray, mercury-free is preferred in terms of protection of environment. Therefore, replacement with GaN-based semiconductor ultraviolet light-emitting devices is preferred from industrial and environmental point of view. Furthermore, ultraviolet light-emitting diode (UV-LED) and ultraviolet laser diode (UV-LD) are preferable as an ultraviolet light source. Small sizes, long time working life, high efficiency, and high cost performance make such irradiation sources desirable.

[Application Field]

The application field of the curable water-based composition of the present disclosure is not particularly limited. It can be applied to any field where active-energy-ray-curable compositions are used. For example, the curable composition is selected to a particular application and used for a resin for processing, a paint, an adhesive, an insulant, a release agent, a coating material, a sealing material, various resists, and various optical materials.

Figure 2:
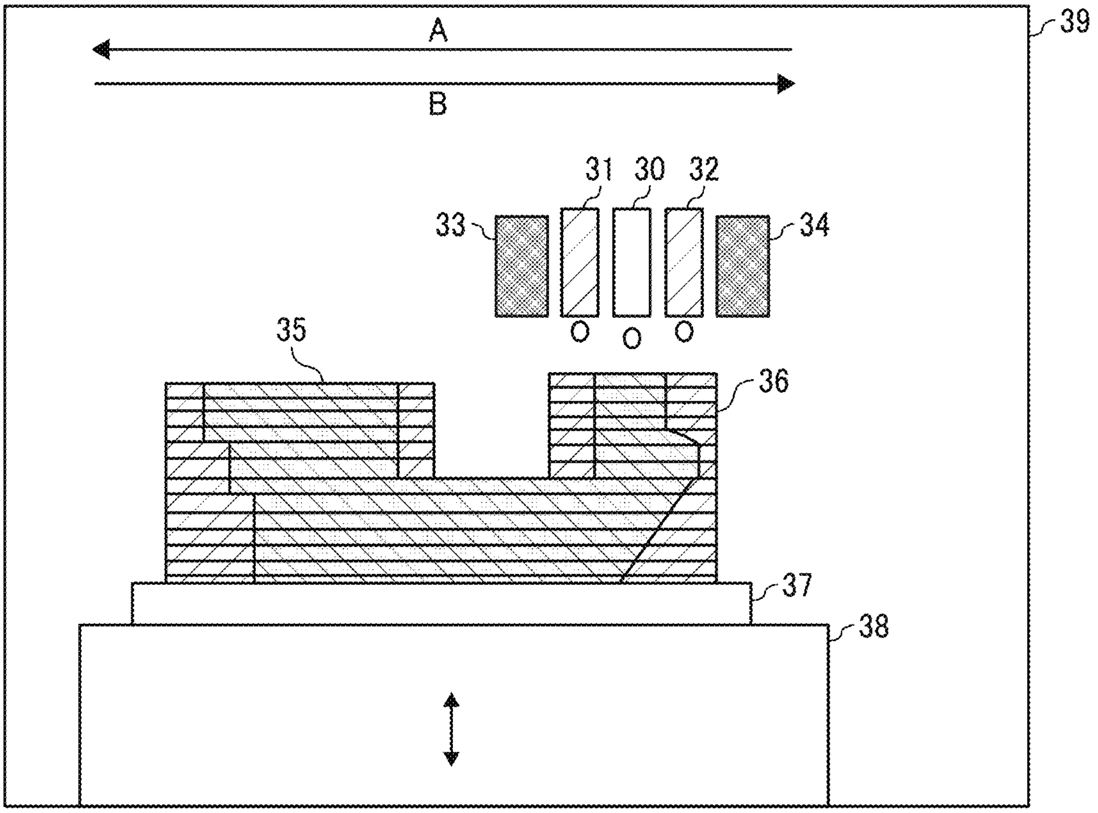
FIG. 2 is a schematic view of a three-dimensional object producing apparatus of the present disclosure.
Figure 3A:
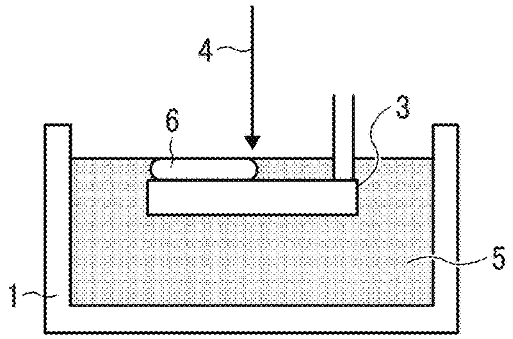
FIG. 3A is a schematic diagram for explaining a three-dimensional object producing method using a curable water-based composition of the present disclosure.
Figure 3B:
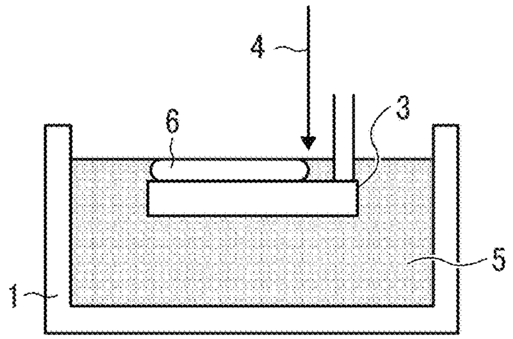
FIG. 3B is a schematic diagram for explaining a three-dimensional object producing method using a curable water-based composition of the present disclosure.
Figure 3C:
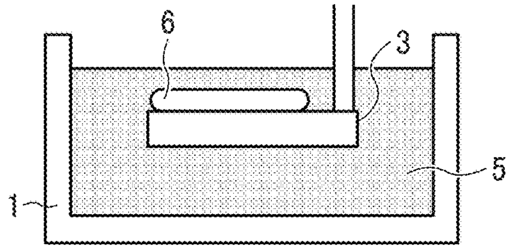
FIG. 3C is a schematic diagram for explaining a three-dimensional object producing method using a curable water-based composition of the present disclosure.
Figure 3D:
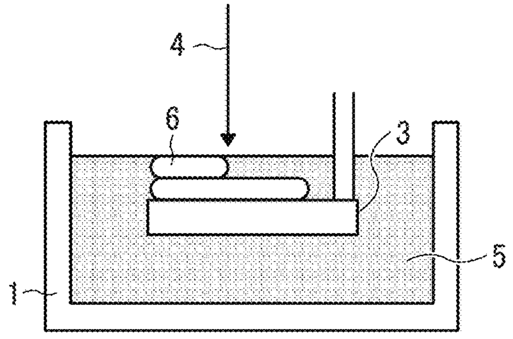
FIG. 3D is a schematic view diagram for explaining a three-dimensional object producing method using a curable water-based composition of the present disclosure.

Furthermore, the curable water-based composition of the present disclosure can be used as an ink to form two-dimensional texts, images, and designed coating film on various substrates and in addition as a solid object forming material to form a three-dimensional object. This three dimensional object forming material may also be used as a binder for powder particles used in a powder layer laminating method of forming a three-dimensional object by repeating curing and layer-forming of powder layers, and as a three-dimensional object constituent material (a model material) and a supporting member (a support material) used in an additive manufacturing method (a stereolithography method) as illustrated in FIG. 2, FIG. 3A, FIG. 3B, FIG. 3C, and FIG. 3D. FIG. 2 is a diagram illustrating a method of additive manufacturing to sequentially form layers of the curable water-based composition of the present disclosure one on top of the other by repeating discharging the curable composition to particular areas followed by curing upon irradiation of an active energy ray (to be described in detail below). FIGS. 3A to 3D are each a diagram illustrating a method of additive manufacturing to sequentially form cured layers 6 having respective predetermined forms one on top of the other on a movable stage 3 by irradiating a storing pool (storing part) 1 of the curable water-based composition 5 of the present disclosure with the active energy ray 4.

An apparatus for fabricating a three-dimensional object by the curable water-based composition of the present disclosure is not particularly limited and can be a known apparatus. For example, the apparatus includes a containing device, a supplying device, and a discharging device of the curable water-based composition, and an active energy ray irradiator.

In addition, the present disclosure includes cured materials obtained by curing the curable water-based composition and processed products obtained by processing structures having the cured materials on a substrate. The processed product is fabricated by molding, for example, heat-drawing and punching a cured material or structure having a sheet-like form or film-like form. The processed product is suitable as a product of molding performed after surface-decoration. Examples thereof are gauges or operation panels of vehicles, office machines, electric and electronic machines, and cameras.

The substrate is not particularly limited. It can suitably be selected to a particular application. Examples thereof include paper, thread, fiber, fabrics, leather, metal, plastic, glass, wood, ceramic, or composite materials thereof. Of these, plastic substrates are preferred in terms of processability.

(Active-Energy-Ray-Curable Water-Based Composition)

An active-energy-ray-curable water-based composition of the present disclosure is an active-energy-ray-curable water-based composition containing water, a polymerizable compound (A), and a polymerization initiator (C). The polymerizable compound (A) contains an acrylamide compound (A1) represented by General formula (A1) below, and further contains other components as needed.

General formula (A1)

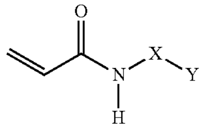

In General formula (A1) above, X represents an alkylene group containing from 1 through 6 carbon atoms, and Y represents a group represented by General formula (A1a) below or General formula (A1b) below.

General formula (A1a)

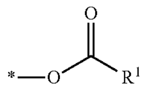

In General formula (A1a), $R^1$ represents an alkyl group containing from 1 through 10 carbon atoms, and * represents a bonding site with X.

General formual (A1b)

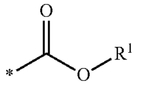

In General formula (A1b), $R^1$ represents an alkyl group containing from 1 through 10 carbon atoms, and * represents a bonding site with X.

The active energy-ray-curable water-based composition of the present disclosure is the same as the curable water-based composition of the present disclosure.

(Active-Energy-Ray-Curable Water-Based Ink)

An active-energy-ray-curable water-based ink of the present disclosure contains either or both of the curable water-based composition of the present disclosure and the active-energy-ray-curable water-based composition of the present disclosure, and further contains other components as needed.

The active-energy-ray-curable water-based ink of the present disclosure can be suitably used exclusively for an inkjet discharging method.

(Stored Container)

A stored container of the present disclosure includes a container, and one or more selected from the curable water-based composition of the present disclosure, the active-energy-ray-curable water-based composition of the present disclosure, and the active-energy-ray-curable water-based ink of the present disclosure. The one or more selected from the curable water-based composition, the active-energy-ray-curable water-based composition, and the active-energy-ray-curable water-based ink are stored in the container.

The stored container of the present disclosure contains the curable water-based composition of the present disclosure and is suitable for the applications as described above.

For example, if the curable water-based composition of the present disclosure is used for ink, a container that stores the ink can be used as an ink cartridge or an ink bottle. Therefore, users can avoid direct contact with the ink during operations such as transfer or replacement of the ink, so that fingers and clothes are prevented from contamination.

Furthermore, inclusion of foreign matters such as dust in the ink can be prevented.

In addition, the container can be of any size, any form, and any material. For example, the container can be designed to a particular application. It is preferable to use a light blocking material to block the light or cover a container with a light blocking sheet, etc.

(Two-Dimensional or Three-Dimensional Image Forming Method and Two-Dimensional or Three-Dimensional Image Forming Apparatus)

A two-dimensional or three-dimensional image forming method of the present disclosure includes an irradiating step of forming a two-dimensional or three-dimensional image through a step of irradiating one or more selected from the curable water-based composition of the present disclosure, the active-energy-ray-curable water-based composition of the present disclosure, and the active-energy-ray-curable water-based ink of the present disclosure with active energy rays, and further includes other steps as needed.

A two-dimensional or three-dimensional image forming apparatus of the present disclosure includes a storing part containing one or more selected from the curable water-based composition of the present disclosure, the active-energy-ray-curable water-based composition of the present disclosure, and the active-energy-ray-curable water-based ink of the present disclosure in a container, and an irradiating unit configured for active energy ray irradiation, and further includes other units as needed.

The same article as the stored container of the present disclosure can be used as the storing part.

The same method as the curing method for the curable water-based composition of the present disclosure can be applied to the irradiating unit. It is preferable that the irradiating unit use ultraviolet rays having a peak in the wavelength range of from 365 nm through 405 nm as the active energy rays.

(Three-Dimensional Object Producing Method and Three-Dimensional Object Producing Apparatus)

A three-dimensional object producing method of the present disclosure includes an object forming step of forming a three-dimensional object using the curable water-based composition of the present disclosure, and further includes other steps as needed.

It is preferable to perform the object forming step using a three-dimensional printer. However, the object forming step may be performed using a molding die.

The three-dimensional object producing method of the present disclosure laminates layers and forms an object by repeating a film forming step of applying the curable water-based composition of the present disclosure to form a film and a curing step of curing the film formed in the film forming step to form a layer.

The three-dimensional object producing apparatus of the present disclosure includes a film forming unit configured to apply the curable water-based composition of the present disclosure to form a film and a curing unit configured to cure the film formed by the film forming unit to form a layer, and laminates layers and forms an object.

The three-dimensional object producing method of the present disclosure may use, for example, active energy rays and heating.

The three-dimensional object producing method includes an irradiating step for active energy ray irradiation in order to cure the curable water-based composition of the present disclosure with active energy rays. The three-dimensional object producing apparatus of the present disclosure includes an irradiating unit configured for active energy ray irradiation and a storing part storing the curable water-based composition of the present disclosure. The container may be accommodated in the storing part.

Furthermore, the method and the apparatus may respectively include a discharging step and a discharging device to discharge the curable water-based composition of the present disclosure.

The method of discharging the curable composition is not particularly limited, and examples thereof include a continuous jetting method and an on-demand method. The on-demand method includes a piezo method, a thermal method, an electrostatic method, etc.

FIG. 1 is a diagram illustrating an example of a three-dimensional image forming apparatus equipped with an inkjet discharging device. Printing units 23*a*, 23*b*, 23*c*, and 23*d* respectively having ink cartridges and discharging heads for yellow, magenta, cyan, and black active-energy-ray-curable inks discharge the inks onto a recording medium 22 fed from a supplying roller 21. Thereafter, light sources 24*a*, 24*b*, 24*c*, and 24*d* configured to cure the inks emit active energy rays to the inks, thereby curing the inks to form a color image. Thereafter, the recording medium 22 is conveyed to a processing unit 25 and a printed matter reeling roll 26. Each of the printing unit 23*a*, 23*b*, 23*c* and 23*d* may have a heating mechanism to liquidize the ink at the ink discharging portion. Moreover, in another embodiment of the present disclosure, a mechanism may optionally be included to cool down the recording medium to around room temperature in a contact or non-contact manner. In addition, the inkjet recording method may be either of serial methods or line methods. The serial methods include discharging an ink onto a recording medium by moving the head while the recording medium intermittently moves according to the width of a discharging head. The line methods include discharging an ink onto a recording medium from a discharging head held at a fixed position while the recording medium continuously moves.

The recording medium 22 is not particularly limited. Specific examples thereof include, but are not limited to, paper, film, metal, or complex materials thereof. The recording medium 22 takes a sheet-like form but is not limited thereto. The image forming apparatus may have a one-side printing configuration and/or a two-side printing configuration.

Optionally, multiple colors can be printed with no or weak active energy ray from the light sources 24*a*, 24*b*, and 24*c* followed by irradiation of the active energy ray from the light source 24*d*. As a result, energy and cost can be saved.

The recorded matter having images printed with the ink used in the present disclosure includes articles having printed images or texts on a plain surface of conventional paper, resin film, etc., a rough surface, or a surface made of various materials such as metal or ceramic.

In addition, by laminating layers of images in part or the entire of a recording medium, a partially stereoscopic image (formed of two dimensional part and three-dimensional part) and a three dimensional object can be fabricated.

FIG. 2 is a schematic view illustrating an example of the three-dimensional object producing apparatus of the present disclosure. The three-dimensional object producing apparatus 39 illustrated in FIG. 2 sequentially forms support layers and object layers and produces a three-dimensional object 35 by repeating multiple times, a step of forming a first object layer by discharging a first composition from an ejection head unit 30 for additive manufacturing and discharging a first composition from ejection head units 31 and 32 for support, using a head unit having inkjet heads arranged movable in the directions indicated by the arrows A and B and irradiating and solidifying the compositions with active energy rays, while lowering a stage 38 movable in the vertical direction according to the number of times to laminate layers. Thereafter, an additive manufacturing support 36 is removed, if desired. Although only a single ejection head unit 30 for additive manufacturing is provided to the three-dimensional object producing apparatus illustrated in FIG. 2, it can have two or more units 30. In FIG. 2, reference numerals 33 and 34 denote ultraviolet irradiators, and a reference numeral 37 denotes a three-dimensional object support 37.

(Cured Product)

A cured product of the present disclosure contains a reaction product of an acrylamide compound (A1) represented by General formula (A1) below with an acrylamide compound (B1) represented by General formula (B1) below, the acrylamide compound represented by General formula (A2-1) below, or the acrylamide compound (A2) represented by General formula (A2-2) below, and further contains other components as needed. For the acrylamide compound (A1), the acrylamide compound (B1), and the acrylamide compound (A2), the matters described in relation with the acrylamide compound (A1), the acrylamide compound (B1), and the acrylamide compound (A2) of the curable water-based composition may be appropriately selected.

General formula (A1)

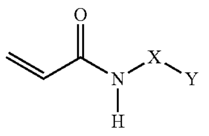

In General formula (A1), X represents an alkylene group containing from 1 through 6 carbon atoms, and Y represents a group represented by General formula (A1a) below or General formula (A1b) below.

General formula (A1a)

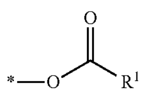

In General formula (A1a), $R^1$ represents an alkyl group containing from 1 through 10 carbon atoms, and * represents a bonding site with X.

General formula (A1b)

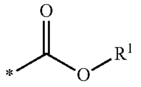

In General formula (A1b), $R^1$ represents an alkyl group containing from 1 through 10 carbon atoms, and * represents a bonding site with X.

General formula (B1)

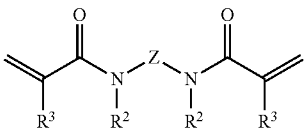

In General formula (B1), $R^2$ represents a hydrogen atom or an alkyl group containing from 1 through 4 carbon atoms and may have a branched structure, $R^1$ represents a hydrogen atom or a methyl group, Z represents an alkylene group containing from 1 through 30 carbon atoms or a group obtained by substituting oxygen, nitrogen, and sulfur atoms for some of the carbon atoms of the alkylene group containing from 1 through 30 carbon atoms, and may contain a polar functional group, a (meth)acrylate group, or a (meth) acrylamide group as a substituent.

General formula (A2-1)

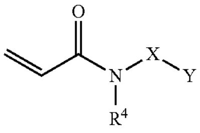

In General formula (A2-1), $R^4$ represents an alkyl group containing from 1 through 6 carbon atoms, X represents an alkylene group containing from 1 through 6 carbon atoms, and Y represents a group represented by General formula (A2a-1) below or General formula (A2b-1) below.

General formula (A2a-1)

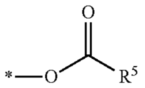

In General formula (A2a-1), $R^5$ represents an alkyl group containing from 1 through carbon atoms and * represents a bonding site with X.

General formula (A2b-1)

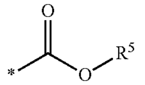

In General formula (A2b-1), $R^5$ represents an alkyl group containing from 1 through 10 carbon atoms, and * represents a bonding site with X.

General formula (A2-2)

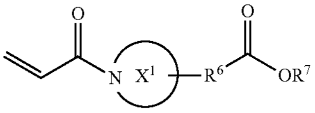

In General formula (A2-2), the ring $X^1$ represents a nitrogen atom-containing ring structure containing from 2 through 5 carbon atoms, $R^6$ represents a single bond or an alkylene group containing from 1 through 3 carbon atoms, and $R^7$ represents a straight-chained or branched alkyl group containing from 1 through 10 carbon atoms.

The method for analyzing the monomers constituting the reaction product contained in the cured product of the present disclosure is not particularly limited and may be appropriately selected depending on the intended purpose. Examples of the method include, but are not limited to, a method of decomposing the cured product using supercritical methanol and then analyzing the decomposed product by, for example, GC-MS.

It is preferable that the cured product of the present disclosure contain water.

The content of the water is preferably 10% by mass or greater but 80% by mass or less and more preferably 30% by mass or greater but 60% by mass or less relative to the total mass of the cured product of the present disclosure.

The method for measuring the content of the water is not particularly limited and may be appropriately selected depending on the intended purpose. Examples of the method include, but are not limited to, a method of drying a sample in a vacuum to an absolute dry condition and calculating a value represented by (weight of saturated swollen body-weight of absolute dry body)/(weight of saturated swollen body)×100.

(Decorated Body)

A decorated body of the present disclosure includes a base material and a surface decoration on the base material, the surface decoration being formed of the cured product of the present disclosure, and further includes other members as needed.

The base material is not particularly limited. It can suitably be selected to a particular application. Examples thereof include paper, thread, fiber, fabrics, leather, metal, plastic, glass, wood, ceramic, or composite materials thereof.

(Organ Model)

An organ model of the present disclosure is formed of the cured product of the curable water-based composition of the present disclosure.

The organ model of the present disclosure can be applied to previous simulations for medical operations of living bodies and to substitutes for living bodies (for example, cartilages and vitreous bodies of eyeballs). The organ model has a complicated and precise structure, and hardness of the organ model in an object can be controlled freely.

(Cell Culture Medium)

A cell culture medium of the present disclosure is formed of the cured product of the curable water-based composition of the present disclosure.

(Medical Member)

A medical member of the present disclosure is formed of the cured product of the curable water-based composition of the present disclosure.

Examples of the medical member include, but are not limited to, a sustained drug release gel, a transdermal absorption gel, contact lenses, and a radiation treatment bolus.

EXAMPLES

The present disclosure will be described below by way of Examples. The present disclosure should not be construed as being limited to these Examples.

Acrylamide compounds represented by General formulae (A1) to (A2-1-1) were synthesized by the methods described in Synthesis examples 1 to 11.

The synthesized acrylamide compounds were identified by nuclear magnetic resonance spectrometry (instrument used: obtained from JEOL Ltd., "JNM-ECX500"), and the purity was measured by a gas chromatograph method (instrument used; obtained from Shimadzu Corporation. "GCMS-QP2010 PLUS"). These chemical analyses were performed by a routine method.

Polymerization initiators C-1 to C-6 were water-insoluble and polymerization initiators C-7 to C-9 were water-soluble.

TABLE 1-1

| | Abbreviation | Compound name or structure | Manufacturer name and product name |
|---|---|---|---|
| Secondary acrylamide compound (A1) | A1-1 | 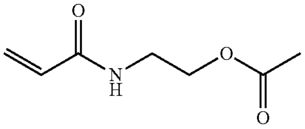 | (see Synthesis example 1) SI = 1.40 |
| | A1-2 | 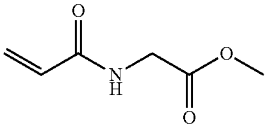 | (see Synthesis example 2) SI = 1.01 |
| | A1-3 | 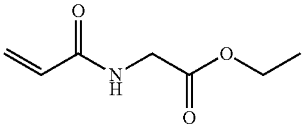 | (see Synthesis example 3) SI = 1.21 |
| | A1-4 | 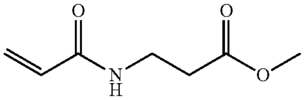 | (see Synthesis example 4) SI = 1.36 |
| | A1-5 | 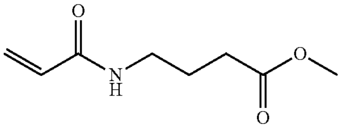 | (see Synthesis example 5) SI = 1.45 |
| | A1-6 | 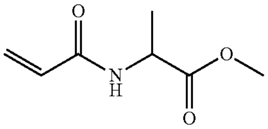 | (see Synthesis example 6) SI = 1.37 |
| Tertiary acrylamide compound (A2) | A2-1 | 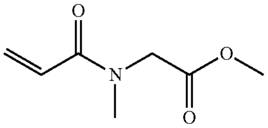 | (see Synthesis example 7) SI = 1.00 |
| | A2-2 | 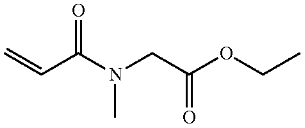 | (see Synthesis example 8) SI = 1.02 |
| | A2-3 | 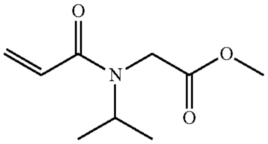 | (see Synthesis example 9) SI = 1.05 |

TABLE 1-1-continued

| | Abbreviation | Compound name or structure | Manufacturer name and product name |
|---|---|---|---|
| | A2-4 | 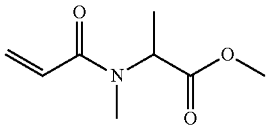 | (see Synthesis example 10)<br>SI = 1.12 |
| | A2-5 | 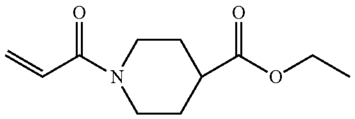 | (see Synthesis example 10)<br>SI = 1.70 |
| Mono-functional poly-mesizable compound (A3) | A3-1 | 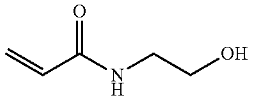 | “2-Hydroxyethyl acrylamide” obtained from KJ Chemicals Corporation |
| | A3-2 | 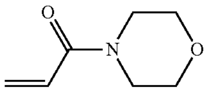 | “Acryloylmorpholine” obtained from KJ Chemicals Corporation |

TABLE 1-2

| | Abbre-viation | Compound name or structure | Manufacturer name and product name |
|---|---|---|---|
| Bifunctional or higher acrylamide compound (B1) | B1-1 | 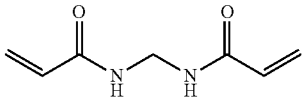 | Reagent obtained from Tokyo Chemical Industry Co., Ltd. (product No. M2877)<br>SI = 1.08 |
| | B1-2 | 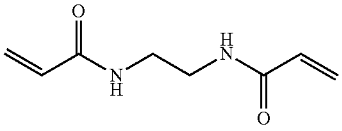 | Reagent obtained from Tokyo Chemical Industry Co., Ltd. (product No. E1086)<br>SI = 1.23 |
| | B1-3 | 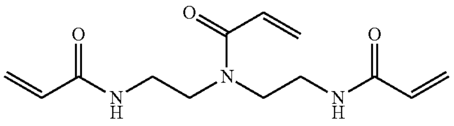 [SMILES: C=CC(=O)NCCN(CCNC(=O)C=C)C(=O)C=C] | “FOM-03007” obtained from FUJIFILM Corporation<br>SI = 1.44 |
| | B1-4 | 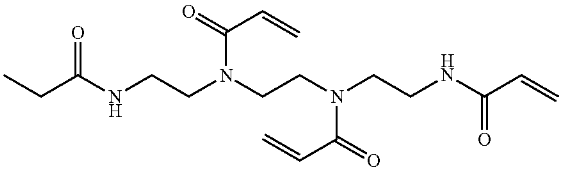 [SMILES: C=CC(=O)NCCN(CCN(CCNC(=O)CC)C(=O)C=C)C(=O)C=C] | “FOM-03009” obtained from FUJIFILM Corporation<br>SI = 1.52 |
| Multi-functional poly-merizable compound (B2) | B2-1 | 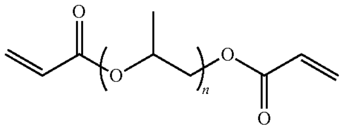 n = 12 | “APG-700” obtained from Shin-Nakamura Chemical Co., Ltd.<br>SI = 1.15 |

TABLE 1-2-continued

| Abbre-viation | Compound name or structure | Manufacturer name and product name |
|---|---|---|
| B2-2 | 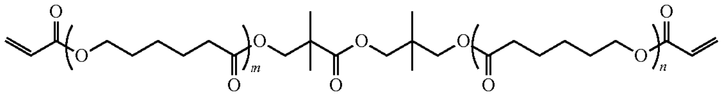 | "HX-620" obtained from Nippon Kayaku Co., Ltd. SI = 0.92 |
| B2-3 | 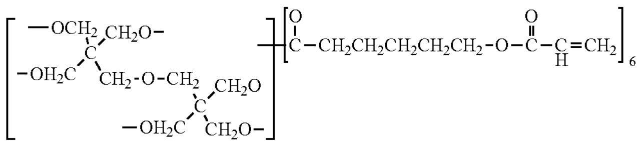 | "DPCA-60" obtained from Nippon Kayaku Co., Ltd. SI = 1.40 |

TABLE 1-3

| | Abbreviation | Compound name or structure | Manufacturer name and product name |
|---|---|---|---|
| Poly-merization initiator (C) | C-1 | 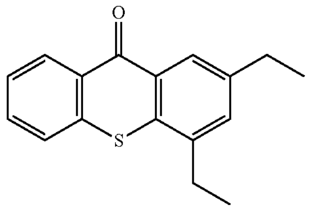 [SMILES: CCc1cc(CC)c2sc3ccccc3c(=O)c2c1] | "DETX-S" obtained from Nippon Kayaki Co., Ltd. |
| | C-2 | 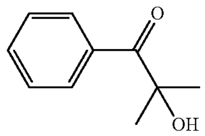 | "IRGACURE 1173" obtained from BASF Japan Ltd. |
| | C-3 | 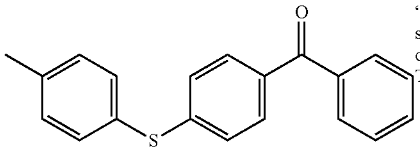 | "4-Benzoyl4'-methyldiphenyl sulfide (BMS)" obtained from Tokyo Chemical Industry Co., Ltd. |
| | C-4 | Polyethylene glycol di(beta-4-[4-(2-dimethylamino-2-benzyl)butaonylphenyl] piperazine)propionate | "OMNIPOL 910" obtained from IGM |
| | C-5 | Bis(2,4,6-trimethylbenzoyl) phenylphosphine oxide | "IRGACURE 819" obtained from BASF Japan Ltd. |
| | C-6 | 2,4,6-Trimethylbenzoyl-diphenyl phosphine oxide | "IRGAOURE TPO" obtained from BASF Japan Ltd. |
| | C-7 | 2-Hydroxy-4'-(2-bydroxyethoxy) 2-methyl propiophenone | "IRGACURE 2959" obtained from BASF Japan Ltd. |
| | C-8 | Thioxanthone ammonium salt | "QUANTACURE QTX" obtained from Shell Chemicals |
| | C-9 | Benzophenons ammonium salt | "QUANTACURE ABQ" obtained from Shell Chemicals |

TABLE 1-4

| | Abbre-viation | Compound name or structure | Manufacturer name and product name |
|---|---|---|---|
| Hydrogen donor (D) | D-1 | 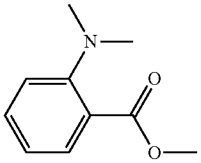 | "Methyl N,N-dimethyl anthranilate" obtained from Tokyo Chemical Industry Co., Ltd. |
| | D-2 | 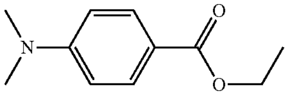 | "Ethyl p-dimethyl-aminobenzoate" obtained from Tokyo Chemical Industry Co., Ltd. |
| | D-3 | 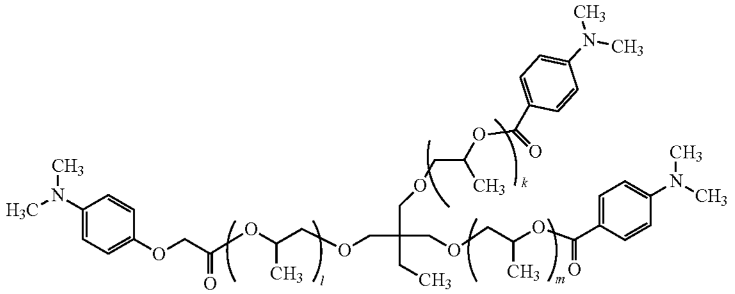 | "SPEEDCURE 7040" obtained from Lambson Limited |
| Other com-ponents | Polymer-ization inhibitor | 4-Methoxyphenol | "Methoquinone" obtained from Seiko Chemical Co., Ltd. |
| | Humec-tant | Glycerin | obtained from Sakamoto Yakuhin Kogyo Co., Ltd. |
| | Surfac-tant | Silicone-based surfactant | "BYK-UV3510" obtained from Byk Chemie Japan K.K. |

Synthesis Example 1

Synthesis of N-acetoxyethyl-N-acrylamide (A1-1)

2-Acetoxyethylamine (obtained from Tokyo Chemical Industry Co., Ltd., a reagent) (0.30 moles), potassium carbonate (obtained from Kanto Chemical Co., Inc., a reagent) (0.45 moles), and water (400 mL) were stirred and mixed at from 0 degrees C. through 10 degrees C. With the temperature maintained, acrylic acid chloride (obtained from Wako Pure Chemical Industries, Ltd., a reagent) (0.33 moles) was slowly dropped into the resultant. After dropping was completed, the resultant was extracted with ethyl acetate (obtained from Kanto Chemical Co., Ltd., a reagent) (400 mL) three times, and the resultant including the ethyl acetate layer was washed with water (400 mL) once. Ethyl acetate was evaporated from the resultant at reduced pressure at 40 degrees C., to obtain intended N-acetoxyethyl-N-acrylamide (A1-1) (0.20 moles) as an almost clear colorless liquid. The purity thereof was 98.3% by mass.

Synthesis Example 2

Synthesis of N-acryloylglycine methyl ester (A1-2)

Glycinemethyl ester hydrochloride (obtained from Sigma-Aldrich Japan, a reagent) (0.30 moles), potassium carbonate (obtained from Kanto Chemical Co., Ltd., a reagent) (0.45 moles), and water (400 mL) were stirred and mixed at from 0 degrees C. through 10 degrees C. With the temperature maintained, acrylic acid chloride (obtained from Wako Pure Chemical Industries, Ltd., a reagent) (0.33 moles) was slowly dropped into the resultant. After dropping was completed, the resultant was extracted with ethyl acetate (obtained from Kanto Chemical Co., Ltd., a reagent) (400 mL) three times, and the resultant including the ethyl acetate layer was washed with water (400 mL) once. Ethyl acetate was evaporated from the resultant at reduced pressure at 40 degrees C. to obtain intended N-acryloylglycine methyl ester (A1-2) (0.20 moles) as an almost clear colorless liquid. The purity thereof was 99.3% by mass.

Synthesis Example 3

Synthesis of N-acryloylglycine ethyl ester (A1-3)

Intended N-acryloylglycine ethyl ester (A1-3) (0.22 moles) was obtained as an almost clear colorless liquid in the same manner as in Synthesis example 2, except that unlike in Synthesis example 2, glycine methyl ester hydrochloride was changed to glycine ethyl ester hydrochloride (obtained from Tokyo Chemical Industry Co., Ltd., a reagent). The purity was 98.5% by mass.

Synthesis Example 4

Synthesis of N-acryloyl-β-alaninemethyl ester (A1-4)

Intended N-acryloyl-β-alaninemethyl ester (A1-4) (0.20 moles) was obtained as almost clear colorless liquid in the same manner as in Synthesis example 2, except that unlike in Synthesis example 2, glycinemethyl ester hydrochloride was changed to β-alaninemethyl ester hydrochloride (obtained from Tokyo Chemical Industry Co., Ltd., a reagent). The purity was 97.9% by mass.

Synthesis Example 5

Synthesis of N-acryloyl-4-butyric acid methyl ester (A1-5)

Intended N-acryloyl-4-butyric acid methyl ester (A1-5) (0.23 moles) was obtained as almost clear colorless liquid in the same manner as in Synthesis example 2, except that unlike in Synthesis example 2, glycinemethyl ester hydrochloride was changed to 4-amino butyric acid methyl ester hydrochloride (obtained from Tokyo Chemical Industry Co., Ltd., a reagent). The purity was 98.1% by mass.

Synthesis Example 6

Synthesis of N-acryloyl alaninemethyl ester (A1-6)

Intended N-acryloyl alaninemethyl ester (A1-6) (0.20 moles) was obtained as almost clear colorless liquid in the same manner as in Synthesis example 2, except that unlike in Synthesis example 2, glycinemethyl ester hydrochloride was changed to alaninemethyl ester hydrochloride (obtained from Tokyo Chemical Industry Co., Ltd., a reagent). The purity was 99.2% by mass.

Synthesis Example 7

Synthesis of N-acryloyl-N-methyl glycine methyl ester (A2-1)

N-methylglycine methyl ester hydrochloride (obtained from Sigma-Aldrich Japan, a reagent) (0.30 moles), potassium carbonate (obtained from Kanto Chemical Co., Ltd., a reagent) (0.45 moles), and water (400 mL) were stirred and mixed at from 0 degrees C. through 10 degrees C. With the temperature maintained, acrylic acid chloride (obtained from Wako Pure Chemical Industries, Ltd., a reagent) (0.33 moles) was slowly dropped into the resultant. After dropping was completed, the resultant was extracted with ethyl acetate (obtained from Kanto Chemical Co., Ltd., a reagent) (400 mL) three times, and the resultant including the ethyl acetate layer was washed with water (400 mL) once. Ethyl acetate was evaporated from the resultant at reduced pressure at 40 degrees C., to obtain intended N-acryloyl-N-methyl glycine methyl ester (A2-1) (0.20 moles) as an almost clear colorless liquid. The purity thereof was 98.3% by mass.

Synthesis Example 8

Synthesis of N-acryloyl-N-methylglycine ethyl ester (A2-2)

Intended N-acryloyl-N-methylglycine ethyl ester (A2-2) (0.22 moles) was obtained as almost clear colorless liquid in the same manner as in Synthesis example 7, except that unlike in Synthesis example 7, N-methylglycine methyl ester hydrochloride was changed to N-methylglycine ethyl ester hydrochloride (obtained from Tokyo Chemical Industry Co., Ltd., a reagent). The purity thereof was 98.5% by mass.

Synthesis Example 9

Synthesis of N-acryloyl-N-isopropyl glycine methyl ester (A2-3)

Intended N-acryloyl-N-isopropyl glycine methyl ester (A2-3) (0.22 moles) was obtained as almost clear colorless liquid in the same manner as in Synthesis example 7, except that unlike in Synthesis example 7. N-methylglycine methyl ester hydrochloride was changed to N-isopropyl glycine methyl ester hydrochloride (obtained from Tokyo Chemical Industry Co., Ltd., a reagent). The purity thereof was 98.5% by mass.

Synthesis Example 10

Synthesis of N-acryloyl-N-methyl alanine methyl ester (A2-4)

Intended N-acryloyl-N-methyl alanine methyl ester (A2-4) (0.22 moles) was obtained as almost clear colorless liquid in the same manner as in Synthesis example 7, except that unlike in Synthesis example 7. N-methylglycine methyl ester hydrochloride was changed to N-methyl alanine methyl ester hydrochloride (obtained from Tokyo Chemical Industry Co., Ltd., a reagent). The purity thereof was 98.5% by mass.

Synthesis Example 11

Synthesis of ethyl N-acryloylpiperidine-4-carboxylate (A2-5)

Intended ethyl N-acryloylpiperidine-4-carboxylate (A2-5) (0.27 moles) was obtained as almost clear colorless liquid in the same manner as in Synthesis example 7, except that unlike in Synthesis example 7, N-methylglycine methyl ester hydrochloride was changed to ethyl piperidine-4-carboxylate (obtained from Tokyo Chemical Industry Co., Ltd., a reagent). The purity thereof was 99.2% by mass.

Example 1

Production of Curable Water-Based Composition 1

Components were mixed uniformly according to the composition and contents presented in Table 2-1. The resultant was filtrated through a membrane filter to remove coarse particles, to produce a curable water-based composition of Example 1.

<Production of Three-Dimensional Object 1>

The prepared curable water-based composition 1 was filled in the inkjet head (obtained from Ricoh Industry Company, Ltd., GEN4) of the three-dimensional object producing apparatus illustrated in FIG. 2, to produce a three-dimensional object.

In the producing method, the curable water-based composition 1 was discharged onto an object forming stage, to form a film. Next, the film was cured by irradiation with a LED lamp head (1.6 W/cm$^2$. Integration Technology LLC, SUBZERO LED060). These applying step and curing step were repeated, to produce a three-dimensional object (cured product, hydrogel) 1 of Example 1 having a size of 100 mm×100 mm×10 mm.

Examples 2 to 30 and Comparative Examples 1 to 10

Curable water-based compositions of Examples 2 to 30 and Comparative Examples 1 to 10 were obtained in the same manner as in Example 1, except that unlike in Example 1, the composition and contents were changed to as presented in Table 2-1 to Table 2-4. Using these curable water-based compositions, three-dimensional objects (cured products) of Examples 2 to 30 and Comparative Examples 1 to 10 were obtained in the same manner as in Example 1.

<Curability>

Judging that a coating film had cured when it had reached a state of no longer feeling stickiness when touched by a finger, an integrated irradiation light quantity needed for curing was measured. The results are presented in Table 2-1 to Table 2-4 below. When the integrated irradiation light quantity needed for curing was 2.0 J/cm$^2$ or lower, the coating film was judged as practically usable. The integrated irradiation light quantity needed for curing was calculated from the light quantity of the LED lamp head of the three-dimensional object producing apparatus.

<Viscosity>

The viscosity was measured with a cone plate rotary viscometer (VISCOMETER TVE-22L, manufactured by TOKI SANGYO CO., LTD.) using a cone rotor (1°34'×R24) at a number of rotation of 50 rpm with a setting of the temperature of hemathermal circulating water at 25 degrees C.

Next, the 80% compressive strain stress of each obtained curable water-based composition and each obtained three-dimensional object (cured product) was measured in the manner described below. The results are presented in Table 2-1 to Table 2-4.

<80% Compressive Strain Stress>

A load cell 1 kN and a compression jig for 1 kN were set on a universal tester (obtained from Shimadzu Corporation, AGS-X), and each obtained three-dimensional object was set. Stress against the compression applied to the load cell was recorded on a computer, and stress vs. displacement was plotted, to measure the 80% compressive strain stress. When the 80% compressive strain stress was 1.20 MPa or greater, the three-dimensional object was practically usable level. The results are presented in Table 2-1 to Table 2-4.

[Evaluation Criteria]

A: The 80% compressive strain stress was 3.0 or greater.

B: The 80% compressive strain stress was 1.2 or greater but 3.0 or less.

C: The 80% compressive strain stress was 0.6 or greater but 1.2 or less.

D: The 80% compressive strain stress was 0.6 or less.

<Evaluation of Swelling Degree>

A three-dimensional object having a disk shape having a diameter of 10 mm and a thickness of 1 mm was produced, and weighed. Subsequently, the three-dimensional object was immersed in distilled water (10 mL) at 25 degrees C. for 5 hours. Subsequently, the three-dimensional object was drained of water and weighed. The swelling degree (%) was calculated by subtracting the mass of a blank, which was the three-dimensional object not immersed in distilled water, from the mass of the three-dimensional object immersed in distilled water and swelled, dividing the obtained difference by the mass of the three-dimensional object before swelled, and multiplying the obtained quotient by 100. The results are presented in Table 2-1 to Table 2-4.

[Evaluation Criteria]

A: The swelling degree was 500% or higher.

B: The swelling degree was 250% or higher but lower than 500%.

C: The swelling degree was 100% or higher but lower than 250%.

D: The swelling degree was lower than 100%.

<Evaluation of Skin Sensitivity>

The stimulation index (SI) value of the curable water-based composition produced in the manner described above was obtained by the LLNA method stipulated by the OECD test guideline 429, and presented in Table 2-1 to Table 2-4. B and A are practically usable levels.

[Evaluation Criteria]

A: The SI value was less than 1.6.

B: The SI value was 1.6 or greater but 3 or less.

C: The SI value was greater than 3 but less than 6.

D: The SI value was 6 or greater.

TABLE 2-1

| | | Ex | | | | | | | | | |
|---|---|---|---|---|---|---|---|---|---|---|---|
| | | 1 | 2 | 3 | 4 | 5 | 6 | 7 | 8 | 9 | 10 |
| Secondary | A1-1 | 30.0 | | | | | | 15.0 | 18.0 | 9.0 | 9.0 |
| acrylamide | A1-2 | | 30.0 | | | | | 15.0 | | | 9.0 |
| compound (A1) | A1-3 | | | 30.0 | | | | | 12.0 | 9.0 | |
| | A1-4 | | | | 30.0 | | | | | 10.0 | |
| | A1-5 | | | | | 30.0 | | | | | 10.0 |
| | A1-6 | | | | | | | | | | |

TABLE 2-1-continued

| | | Ex | | | | | | | | | |
|---|---|---|---|---|---|---|---|---|---|---|---|
| | | 1 | 2 | 3 | 4 | 5 | 6 | 7 | 8 | 9 | 10 |
| Tertiary acrylamide compound (A2) | A2-1 | 4.8 | 4.8 | 4.8 | 4.8 | 4.8 | 4.8 | 4.8 | | | |
| | A2-2 | | | | | | | | 4.8 | | |
| | A2-3 | | | | | | | | | 4.8 | |
| | A2-4 | | | | | | | | | | 4.8 |
| | A2-5 | | | | | | | | | | |
| Monofunctional polymerizable compound (A3) | A3-1 | | | | | | | | | | |
| | A3-2 | | | | | | | | | | |
| Bifunctional or higher acrylamide compound (B1) | B1-1 | 13.0 | | | | 13.0 | | | | 15.0 | |
| | B1-2 | | 13.0 | | | | 13.0 | | | | 15.0 |
| | B1-3 | | | 13.0 | | | | 13.0 | | | |
| | B1-4 | | | | 13.0 | | | | 13.0 | | |
| Multifunctional polymerizable compound (B2) | B2-1 | | | | | | | | | | |
| | B2-2 | | | | | | | | | | |
| | B2-3 | | | | | | | | | | |
| Polymerization initiator (C) | C-1 | | | | | | | | | | |
| | C-2 | | | | | | | | | | |
| | C-3 | | | | | | | | | | |
| | C-4 | | | | | | | | | | |
| | C-5 | | 2.0 | | 2.0 | | 2.0 | | 2.0 | | 2.0 |
| | C-6 | 2.0 | | 2.0 | | 2.0 | | 2.0 | | 2.0 | |
| | C-7 | | | | | | | | | | |
| | C-8 | 5.0 | 5.0 | 5.0 | 5.0 | 5.0 | | | | | |
| | C-9 | | | | | | 5.0 | 5.0 | 5.0 | 5.0 | 5.0 |
| Hydrogen donor (D) | D-1 | 5.0 | 5.0 | 5.0 | 5.0 | 5.0 | | | | | |
| | D-2 | | | | | | 5.0 | 5.0 | 5.0 | | |
| | D-3 | | | | | | | | | 5.0 | 5.0 |
| Water | | 30.0 | 30.0 | 30.0 | 30.0 | 30.0 | 30.0 | 30.0 | 30.0 | 30.0 | 30.0 |
| Other components | Humectant | 10.0 | 10.0 | 10.0 | 10.0 | 10.0 | 10.0 | 10.0 | 10.0 | 10.0 | 10.0 |
| | Polymerization inhibitor | 0.1 | 0.1 | 0.1 | 0.1 | 0.1 | 0.1 | 0.1 | 0.1 | 0.1 | 0.1 |
| | Surfactant | 0.1 | 0.1 | 0.1 | 0.1 | 0.1 | 0.1 | 0.1 | 0.1 | 0.1 | 0.1 |
| Total of components | | 100.0 | 100.0 | 100.0 | 100.0 | 100.0 | 100.0 | 100.0 | 100.0 | 100.0 | 100.0 |
| Total of (A1) + (B1) | | 43.0 | 43.0 | 43.0 | 43.0 | 43.0 | 43.0 | 43.0 | 43.0 | 43.0 | 43.0 |
| Evaluation result | Integrated irradiation light quantity needed for curing ($J/cm^2$) | 0.4 | 0.4 | 0.5 | 0.5 | 0.4 | 0.4 | 0.4 | 0.5 | 0.5 | 0.4 |
| | Viscosity | 22.2 | 21.1 | 24.3 | 20.6 | 20.8 | 22.1 | 24.5 | 21.9 | 22.2 | 23.0 |
| | 80% compressive strain stress | A | A | A | A | A | A | A | A | A | A |
| | Swelling degree | A | A | A | A | A | A | A | A | A | A |
| | Skin sensitivity | A | A | A | A | A | A | A | A | A | A |

TABLE 2-2

| | | Ex | | | | | | | | | |
|---|---|---|---|---|---|---|---|---|---|---|---|
| | | 11 | 12 | 13 | 14 | 15 | 16 | 17 | 18 | 19 | 20 |
| Secondary acrylamide compound (A1) | A1-1 | 30.0 | | | 15.0 | 15.0 | 15.0 | 30.0 | | | |
| | A1-2 | | 30.0 | | | 2.0 | | | | | |
| | A1-3 | | | 30.0 | | | | | 30.0 | | |
| | A1-4 | | | | | | | | | 30.0 | |
| | A1-5 | | | | | | | | | | 30.0 |
| | A1-6 | | | | | | | | | | |
| Tertiary acrylamide compound (A2) | A2-1 | | | | | | 5.0 | 5.0 | | | |
| | A2-2 | | | | | | | | | | |
| | A2-3 | 12.8 | | | 12.8 | | | | 5.0 | | |
| | A2-4 | | 12.8 | | | | | | | 5.0 | |
| | A2-5 | | | 12.8 | | | | | | | 5.0 |
| Monofunctional polymerizable compound (A3) | A3-1 | | | | | | | | | | |
| | A3-2 | | | | | 12.8 | | | | | |
| Bifunctional or higher | B1-1 | 5.0 | | 5.0 | 5.0 | | 7.8 | 12.8 | | | |
| | B1-2 | | 5.0 | | | 5.0 | | | | | |

TABLE 2-2-continued

| | | Ex | | | | | | | | | |
|---|---|---|---|---|---|---|---|---|---|---|---|
| | | 11 | 12 | 13 | 14 | 15 | 16 | 17 | 18 | 19 | 20 |
| acrylamide | B1-3 | | 5.0 | 5.0 | | | | | 12.8 | | |
| compound (B1) | B1-4 | 5.0 | | | 5.0 | 5.0 | | | | 12.8 | 12.8 |
| Multifunctional | B2-1 | | | | | | | | | | |
| polymerizable | B2-2 | | | | | | | | | | |
| compound (B2) | B2-3 | | | | | | | | | | |
| Polymerization | C-1 | | | | | | | | | | |
| initiator (C) | C-2 | | | | | | | | | | |
| | C-3 | | | | | | | | | | |
| | C-4 | | | | | | | | | | |
| | C-5 | | 2.0 | | | | 2.0 | 2.0 | 2.0 | | 2.0 |
| | C-6 | 2.0 | | 2.0 | 2.0 | 2.0 | | | | 2.0 | |
| | C-7 | | | | | | | | | | |
| | C-8 | 5.0 | 5.0 | 5.0 | 5.0 | 3.0 | | | | | |
| | C-9 | | | | | | 5.0 | 5.0 | 5.0 | 5.0 | 5.0 |
| Hydrogen | D-1 | 5.0 | 5.0 | 5.0 | 5.0 | 5.0 | | | | | |
| donor (D) | D-2 | | | | | | 5.0 | 5.0 | 5.0 | | |
| | D-3 | | | | | | | | | 5.0 | 5.0 |
| Water | | 20.0 | 20.0 | 20.0 | 40.0 | 40.0 | 50.0 | 25.0 | 25.0 | 25.0 | 25.0 |
| Other | Humectant | 15.0 | 15.0 | 15.0 | 10.0 | 10.0 | 10.0 | 15.0 | 15.0 | 15.0 | 15.0 |
| components | Polymerization inhibitor | 0.1 | 0.1 | 0.1 | 0.1 | 0.1 | 0.1 | 0.1 | 0.1 | 0.1 | 0.1 |
| | Surfactant | 0.1 | 0.1 | 0.1 | 0.1 | 0.1 | 0.1 | 0.1 | 0.1 | 0.1 | 0.1 |
| Total of components | | 100.0 | 100.0 | 100.0 | 100.0 | 100.0 | 100.0 | 100.0 | 100.0 | 100.0 | 100.0 |
| Total of (A1) + (B1) | | 40.0 | 40.0 | 40.0 | 25.0 | 27.0 | 22.8 | 42.8 | 42.8 | 42.8 | 42.8 |
| Evaluation result | Integrated irradiation light quantity needed for curing (J/cm$^2$) | 0.7 | 0.8 | 0.8 | 2.8 | 1.8 | 2.6 | 1.7 | 1.8 | 1.8 | 1.9 |
| | Viscosity | 23.1 | 20.8 | 23.2 | 8.9 | 10.0 | 7.7 | 15.4 | 14.7 | 16.7 | 15.9 |
| | 80% compressive strain stress | A | B | B | C | B | C | B | B | B | B |
| | Swelling degree | B | A | A | C | B | C | B | A | B | B |
| | Skin sensitivity | A | A | A | A | A | A | A | A | A | A |

TABLE 2-3

| | | Ex | | | | | | | | | |
|---|---|---|---|---|---|---|---|---|---|---|---|
| | | 21 | 22 | 24 | 24 | 25 | 26 | 27 | 28 | 29 | 30 |
| Secondary | A1-1 | 15.0 | | | | | 30.0 | | | | 12.8 |
| acrylamide | A1-2 | | 15.0 | | | | 5.0 | 30.0 | | | |
| compound (A1) | A1-3 | | | 15.0 | | | 12.8 | 5.0 | 30.0 | | |
| | A1-4 | | | | 15.0 | | | 12.8 | 5.0 | 30.0 | |
| | A1-5 | | | | | 15.0 | | | 12.8 | 5.0 | 30.0 |
| | A1-6 | | | | | | | | | 12.8 | 5.0 |
| Tertiary | A2-1 | 15.0 | | | 12.8 | | | | | | |
| acrylamide | A2-2 | | 15.0 | | | 12.8 | | | | | |
| compound (A2) | A2-3 | 12.8 | | 15.0 | | | | | | | |
| | A2-4 | | 12.8 | | 15.0 | | | | | | |
| | A2-5 | | | 12.8 | | 15.0 | | | | | |
| Monofunctional | A3-1 | | | | | | | | | | |
| polymerizable | A3-2 | | | | | | | | | | |
| compound (A3) | | | | | | | | | | | |
| Bifunctional | B1-1 | 5.0 | | | | | | | | | |
| or higher | B1-2 | | 5.0 | | | | | | | | |
| acrylamide | B1-3 | | | 5.0 | | | | | | | |
| compound (B1) | B1-4 | | | | 5.0 | 5.0 | | | | | |
| Multifunctional | B2-1 | | | | | | | | | | |
| polymerizable | B2-2 | | | | | | | | | | |
| compound (B2) | B2-3 | | | | | | | | | | |
| Polymerization | C-1 | | | | | | | | | | |
| initiator (C) | C-2 | | | | | | | | | | |
| | C-3 | | | | | | | | | | |
| | C-4 | | | | | | | | | | |
| | C-5 | | 2.0 | | 2.0 | | 2.0 | | 2.0 | | 2.0 |
| | C-6 | 2.0 | | 2.0 | | 2.0 | | 2.0 | | 2.0 | |
| | C-7 | | | | | | | | | | |
| | C-8 | 5.0 | 5.0 | 5.0 | 5.0 | 5.0 | | | | | |
| | C-9 | | | | | | 5.0 | 5.0 | 5.0 | 5.0 | 5.0 |

TABLE 2-3-continued

| | | Ex | | | | | | | | | |
|---|---|---|---|---|---|---|---|---|---|---|---|
| | | 21 | 22 | 24 | 24 | 25 | 26 | 27 | 28 | 29 | 30 |
| Hydrogen donor (D) | D-1 | 5.0 | 5.0 | 5.0 | 5.0 | 5.0 | | | | | |
| | D-2 | | | | | | 5.0 | 5.0 | 5.0 | | |
| | D-3 | | | | | | | | | 5.0 | 5.0 |
| Water | | 30.0 | 30.0 | 30.0 | 30.0 | 30.0 | 30.0 | 30.0 | 30.0 | 30.0 | 30.0 |
| Other components | Humectant | 10.0 | 10.0 | 10.0 | 10.0 | 10.0 | 10.0 | 10.0 | 10.0 | 10.0 | 10.0 |
| | Polymerization inhibitor | 0.1 | 0.1 | 0.1 | 0.1 | 0.1 | 0.1 | 0.1 | 0.1 | 0.1 | 0.1 |
| | Surfactant | 0.1 | 0.1 | 0.1 | 0.1 | 0.1 | 0.1 | 0.1 | 0.1 | 0.1 | 0.1 |
| Total of components | | 100.0 | 100.0 | 100.0 | 100.0 | 100.0 | 100.0 | 100.0 | 100.0 | 100.0 | 100.0 |
| Total of (A1) + (B1) | | 20.0 | 20.0 | 20.0 | 20.0 | 20.0 | 47.8 | 47.8 | 47.8 | 47.8 | 47.8 |
| Evaluation result | Integrated irradiation light quantity needed for curing (J/cm$^2$) | 1.7 | 1.9 | 2.0 | 1.6 | 1.8 | 3.5 | 3.8 | 3.7 | 3.5 | 4.0 |
| | Viscosity | 23.1 | 20.8 | 23.2 | 22.5 | 24.1 | 23.8 | 22.1 | 21.9 | 22.7 | 23.6 |
| | 80% compressive strain stress | B | B | B | B | B | C | C | C | C | C |
| | Swelling degree | B | B | B | B | B | C | B | C | B | C |
| | Skin sensitivity | A | A | A | A | A | B | B | B | B | B |

TABLE 2-4

| | | Comp. Ex. | | | | | | | | | |
|---|---|---|---|---|---|---|---|---|---|---|---|
| | | 1 | 2 | 3 | 4 | 5 | 6 | 7 | 8 | 9 | 10 |
| Secondary acrylamide compound (A1) | A1-1 | | | | | | | | | | |
| | A1-2 | | | | | | | | | | |
| | A1-3 | | | | | | | | | | |
| | A1-4 | | | | | | | | | | |
| | A1-5 | | | | | | | | | | |
| | A1-6 | | | | | | | | | | |
| Tertiary acrylamide compound (A2) | A2-1 | | | | | | 49.8 | | | | |
| | A2-2 | | | | | | | 49.8 | | | |
| | A2-3 | | | | | | | | | | |
| | A2-4 | | | | | | | | | | |
| | A2-5 | | | | | | | | | | |
| Monofunctional polymerizable compound (A3) | A3-1 | 30.0 | 30.0 | | | 49.8 | | | | | |
| | A3-2 | | | 30.0 | 30.0 | | | | | | |
| Bifunctional or higher acrylamide compound (B1) | B1-1 | | | | | | | | | | |
| | B1-2 | | | | | | | | 49.8 | | |
| | B1-3 | | | | | | | | | 49.8 | |
| | B1-4 | | | | | | | | | | 49.8 |
| Multifunctional polymerizable compound (B2) | B2-1 | 19.8 | | | 19.8 | | | | | | |
| | B2-2 | | 19.8 | | | | | | | | |
| | B2-3 | | | 19.8 | | | | | | | |
| Polymerization initiator (C) | C-1 | 5.0 | | | | | | | | | |
| | C-2 | | 5.0 | | | 5.0 | 5.0 | 5.0 | 5.0 | | |
| | C-3 | | | 5.0 | | | | | | | |
| | C-4 | | | | 5.0 | | | | | | |
| | C-5 | | | | | | | | | 5.0 | |
| | C-6 | | | | | | | | | | 5.0 |
| | C-7 | | | | | | | | | | |
| | C-8 | | | | | | | | | | |
| | C-9 | | | | | | | | | | |
| Hydrogen donor (D) | D-1 | 5.0 | 5.0 | 5.0 | 5.0 | 5.0 | 5.0 | 5.0 | | | |
| | D-2 | | | | | | | | 5.0 | | 5.0 |
| | D-3 | | | | | | | | | 5.0 | |
| Water | | 30.0 | 30.0 | 30.0 | 30.0 | 30.0 | 30.0 | 30.0 | 30.0 | 30.0 | 30.0 |
| Other components | Humectant | 10.0 | 10.0 | 10.0 | 10.0 | 10.0 | 10.0 | 10.0 | 10.0 | 10.0 | 10.0 |
| | Polymerization inhibitor | 0.1 | 0.1 | 0.1 | 0.1 | 0.1 | 0.1 | 0.1 | 0.1 | 0.1 | 0.1 |
| | Surfactant | 0.1 | 0.1 | 0.1 | 0.1 | 0.1 | 0.1 | 0.1 | 0.1 | 0.1 | 0.1 |
| Total of components | | 100.0 | 100.0 | 100.0 | 100.0 | 100.0 | 100.0 | 100.0 | 100.0 | 100.0 | 100.0 |
| Total of (A1) + (B1) | | 0.0 | 0.0 | 0.0 | 0.0 | 0.0 | 0.0 | 0.0 | 49.8 | 49.8 | 49.8 |

TABLE 2-4-continued

| | | Comp. Ex. | | | | | | | | | |
|---|---|---|---|---|---|---|---|---|---|---|---|
| | | 1 | 2 | 3 | 4 | 5 | 6 | 7 | 8 | 9 | 10 |
| Evaluation result | Integrated irradiation light quantity needed for curing (J/$cm^2$) | 5.5 | 4.5 | 4.2 | 3.8 | 1* | 4.8 | 5.5 | 2* | 2* | 2* |
| | Viscosity | 34.9 | 40.5 | 50.6 | 60.9 | 44.4 | 129.8 | 110.5 | — | — | — |
| | 80% compressive strain stress | C | D | C | C | C | B | B | — | — | — |
| | Swelling degree | C | C | C | C | C | D | D | — | — | — |
| | Skin sensitivity | D | D | D | D | B | A | A | — | — | — |

In Table 2-4, "*1" means that the coating film had not cured when the integrated irradiation light quantity became 100 J/$cm^2$, and "*2" means that the coating film failed to cure because the composition was not uniform.

In Table 2-4, "-" means that the properties concerned were unmeasurable.

From the results of Table 2-1 to Table 2-4, the 80% compressive strain stress and the swelling degree of the three-dimensional objects of Examples 1 to 30 were greater than those of the three-dimensional objects of Comparative Examples 1 to 10.

Aspects of the present disclosure are, for example, as follows.

<1> A curable water-based composition, including:

water;

a polymerizable compound (A); and a polymerization initiator (C), wherein the polymerizable compound (A) contains an acrylamide compound (A1) represented by General formula (A1) below, General formula (A1)

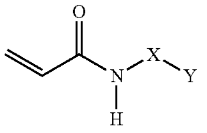

where in the General formula (A1), X represents an alkylene group containing from 1 through 6 carbon atoms, and Y represents a group represented by General formula (A1a) below or General formula (A1b) below, General formula (A1a)

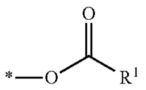

where in the General formula (A1a), $R^1$ represents an alkyl group containing from 1 through 10 carbon atoms, and * represents a bonding site with X, General formula (A1b)

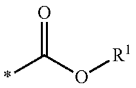

where in the General formula (A1b), $R^1$ represents an alkyl group containing from 1 through 10 carbon atoms, and * represents a bonding site with X.

<2> The curable water-based composition according to <1>, wherein the polymerizable compound (A) contains an acrylamide compound in which Y is a group represented by the General formula (A1b), and $R^1$ is an alkyl group containing 1 or 2 carbon atoms.

<3> The curable water-based composition according to <1> or <2>, wherein the polymerizable compound (A) further contains an acrylamide compound (B1) represented by General formula (B1) below, General formula (B1)

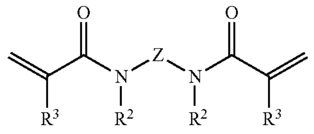

wherein in the General formula (B1), $R^2$ represents a hydrogen atom or an alkyl group containing from 1 through 4 carbon atoms and may have a branched structure, $R^3$ represents a hydrogen atom or a methyl group, and Z represents an alkylene group containing from 1 through 30 carbon atoms or a group obtained by substituting oxygen, nitrogen, and sulfur atoms for some of the carbon atoms of the alkylene group containing from 1 through 30 carbon atoms and may contain a polar functional group, a (meth)acrylate group, or a (meth)acrylamide group as a substituent.

<4> The curable water-based composition according to <3>, wherein a total amount of the acrylamide compound (A1) and the acrylamide compound (B1) is 30% by mass or greater relative to a total amount of the curable water-based composition.

<5> The curable water-based composition according to any one of <1> to <4>, wherein the polymerizable compound (A) further contains an acrylamide compound (A2) represented by General formula (A2-1) below or General formula (A2-2) below, General formula (A2-1)

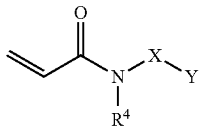

where in the General formula (A2-1), $R^4$ represents an alkyl group containing from 1 through 6 carbon atoms, X represents an alkylene group containing from 1 through 6 carbon atoms, and Y represents a group represented by General formula (A2a-1) below or General formula (A2b-1) below, General formula (A2a-1)

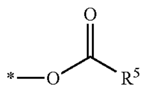

where in the General formula (A2a-1), $R^5$ represents an alkyl group containing from 1 through 10 carbon atoms, and * represents a bonding site with X, General formula (A2b-1)

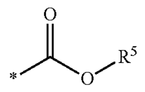

where in the General formula (A2b-1), $R^5$ represents an alkyl group containing from 1 through 10 carbon atoms, and * represents a bonding site with X, General formula (A2-2)

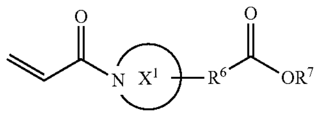

where in the General formula (A2-2), a ring $X^1$ represents a nitrogen atom-containing ring structure containing from 2 through 5 carbon atoms, $R^6$ represents a single bond or an alkylene group containing from 1 through 3 carbon atoms, and $R^7$ represents a straight-chained or branched alkyl group containing from 1 through 10 carbon atoms.

<6> The curable water-based composition according to any one of <1> to <5>, wherein a viscosity of the curable water-based composition is 30 mPa·s or lower.

<7> The curable water-based composition according to any one of <1> to <6>, wherein the polymerization initiator (C) is a radical polymerization initiator and is water-soluble.

<8> The curable water-based composition according to any one of <1> to <7>, further including a hydrogen donor (D).

<9> The curable water-based composition according to any one of <1> to <8>, further including a pigment.

<10> The curable water-based composition according to any one of <1> to <9>, wherein an amount of the water is 10% by mass or greater but 50% by mass or less relative to a total amount of the curable water-based composition.

<11> An active-energy-ray-curable water-based composition, including:

water;

a polymerizable compound (A); and a polymerization initiator (C), wherein the polymerizable compound (A) contains an acrylamide compound (A1) represented by General formula (A1) below, General formula (A1)

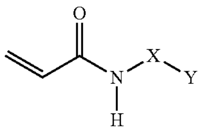

where in the General formula (A), X represents an alkylene group containing from 1 through 6 carbon atoms, and Y represents a group represented by General formula (A1a) below or General formula (A1b) below, General formula (A1a)

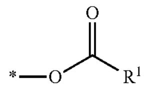

where in the General formula (A1a), $R^1$ represents an alkyl group containing from 1 through 10 carbon atoms, and * represents a bonding site with X, General formula (A1b)

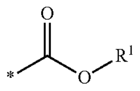

where in the General formula (A1b), $R^1$ represents an alkyl group containing from 1 through 10 carbon atoms, and * represents a bonding site with X.

<12> An active-energy-ray-curable water-based ink, including either or both of the curable water-based composition according to any one of <1> to <10> and the active-energy-ray-curable water-based composition according to <11>.

<13> The active-energy-ray-curable water-based ink according to <12>, wherein the active-energy-ray-curable water-based ink is for inkjet.

<14> A stored container, including:

a container; and one or more selected from the curable water-based composition according to any one of <1> to <10>, the active-energy-ray-curable water-based composition according to <11>, and the active-energy-ray-curable water-based ink according to <12> or <13>, wherein the one or more selected from the curable water-based composition, the active-energy-ray-curable water-based composition, and the active-energy-ray-curable water-based ink is stored in the container.

<15> A two-dimensional or three-dimensional image forming apparatus, including:

the stored container according to <14>; and an irradiating unit configured for active energy ray irradiation.

<16> The two-dimensional or three-dimensional image forming apparatus according to <15>, wherein the irradiating unit configured for active energy ray irradiation is a UV-LED configured for irradiation with ultraviolet rays having a peak in a wavelength range of from 365 nm through 405 nm.

<17> A two-dimensional or three-dimensional image forming method, including irradiating one or more selected from the curable water-based composition according to any one of <1> to <10>, the active-energy-ray-curable water-based composition according to <11>, and the active-energy-ray-curable water-based ink according to <12> or <13> with active energy rays to form a two-dimensional or three-dimensional image.

<18> The two-dimensional or three-dimensional image forming method according to <17>, wherein the active energy rays are ultraviolet rays having a peak in a wavelength range of from 365 nm through 405 nm.

<19> A cured product, including a reaction product of an acrylamide compound (A1) represented by General formula (A1) below with an acrylamide compound (B1) represented by General formula (B1) below or an acrylamide compound (A2) represented by General formula (A2-1) below or General formula (A2-2) below, General formula (A1)

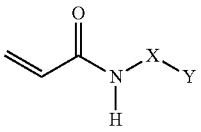

where in the General formula (A1), X represents an alkylene group containing from 1 through 6 carbon atoms, and Y represents a group represented by General formula (A1a) below or General formula (A1b) below, General formula (A1a)

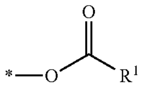

where in the General formula (A1a), $R^1$ represents an alkyl group containing from 1 through 10 carbon atoms, and * represents a bonding site with X, General formula (A1b)

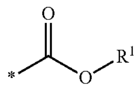

where in the General formula (A1b), $R^1$ represents an alkyl group containing from 1 through 10 carbon atoms, and * represents a bonding site with X, General formula (B1)

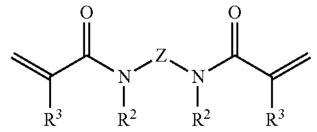

where in the General formula (B1), $R^2$ represents a hydrogen atom or an alkyl group containing from 1 through 4 carbon atoms and may have a branched structure, $R^3$ represents a hydrogen atom or a methyl group, and Z represents an alkylene group containing from 1 through 30 carbon atoms or a group obtained by substituting oxygen, nitrogen, and sulfur atoms for some of the carbon atoms of the alkylene group containing from 1 through 30 carbon atoms and may contain a polar functional group, a (meth)acrylate group, or a (meth)acrylamide group as a substituent, General formula (A2-1)

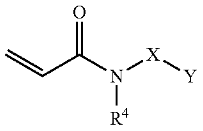

where in the General formula (A2-1), $R^4$ represents an alkyl group containing from 1 through 6 carbon atoms, X represents an alkylene group containing from 1 through 6 carbon atoms, and Y represents a group represented by General formula (A2a-1) below or General formula (A2b-1) below, General formula (A2a-1)

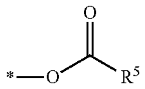

where in the General formula (A2a-1), $R^5$ represents an alkyl group containing from 1 through 10 carbon atoms, and * represents a bonding site with X, General formula (A2b-1)

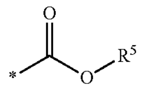

where in the General formula (A2b-1), $R^5$ represents an alkyl group containing from 1 through 10 carbon atoms, and * represents a bonding site with X, General formula (A2-2)

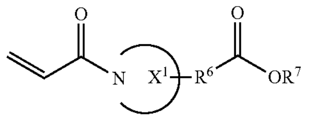

where in the General formula (A2-2), a ring $X^1$ represents a nitrogen atom-containing ring structure containing from 2 through 5 carbon atoms, $R^6$ represents a single bond or an alkylene group containing from 1 through 3 carbon atoms, and $R^7$ represents a straight-chained or branched alkyl group containing from 1 through 10 carbon atoms.

<20> A decorated body, including:

a base material: and a surface decoration on the base material, the surface decoration being formed of the cured product according to <19>.

The curable water-based composition according to any one of <1> to <9>, the active-energy-ray-curable water-based composition according to <11>, the active-energy-ray-curable water-based ink according to <12> or <13>, the stored container according to <14>, the two-dimensional or three-dimensional image forming apparatus according to <15> or <16>, the two-dimensional or three-dimensional image forming method according to <17> or <18>, the cured product according to <19>, and the decorated body according to <20> can solve the various problems in the related art and achieve the object of the present disclosure.

The above-described embodiments are illustrative and do not limit the present invention. Thus, numerous additional modifications and variations are possible in light of the above teachings. For example, elements and/or features of different illustrative embodiments may be combined with each other and/or substituted for each other within the scope of the present invention.

The invention claimed is:

1. A hydrogel, comprising a reaction product of an acrylamide compound (A1) represented by General formula (A1) below with an acrylamide compound (B1) represented by General formula (B1) below or an acrylamide compound (A2) represented by General formula (A2-1) below or General formula (A2-2) below, General formula (A1)

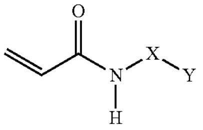

where in the General formula (A1), X represents an alkylene group containing from 1 through 6 carbon atoms, and Y represents a group represented by General formula (A1a) below or General formula (A1b) below, General formula (A1a)

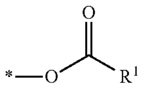

where in the General formula (A1a), $R^1$ represents an alkyl group containing from 1 through 10 carbon atoms, and * represents a bonding site with X, General formula (A1b)

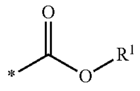

where in the General formula (A1b), $R^1$ represents an alkyl group containing from 1 through 10 carbon atoms, and * represents a bonding site with X, General formula (B1)

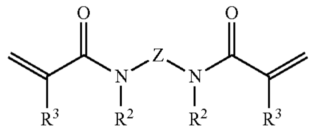

where in the General formula (B1), $R^2$ represents a hydrogen atom or an alkyl group containing from 1 through 4 carbon atoms and may have a branched structure, $R^3$ represents a hydrogen atom or a methyl group, and Z represents an alkylene group containing from 1 through 30 carbon atoms or a group obtained by substituting oxygen, nitrogen, and sulfur atoms for some of the carbon atoms of the alkylene group containing from 1 through 30 carbon atoms and may contain a polar functional group, a (meth)acrylate group, or a (meth)acrylamide group as a substituent, General formula (A2-1)

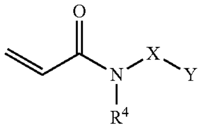

where in the General formula (A2-1), $R^4$ represents an alkyl group containing from 1 through 6 carbon atoms, X represents an alkylene group containing from 1 through 6 carbon atoms, and Y represents a group represented by General formula (A2a-1) below or General formula (A2b-1) below, General formula (A2a-1)

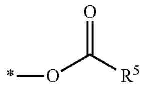

where in the General formula (A2a-1), $R^5$ represents an alkyl group containing form 1 through 10 carbon atoms, and * represents a bonding site with X, General formula (A2b-1)

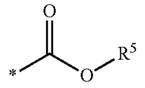

where in the General formula (A2b-1), $R^5$ represents an alkyl group containing from 1 through 10 carbon atoms, and * represents a bonding site with X, General formula (A2-2)

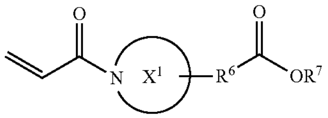

where in the General formula (A2-2), a ring $X^1$ represents a nitrogen atom-containing ring structure containing from 2 through 5 carbon atoms, $R^6$ represents a single bond or an alkylene group containing from 1 through 3 carbon atoms, and $R^7$ represents a straight-chained or branched alkyl group containing from 1 through 10 carbon atoms.

2. The hydrogel according to claim 1, wherein acrylamide compound (B1) is used.

3. The hydrogel according to claim 2, wherein a total amount of the acrylamide compound (A1) and the acrylamide compound (B1) is 30% by mass or greater relative to a total amount of the curable water-based composition.

4. The hydrogel according to claim 1, comprising compound (A2).

5. The hydrogel according to claim 1, formed from a curable water-based composition having a viscosity of 30 mPa·s or lower.

6. The hydrogel according to claim 5, wherein the curable water-based composition comprises a polymerization initiator (C) which is a radical polymerization initiator and is water-soluble.

7. The hydrogel according to claim 5, wherein the curable water-based composition further comprises a hydrogen donor (D).

8. The hydrogel according to claim 1, further comprising a pigment.

9. The hydrogel according to claim 5, wherein an amount of the water is 10% by mass or greater but 50% by mass or less relative to a total amount of the curable water-based composition.

10. The hydrogel according to claim 1, wherein the acrylamide compound (A1) is used, Y is a group represented by the General formula (A1b), and $R^1$ is an alkyl group containing 1 or 2 carbon atoms.

11. A decorated body, comprising:

a base material; and a surface decoration on the base material, the surface decoration being formed of the hydrogel according to claim 1.

12. The hydrogel according to claim 1, comprising (A2-1).

13. The hydrogel according to claim 1, comprising (A2-2).

14. The hydrogel according to claim 1, comprising the reaction product of an acrylamide compound (A1) with the acrylamide compound (B1).

15. The hydrogel according to claim 14, wherein Y represents a group represented by General formula (A1a).

16. The hydrogel according to claim 14, wherein Y represents a group represented by General formula (A1b).

17. The hydrogel according to claim 12, wherein Y represents a group represented by General formula (A2a-1).

18. The hydrogel according to claim 12, wherein Y represents a group represented by General formula (A2b-1).

19. The hydrogel according to claim 14, further comprising (A2).

* * * * *